(12) United States Patent
Shingu et al.

(10) Patent No.: US 7,642,165 B2
(45) Date of Patent: Jan. 5, 2010

(54) SEMICONDUCTOR DEVICE AND FABRICATION METHOD THEREOF

(75) Inventors: Masao Shingu, Kanagawa (JP); Atsuhiro Kinoshita, Kanagawa (JP); Yoshinori Tsuchiya, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 11/892,940

(22) Filed: Aug. 28, 2007

(65) Prior Publication Data

US 2008/0093676 A1    Apr. 24, 2008

(30) Foreign Application Priority Data

Aug. 29, 2006    (JP) .............................. 2006-231532

(51) Int. Cl.
*H01L 21/8234* (2006.01)
(52) U.S. Cl. ............................... 438/275; 257/E21.637
(58) Field of Classification Search ......... 438/275–277, 438/183, 199, 682, 592; 257/407, E21.444, 257/E21.637
See application file for complete search history.

(56) References Cited

U.S. PATENT DOCUMENTS 6,908,801 B2 * 6/2005 Saito .......................... 438/199

(Continued)

FOREIGN PATENT DOCUMENTS

CN    1738060 A    2/2006

(Continued)

OTHER PUBLICATIONS

Kim, S. D. et al., "Advanced Model and Analysis for Series Resistance in Sub-100nm CMOS Including Poly Depletion and Overlap Doping Gradient Effect," Tech. Dig. IEDM 2000, pp. 31.3.1-31.3.4, (2000).

(Continued)

*Primary Examiner*—David Vu
(74) *Attorney, Agent, or Firm*—Finnegan, Henderson, Farabow, Garrett & Dunner, L.L.P.

(57) ABSTRACT

A semiconductor device having a field effect transistor (FET) with enhanced performance by reduction of electrical contact resistance of electrodes and resistance of the electrodes per se is disclosed. The FET includes an n-type FET having a channel region formed in a semiconductor substrate, a gate electrode insulatively overlying the channel region, and a pair of source and drain electrodes which are formed at both ends of the channel region. The source/drain electrodes are made of silicide of a first metal. An interface layer that contains a second metal is formed in the interface between the substrate and the first metal. The second metal is smaller in work function than silicide of the first metal, and the second metal silicide is less in work function than the first metal silicide. A fabrication method of the semiconductor device is also disclosed.

8 Claims, 39 Drawing Sheets

U.S. PATENT DOCUMENTS

| | | |
|---|---|---|
| 7,202,147 B2 | 4/2007 | Okuno et al. |
| 7,495,298 B2 * | 2/2009 | Hayashi et al. ............. 257/412 |
| 2005/0287752 A1 | 12/2005 | Nouri et al. |
| 2006/0038229 A1 | 2/2006 | Tsuchiya et al. |
| 2006/0138562 A1 | 6/2006 | Okuno et al. |
| 2007/0158760 A1 | 7/2007 | Okuno et al. |

FOREIGN PATENT DOCUMENTS

| | | |
|---|---|---|
| JP | 5-315286 | 11/1993 |
| JP | 2004-140262 | 5/2004 |
| JP | 2005-101588 | 4/2005 |
| JP | 2005-123626 | 5/2005 |
| JP | 2006-60045 | 3/2006 |
| JP | 2006-186326 | 7/2006 |

OTHER PUBLICATIONS

Yoshitake, M. et al., "General Rule for Predicting Surface Segregation of Substrate Metal on Film Surface," J. Vac. Sci. Technol., vol. 19, No. 4, pp. 1432-1437, (Jul./Aug. 2001).

Notification of the First Office Action issued by the Chinese Patent Office on Apr. 24, 2009, for Chinese Patent Application No. 200710148535.3, and English-language translation thereof.

Notification of Reason(s) for Refusal issued by the Japanese Patent Office on Oct. 7, 2008, for Japanese Patent Application No. 2006-231532, and English-language translation thereof.

* cited by examiner

SEMICONDUCTOR DEVICE AND FABRICATION METHOD THEREOF

CROSS-REFERENCE TO RELATED APPLICATION

This application is based upon and claims the benefit of priority from Japanese Patent Applications No. 2006-231532, filed on Aug. 29, 2006, the entire contents of which are incorporated herein by reference.

FIELD OF THE INVENTION

The present invention relates generally to semiconductor device technologies and, more particularly, to semiconductor devices including more than one field effect transistor with contact resistance-reduced source/drain electrodes. This invention also relates to methodology of fabricating the devices.

BACKGROUND OF THE INVENTION

To improve performances of ultralarge-scale integrated (ULSI) semiconductor circuits, it is inevitable to enhance the performance of field effect transistors (FETs), which are major constituent elements of ULSI chips. Until today, development of such high-performance FETs has been advanced mainly by miniaturization techniques. However, in recent years, critical limits of the miniaturization are reported. One of the limits is an increase in parasitic resistance of electrodes at source/drain regions, as suggested in S. D. Kim et al., "Advanced model and analysis for series resistance in sub-100 nm CMOS including poly-deposition and overlap doping gradient effect," International Electrical and Devices Meeting (IEDM), Tech. Digest, No. 31.3 (2000).

The parasitic resistance typically includes two major elements: the electrical resistance of an electrode per se, and the contact resistance between the electrode and its underlying semiconductor substrate. Even when the resistance of channel part is reduced by downscaling of FETs, if the electrode's parasitic resistance remains unable to be reduced, device performance enhancement is hardly attainable. In the existing metal oxide semiconductor FETs (MOSFETs), one major approach is to employ nickel silicide (NiSi) as the material for source/drain electrodes. However, to achieve further miniaturization of MOSFETs, a need is felt to reduce the parasitic resistance more strictly than the case of NiSi electrodes.

Recently, in order to further reduce the electrode contact resistance to an extent lower than that of NiSi electrodes, a technique has been proposed for using different kinds of metal silicides for the electrodes between n-type FETs and p-type FETs. This is known as the "dual silicide." With this technique, metal silicide that is large in work function is used for p-type FETs whereas metal silicide less in work function is for n-type FETs.

Using this dual-silicide design makes it possible to lower the level of Schottky barrier against holes and electrons between a metal silicide electrode and a diffusion layer (semiconductor substrate), thereby to reduce the contact resistance. Recent studies reveal that one preferable example of the large work function metal silicide for use in p-type FETs is a silicide of noble metals whereas an example of the low work function metal silicide for use in n-type FETs is a silicide of rare earth metals.

Unfortunately, even when the contact resistance is reduced by the separate use of such different metal silicides between p- and n-type FETs, the resultant device is still faced with the risk of performance degradation occurring due to the fact that the resistance of an electrode per se to be determined by its metallic material can increase to become greater than that of NiSi electrodes. An approach to avoiding this is to employ a technique as disclosed in JP-A-2005-123626(KOKAI), for forming a noncontiguous metal cluster in the interface between a layer of metal silicide that is low in its own resistance and a diffusion layer associated therewith. This technique is the one that utilizes what is called the Kirkendall effect: atoms of respective constituent elements in an alloy behave to diffuse at different speeds. It has been reported that with this technique, the noncontiguous metal cluster of the interface is optimizable in its metal work function, thereby making it possible to attain the conflicting goals—i.e., reducing the contact resistance of an electrode and reducing the resistance of such electrode per se.

Nevertheless, in the technique as taught by JP-A-2005-123626(KOKAI), it is a must to design a device structure with mixed presence of a metal cluster and a metal silicide of electrode at the interface. This is inevitable to perform the Kirkendall effect-used fabrication process successfully. Also inevitably, metallic material used for the metal cluster is restricted to a specific kind of metal that is hardly silicidable. Due to the presence of these penalties, the advantages of the prior known approaches do not come without accompanying a problem which follows: it is difficult to sufficiently lower the Schottky barrier, which leads to unavoidable difficulty in sufficient reduction of the electrode contact resistance.

SUMMARY OF THE INVENTION

The present invention has been made in view of the technical background above, and its object is to provide a semiconductor device including a field effect transistor with its performance enhanced by reduction of electrical contact resistance of electrodes and also the resistance of the electrodes per se and also provide a fabrication method of the device.

A semiconductor device in accordance with first preferred form of this invention includes an n-type field effect transistor (FET), which has a channel region of the n-type field effect transistor formed in a semiconductive substrate, a gate electrode formed above a surface of the channel region with a gate insulator film being laid therebetween, and a pair of source and drain electrodes formed on both sides of the channel region. The source and drain electrodes are made of silicide of a first metal. A first interface layer which contains a second metal is formed at an interface between the substrate and the first metal silicide. The second metal is smaller in work function than the first metal silicide and, simultaneously, second metal silicide is smaller in work function than the first metal silicide.

A semiconductor device in accordance with second form of the invention includes a p-type FET, which has a channel region of the p-type field effect transistor formed in a semiconductive substrate, a gate electrode formed above a surface of the channel region with a gate insulator film being laid therebetween, and a pair of source and drain electrodes formed on both sides of the channel region. The source and drain electrodes are made of silicide of a first metal. A first interface layer which contains a second metal is formed at an interface between the substrate and the first metal silicide. The second metal is larger in work function than the first metal silicide and, simultaneously, second metal silicide is larger in work function than the first metal silicide.

A semiconductor device in accordance with third form of the invention includes a p-type FET, which has a channel region of the p-type field effect transistor formed in a semiconductor substrate, a gate electrode formed above a surface of the channel region with a gate insulator film being laid therebetween, and a pair of source and drain electrodes formed on both sides of the channel region. The source and drain electrodes are made of either germano-silicide or germanide of a first metal. A first interface layer containing a second metal is formed at an interface between the substrate and either one of the germano-silicide and the germanide of the first metal. The second metal is larger in work function than the germano-silicide or the germanide of the first metal; simultaneously, germano-silicide or germanide of the second metal is larger in work function than either one of the germano-silicide and the germanide of the first metal.

A semiconductor device in accordance with fourth form of the invention includes an n-type FET which has a first channel region formed in a semiconductor substrate, a first gate electrode formed over a surface of the first channel region with a gate insulator film being laid therebetween, and a first pair of source and drain electrodes formed at both sides of the first channel region. The device also includes a p-type FET having a second channel region formed in the substrate, a second gate electrode formed over a surface of the second channel region with a gate insulator film being laid therebetween, and a second pair of source and drain electrodes formed at both sides of the second channel region. The first source/drain electrodes are formed of first silicide of a first metal with a first interface layer containing therein a second metal being formed at an interface between the substrate and the first silicide. The second source/drain electrodes are formed of second silicide of the first metal with a second interface layer containing therein a third metal being formed at an interface between the substrate and the second silicide. The second metal is smaller in work function than the first silicide and, simultaneously, second metal silicide is smaller in work function than the first silicide. The third metal is larger in work function than the second silicide, and silicide of the third metal is larger in work function than the second silicide.

A method for fabricating the semiconductor device of the first form of this invention is a process of fabricating a semiconductor device including an n-type FET. The method includes the steps of forming a gate electrode above a semiconductor substrate with a gate insulator film being laid therebetween, depositing a first metal, performing first thermal processing to silicidize the first metal to thereby form silicide of the first metal for use as a pair of source and drain electrodes, depositing a second metal on a surface of the first metal silicide, and performing second thermal processing to segregate the second metal at an interface of the substrate and the first metal silicide to thereby form an interface layer which contains therein the second metal. The second metal is smaller in work function than the first metal silicide; silicide of the second metal is smaller in work function than the first metal silicide.

A method for making the semiconductor device of the second form of the invention is a process of fabricating a semiconductor device including a p-type FET. This method includes the steps of forming a gate electrode above a semiconductor substrate with a gate insulator film being laid therebetween, depositing a first metal, performing first thermal processing to silicidize the first metal to thereby form silicide of the first metal for use as a pair of source and drain electrodes, depositing a second metal on a surface of the first metal silicide, and performing second thermal processing to segregate the second metal at an interface between the substrate and the first metal silicide to thereby form an interface layer which contains therein the second metal. The second metal is larger in work function than the first metal silicide and, simultaneously, silicide of the second metal is larger in work function than the first metal silicide.

A method for making the semiconductor device of the third form of this invention is a process of fabricating a semiconductor device having on a semiconductor substrate an n-type FET and a p-type FET. The method includes the steps of forming a gate electrode above the substrate with a gate insulator film being laid therebetween, depositing a first metal, performing first thermal processing to silicidize the first metal to thereby form first silicide for use as source and drain electrodes of the n-type FET and second silicide for use as source and drain electrodes of the p-type FET, depositing a second metal on a surface of the first silicide, performing second thermal processing to segregate the second metal at an interface between the substrate and the first silicide to thereby form a first interface layer which contains therein the second metal, depositing a third metal on a surface of the second silicide, and performing third thermal processing to segregate the third metal at an interface between the substrate and the second silicide to thereby form a second interface layer that contains the third metal. The second metal is smaller in work function than the first silicide, silicide of the second metal is smaller in work function than the first silicide. The third metal is larger in work function than the second silicide; silicide of the third metal is larger in work function than the second silicide.

According to the invention, it becomes possible to provide the intended semiconductor device including more than one FET with its performance enhanced by reduction of both the contact resistance of electrodes and their own resistance and also to provide a fabrication method of the device.

DETAILED DESCRIPTION OF THE EMBODIMENTS

Several embodiments of the invention will be described with reference to the accompanying drawings below.

Embodiment 1

Figure 1A:
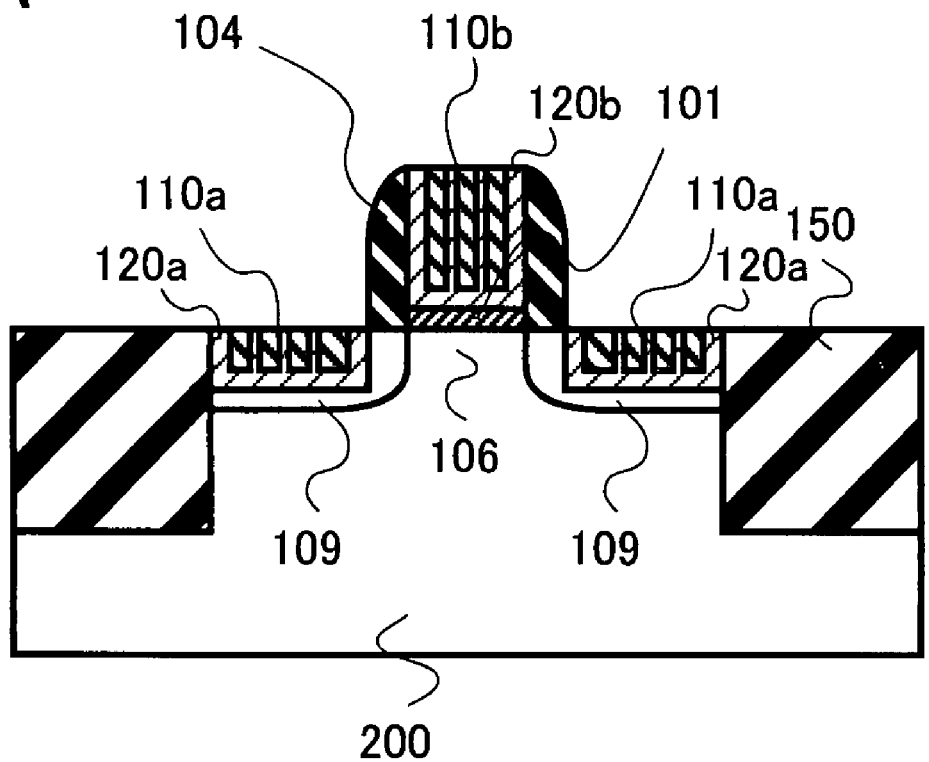
FIGS. 1A and 1B depict cross-sectional views of a semiconductor device having an n-type field effect transistor (FET) in accordance with first embodiment of this invention.
Figure 1B:
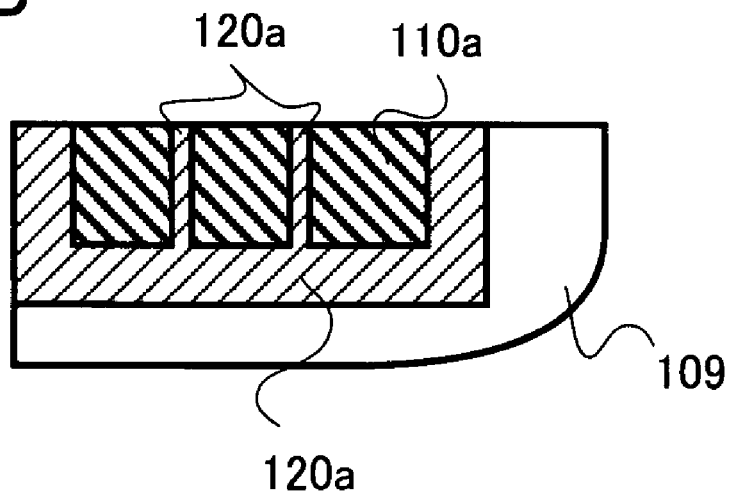

A semiconductor device which includes an n-type metal insulator semiconductor field effect transistor (nMISFET) embodying the invention is shown in FIGS. 1A and 1B, wherein FIG. 1A is a sectional view of an entire FET structure of the embodiment device whereas FIG. 1B is an enlarged sectional view of one of source/drain (S/D) regions of the nMISFET.

The semiconductor device shown herein has an interface layer in the interface between a semiconductor substrate and silicide of a metal of S/D electrodes. The interface layer contains a metal different from the metal composing the metal silicide of S/D electrodes. The nMISFET of the device is arranged so that this metal forming the interface layer is also present within the silicide of S/D electrodes—that is, at grain boundaries of the silicide S/D electrodes. Very importantly, the interface layer-forming metal is specifically designed so that both the metal and the silicide of this metal are less in work function than the S/D electrode silicide.

It should be noted that in the description below, the term "work function" refers to an energy which is needed to move or migrate an electron from the Fermi level to a vacuum in a given material.

More specifically, as shown in FIGS. 1A-1B, the semiconductor device has a p-type silicon (Si) substrate 200 having its top surface in which a channel region 106 is defined. A gate electrode is formed above the channel region, with a gate insulator film 101 being sandwiched therebetween. This gate electrode, for example, has the so-called "fully silicided (FUSI)" structure, which is formed of nickel silicide (NiSi) 110b that is the silicide of a first metal—here, nickel (Ni).

The gate electrode has opposite side walls, on each of which is formed a gate sidewall dielectric film 104 that is made for example of silicon nitride (SiN). A pair of laterally spaced-apart diffusion layers 109 are formed in the surface of Si substrate 200 in such a manner that the channel region 106 underlying the gate electrode resides between these diffusions 109, which are doped with a chosen n-type impurity, e.g., arsenic (As). At both ends of channel region 106, source and drain electrodes 110a are provided, which are made of NiSi that is the silicide of the first metal, e.g., Ni.

The device further has an interface layer 120a made of a second metal, e.g., erbium (Er), in the interface between each diffusion layer 109 and its associated source/drain (S/D) electrode 110a made of NiSi in Si substrate 200. Note here that the second metal Er exists in NiSi S/D electrode 110a as better shown in FIG. 1B. More precisely, the second metal Er existing in S/D electrode 110a is at grain boundaries of the NiSi material forming this S/D electrode.

Note here that the second metal, Er, is less in work function than the NiSi of S/D electrodes 110a and, at the same time, $ErSi_{1.7}$ that is the silicide of Er is also less in work function than NiSi S/D electrodes 110a. The semiconductor device of this embodiment also has an Er-made interface layer 120b that is formed at an interface between the gate insulator film 101 and the NiSi gate electrode 110b as shown in FIG. 1A.

As the semiconductor device including the nMISFET is arranged to have the Er interface layer 120a that is less in work function than the NiSi S/D electrodes 110a in the way stated above, it becomes possible to lower Schottky barrier against electrons between the individual NiSi S/D electrode 110a and its associated S/D diffusion 109 (Si substrate) to thereby reduce the electrode contact resistance. In the prior art, it has been studied that certain metal silicide, $ErSi_{1.7}$, is used for S/D electrodes to thereby reduce the contact resistance thereof. On the contrary, the embodiment device is specifically arranged to form the interface layer made of the metal Er that is less in work function than $ErSi_{1.7}$. Thus it is possible to further reduce the electrode contact resistance.

Generally, silicidizing a metal results in the work function coming closer to mid gap side. Therefore, even a metal of small work function, such as Er, exhibits an increase in work function by silicidation thereof. In this embodiment, using the metal for the interface layer in the form of a single elemental substance permits effective use of the small work function of such metal per se, causing Schottky barrier to decrease sufficiently to thereby lower the contact resistance.

Another feature of the embodiment device structure is that unlike the technique as disclosed in JP-A-2005-123626, the interface layer metal Er is uniformly formed in the interface, rather than in a mixed or blended state with the NiSi material of S/D electrode 110a. This makes it possible to sufficiently provide the effective area of the interface with Schottky barrier reduced. In view of this advantage also, significant contact resistance reducibility is obtainable.

Another feature unique to the embodiment is that NiSi of less resistivity is used for the S/D electrodes, thereby making it possible to lower, with increased controllability, the electrical resistance of the individual electrode per se. Furthermore, in this embodiment, Er which is less in work function than NiSi exists also at the grain boundaries of the NiSi material forming the S/D electrode. Thus, the interface resistance at such grain boundaries is lowered, forcing the S/D electrode per se to further decrease in resistance. This in turn makes it possible to further reduce the parasitic resistance of nMISFET. In addition, the presence of Er at the NiSi grain boundaries enables suppression of unwanted agglomeration of NiSi in relation to an interface (surface) energy. Accordingly, it is also expectable to curtail increase in junction leakage otherwise occurring due to disconnection in silicide by thermal stress to and/or occurrence of irregularity or serpentine deformation of the interface with Si substrate. This leads to an increase in reliability of the semiconductor device.

By designing the device so that the small work function Er interface layer 120b exists in the interface between the gate insulator film and the gate electrode silicide, it becomes possible to reduce the threshold voltage of the nMISFET, which in turn makes it possible to achieve enhanced transistor drivability. Additionally, with use of the FUSI structure also, it is possible to suppress depletion on the gate electrode side during transistor driving within an extended range up to high gate voltages. This is also devoted to enhancement of the transistor drivability.

It has been stated that with this embodiment, it becomes possible to provide the intended semiconductor device including nMISFET which offers high performance and improved reliability owing to the threshold voltage reduction and gate depletion suppression in addition to the reduction of parasitic resistances, i.e., the S/D electrode contact resistance and the resistance of each S/D electrode per se.

The silicide material of the S/D electrodes 110a and gate electrode 110b is not exclusively limited to NiSi used in this embodiment. In the viewpoint of reduction of the resistance of S/D electrode per se, it is also preferable to use other similar suitable silicides of relatively low resistivity, such as NiSi with its resistivity of about 15 μΩcm. Examples of such silicides are cobalt silicide ($CoSi_2$) with its resistivity of about 20 μΩcm, titanium silicide ($TiSi_2$) of resistivity of about 15 μΩcm, erbium silicide ($ErSi_{1.7}$) of about 3 μΩcm resistivity, platinum silicide (PtSi) of about 30 μΩcm resistivity, yttrium silicide (YSi) of about 30 μΩcm resistivity, and ytterbium silicide (YbSi) of about 30 μΩcm resistivity.

The metal used to form the interface layer is not limited to Er as in the above-noted embodiment, and is replaceable by a metal having its work function that is less than the mid gap of Si, such as Er with the work function of about 3.5 eV. Examples of it are yttrium (Y) having its work function of about 3.1 eV, strontium (Sr) of about 2.59 eV, lanthanum (La) of about 3.5 eV, hafnium (Hf) of about 3.9 eV, ytterbium (Yb) of about 2.9 eV, aluminum (Al) of about 4.28 eV, and indium (In) of about 4.12 eV. Using any one of these metals is desirable to lower Schottky barrier against electrons and to reduce the contact resistance.

The gate insulator film 101 is not exclusively limited to the silicon oxide film and may alternatively be made of other dielectric materials higher in dielectric constant than silicon oxides. Examples of such high-dielectric-constant dielectric materials are $La_2O_5$, $La_2O_3$, $CeO_2$, $ZrO_2$, $HfO_2$, $SrTiO_3$, $PrO_3$, $LaAlO_3$, $Si_3N_4$, $Al_2O_3$, $Ta_2O_5$ and $TiO_2$. Alternatively, it is also possible to use a dielectric film made of either silicon oxides or high-dielectric-constant dielectrics with nitrogen (N) or fluorine (F) added thereto. Other employable examples include a dielectric film with the composition ratio of these chemical compounds being changed, a combined or "hybrid" film with a mixture of two or more dielectric materials, and a dielectric film made of metal ion-added silicon oxide, such as zirconium (Zr) silicate, hafnium (Hf) silicate or else.

A method for fabricating the semiconductor device shown in FIGS. 1A-1B will next be described with reference to FIGS. 2 through 10, which illustrate in cross-section some major process steps in the manufacture of the device.

The semiconductor device fabrication method also embodying the invention utilizes a phenomenon occurring between two different kinds of metals for causing by application of thermal processing a one metal to diffuse in grain boundary of the other metal and then segregate on a surface of this metal and applies this phenomenon to the case where one of these metals is replaced by a silicide material. Teachings as to the segregation phenomenon are found, for example, in M. Yoshitake et al., "General rule for predicting surface segregation of substrate metal on film surface," Journal of Vacuum Science and Technology (JVST) A, Vol. 19, No. 4, pp. 1432-1437 (July/August 2001).

Figure 2:
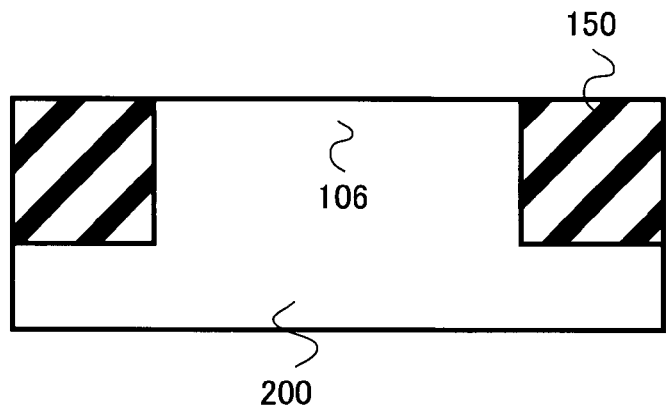
FIGS. 2 through 10 illustrate, in cross-section, some of major steps in the manufacture of the semiconductor device shown in FIGS. 1A-1B.

First, as shown in FIG. 2, a p-type silicon (Si) substrate 200 is prepared. This substrate has a top surface of a (100) plane with a chosen impurity, e.g., boron (B), being doped to a predetermined concentration of about $10^{15}$ atoms per cubic centimeter ($cm^{-3}$). In the surface of p-type Si substrate 200, form a shallow trench isolation (STI) region 150 comprised of a silicon oxide film, which is patterned for electrical separation between neighboring circuit elements to be later formed on substrate 200.

Figure 3:
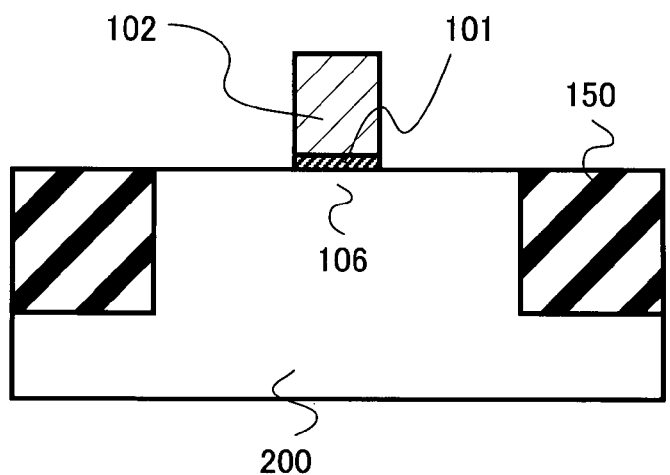

Then, as shown in FIG. 3, a gate insulating film 101 is formed to an equivalent oxide thickness (EOT) of about 1 to 2 nanometers (nm). Next, a polysilicon film for later use as the gate electrode is deposited by low-pressure chemical vapor deposition (LPCVD) techniques to a thickness of about 100 to 150 nm. Then, perform lithography and reactive ion etch (RIE) processes to selectively etch, for patterning, the gate insulator film 101 and gate electrode 102 so that the resulting gate length is 30 nm, or more or less. Post-oxidation of 1 to 2 nm may be performed when the need arises.

Figure 4:
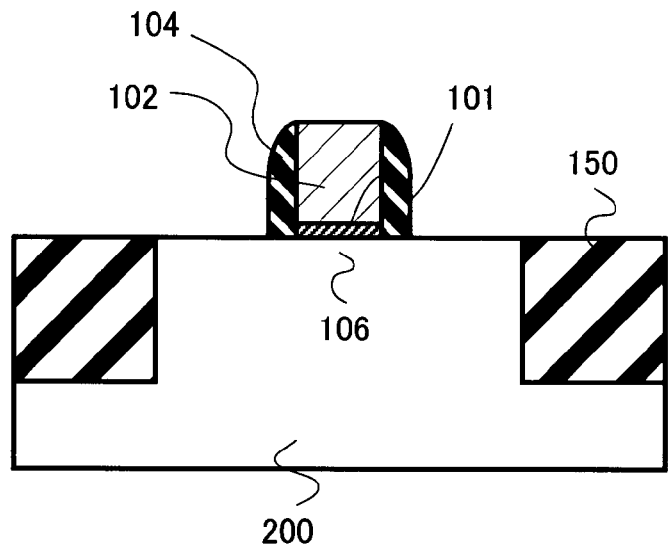

Next, as shown in FIG. 4, a film of silicon nitride (SiN) is deposited by LPCVD to a thickness of about 8 nm, which is then subjected to etch-back by RIE techniques. With this RIE etchback, the SiN film is selectively removed away so that it resides only at sidewall portions of the gate electrode 102, thereby to form a gate sidewall dielectric film 104.

Figure 5:
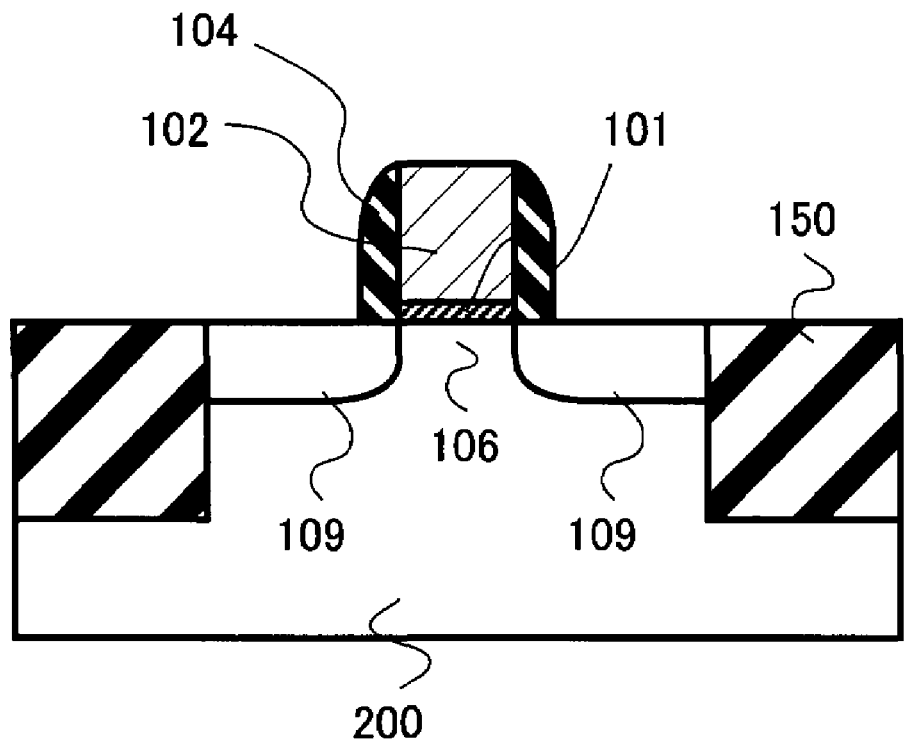

Next as shown in FIG. 5, with the gate electrode 102 and sidewall dielectrics 104 as a mask, an n-type impurity, e.g., arsenic (As), is doped into Si substrate 200 through ion implantation, thereby forming spaced-apart n-type diffusion layers 109 with a concentration of about $1 \times 10^{20}$ atoms/$cm^3$. The resultant device structure is then applied impurity activation annealing, e.g., spike anneal, at a temperature of about 1050° C.

Figure 6:
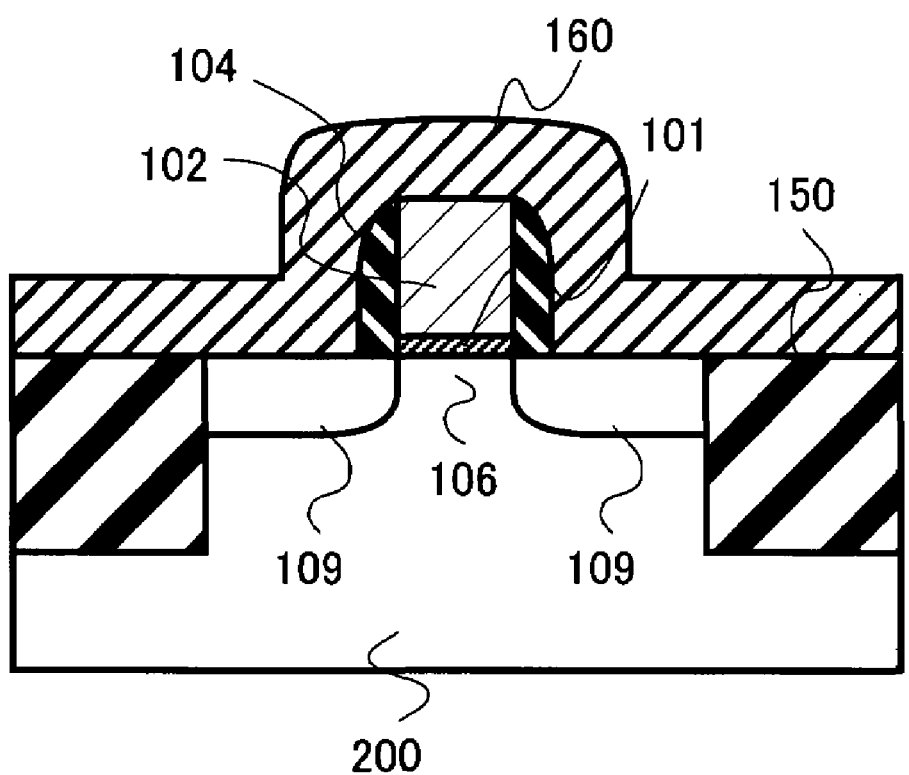

Next as shown in FIG. 6, a nickel (Ni) film 160 is deposited by sputtering to a thickness of about 10 nm.

Figure 7:
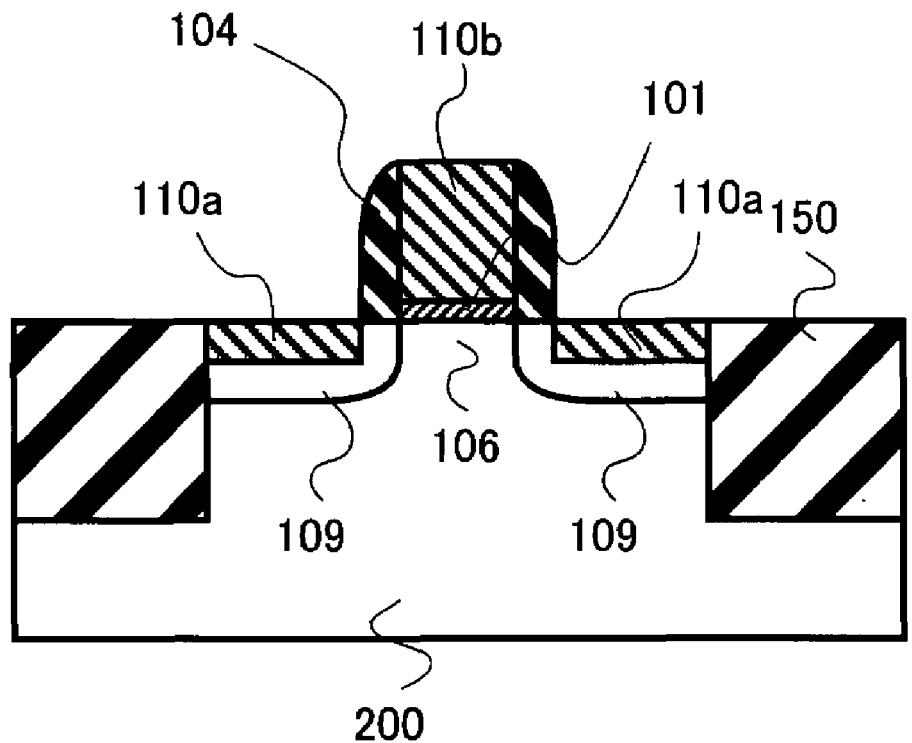

Next as shown in FIG. 7, annealing at about 500° C. (first thermal processing) is performed to cause the Ni film 160 and Si substrate 200 to chemically react together for silicidation, thereby to form a pair of NiSi electrodes 110a for later use as source/drain (S/D) electrodes. Simultaneously, let the poly-Si gate electrode 102 fully react up to an interface of the gate insulator film 101, thereby forming a NiSi gate electrode 110b. Thereafter, remove non-reacted Ni residing at the surface by selective etching techniques using a chosen chemical solution.

Figure 8:
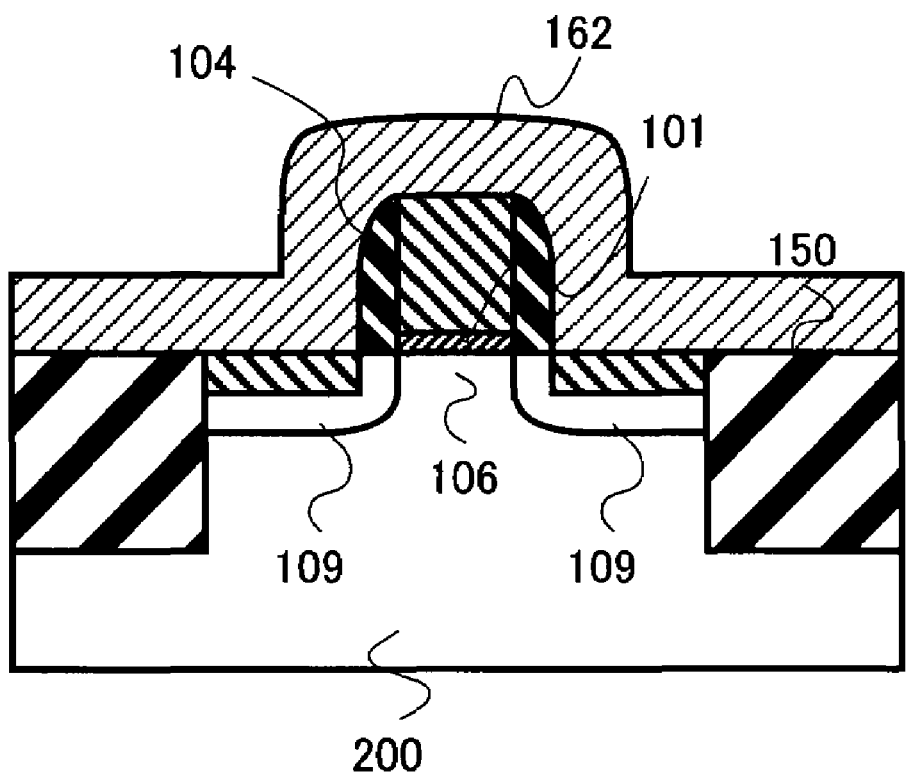

Next as shown in FIG. 8, sputtering is done to form an Er film 162 of about 10 nm thick, which is less in work function than the NiSi S/D electrodes 110a and NiSi gate electrode 110b. Note here that the work function of $ErSi_{1.7}$ which is the silicide of Er also is less than that of NiSi electrodes 110a.

Figure 9:
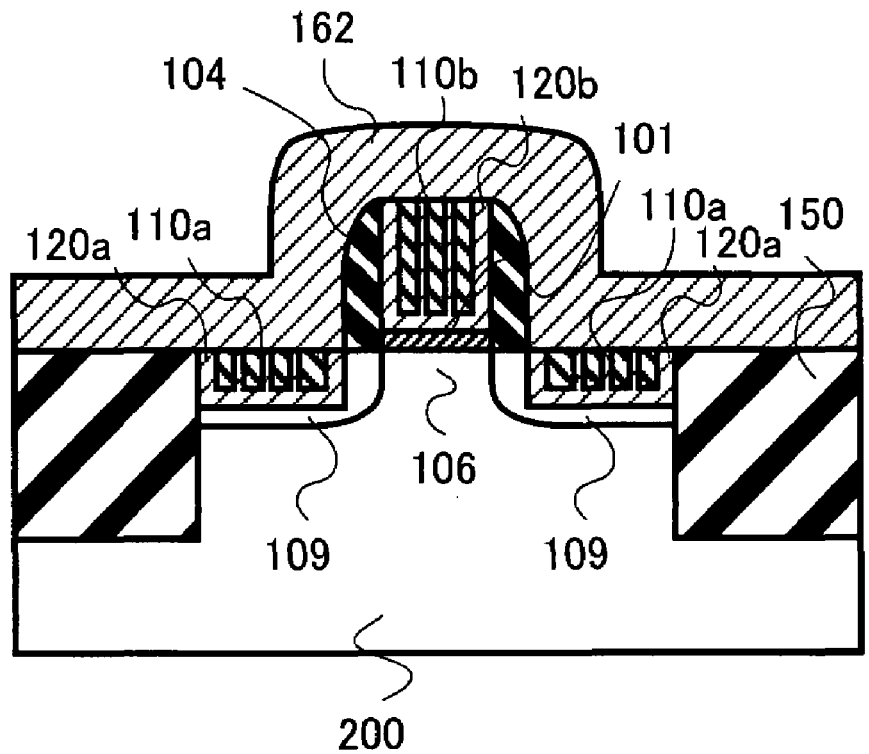

Next as shown in FIG. 9, annealing at a temperature of about 300 to 400° C. (second thermal processing) is done to cause Er to diffuse out of the Er film 162 through grain boundaries of NiSi S/D electrodes 110a. Then, an interface layer 120a made of Er is formed in an interface between Si substrate 200 and each NiSi S/D electrode 110a while allowing Er to reside in the grain boundaries of NiSi electrodes 110a. Simultaneously, Er is forced to outdiffuse through the grain boundary of NiSi gate electrode 110b to thereby form an Er interface layer 120b in an interface between the gate insulator film 101 and NiSi gate electrode 110b. This thermal processing may typically be performed in an atmosphere of inactive or inert gases, such as nitrogen or argon, or alternatively in a vacuum.

Preferably the temperature of the second thermal processing is set lower than that of the first thermal processing. This is in order to suppress Ni diffusion from NiSi layer formed by first thermal processing while at the same time restraining unwanted increase in junction leakage. The low temperature setting is also to lessen or prevent the electrode's own resistance increase otherwise occurrable due to composition change of NiSi. The temperature setup is desirable from a view point of suppressing extension of diffusion layers 109 in the channel direction and repression of possible degradation of transistor characteristics. In addition, the temperature setup is desirable also in a viewpoint of suppression of increase in work function of the interface layer occurring due to the silicidation of Er interface layer and a viewpoint of suppression of chemical reaction between NiSi and Er.

Figure 10:
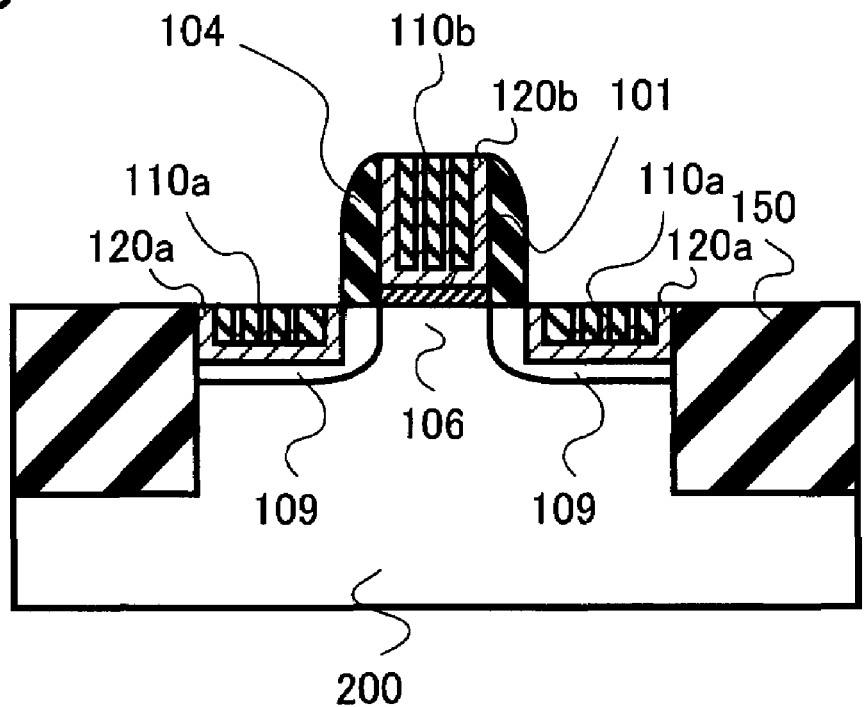

Next as shown in FIG. 10, remove residual Er in the surface by selective etching using a chosen chemical. At this time, unintentional removal of the Er interface layers 120a-120b residing at the grain boundaries of NiSi electrodes 110a-110b hardly takes place. This can be said because the NiSi layers 110a-110b serve as a mask against the etching.

The fabrication method of this embodiment utilizes the phenomenon that the NiSi surface-deposited Er moves by thermal processing from the NiSi grain boundary and segregates at the Si substrate or the interface between gate insulator film and NiSi as stated previously. Thus, it becomes possible to form the interface layer made of the Er metal less in work function and to form the semiconductor device structure shown in FIGS. 1A-1B capable of sufficiently lowering the Schottky barrier between the S/D electrodes and Si substrate.

Another advantage of this method lies in its ability to form the small work function metal interface layer at a temperature lower than the metal silicidation temperature. Accordingly, the metal material used for the interface layer is not exclusively limited to non-silicided metals as in the fabrication method using Kirkendall effect, which is disclosed in JP-A-2005-123626.

Modified Example 1 of Embodiment 1

Figure 11A:
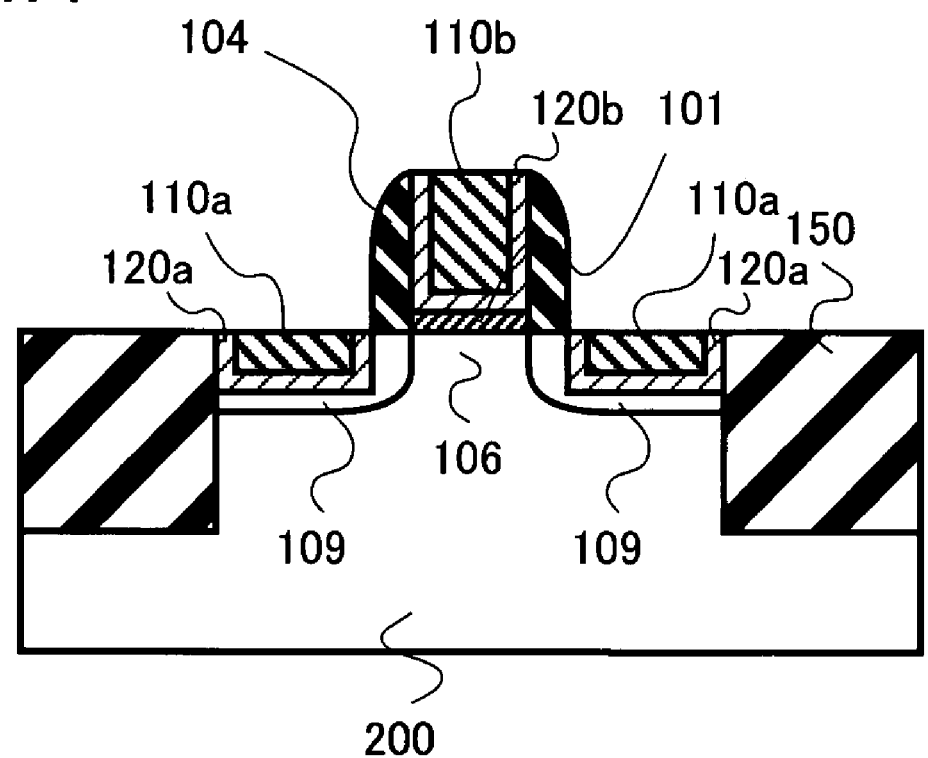
FIGS. 11A and 11B show sectional views of a semiconductor device having an n-type FET in accordance with a modified example of the first embodiment.
Figure 11B:
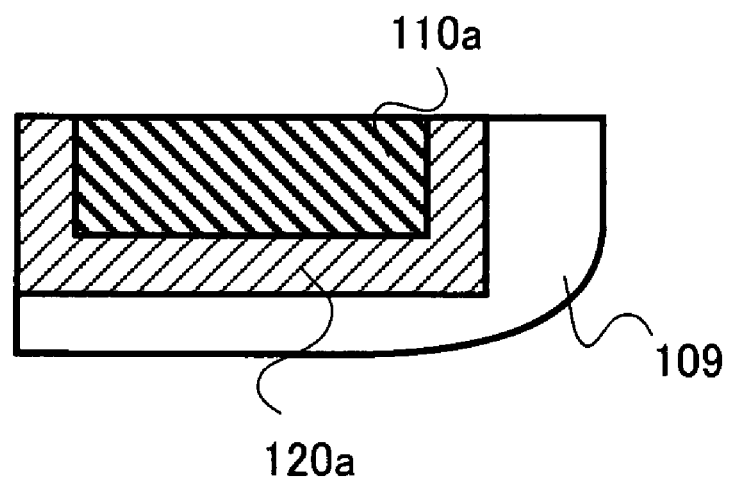

A semiconductor device which includes an nMISFET in accordance with a modification of the embodiment device of FIGS. 1A-1B is illustrated in FIGS. 11A-11B. FIG. 11A is a sectional view of its entire transistor structure whereas FIG. 11B is an enlarged sectional view of a source/drain (S/D) region thereof.

The device of FIGS. 11A-11B is similar in structure to that shown in FIGS. 1A-1B with the small work function metal (Er) interface layer 120a being absent at the grain boundaries of NiSi S/D electrodes 110a.

Even in the absence of the small work function metal, Er, in the S/D electrode grain boundaries, it is still possible for the device of FIGS. 11A-11B to reduce the electrode contact resistance owing to the presence of Er in the interface layer 120a. Additionally, the presence or absence of the small work function metal, such as Er, at the grain boundary is controllable by material selection and by appropriate setting and adjustment of process parameters, such as temperatures, thermal processing conditions and gaseous atmospheres, in the second thermal processing for segregation of the interface layer metal during fabrication of the device shown in FIGS. 1A-1B.

Modification 2 of Embodiment 1

Figure 12A:
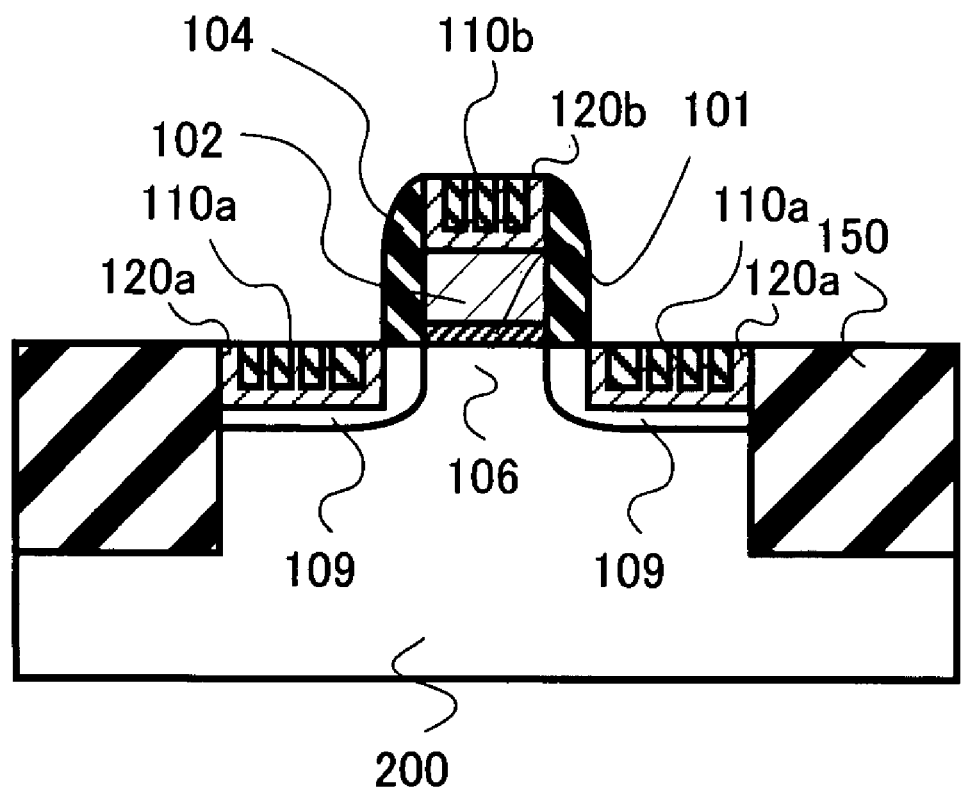
FIGS. 12A-12B are sectional views of a semiconductor device having an n-type FET in accordance with another modification of the first embodiment.
Figure 12B:
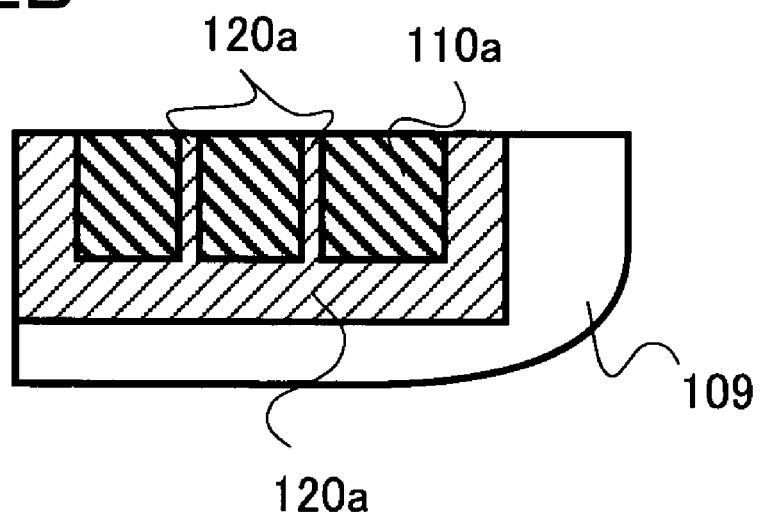

A semiconductor device including an nMISFET in accordance with another modified example of the device shown in FIGS. 1A-1B is shown in FIGS. 12A and 12B. FIG. 12A is a sectional view of its entire FET structure, and FIG. 12B is an enlarged sectional view of a S/D region thereof.

The device structure of FIGS. 12A-12B is similar to that shown in FIGS. 1A-1B with its gate electrode being modified to have a multilayer structure of a polysilicon film 102 and NiSi layer 110b in place of the FUSI structure stated above. This device example offers similar effects and advantages to those of the device of FIGS. 1A-1B, while accompanying a penalty as to a decrease in reducibility of depletion on the gate electrode side.

An advantage unique to the device example of FIGS. 12A-12B is that its fabrication process avoids the need for fully siliciding the gate electrode polysilicon film. This makes it possible to optimize the silicidation processing for the silicidation of S/D electrodes. Thus it is expectable to increase process margins for making of shallow S/D electrode and for preventing diffusion layer penetration.

Additionally, in order to maximally suppress the gate electrode depletion, it is desirable to heavily dope an impurity, such as As or else, into the polysilicon film 102 of FIGS. 12A-12B.

Modification 3 of Embodiment 1

Figure 13A:
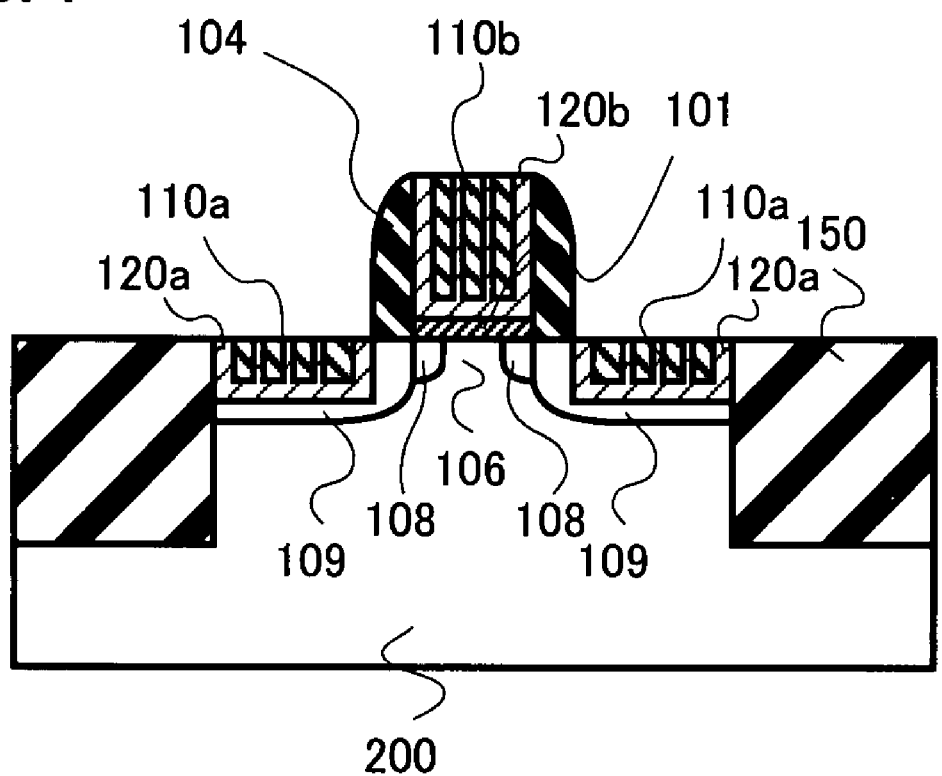
FIGS. 13A-13B are sectional views of a semiconductor device having an n-type FET in accordance with a further modification of the first embodiment.
Figure 13B:
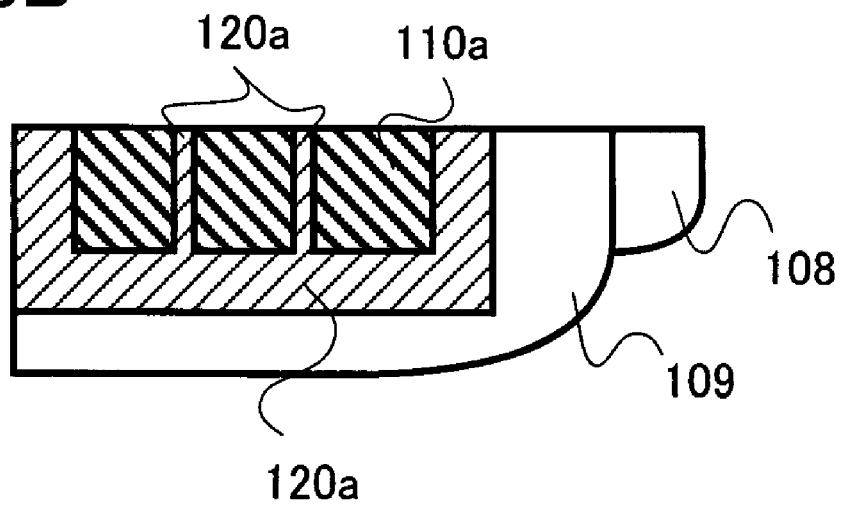

A semiconductor device including nMISFET in accordance with a further modified example of the first embodiment is shown in FIGS. 13A-13B. FIG. 13A is a sectional view of its entire FET structure, and FIG. 13B is an enlarged sectional view of its S/D region.

The device structure of FIGS. 13A-13B is similar to that shown in FIGS. 1A-1B with a pair of spaced-apart extension diffusion layers 108 being additionally formed at inner walls of S/D diffusion layers 109. These extension diffusions 108 are doped with an impurity to a concentration of $1 \times 10^{19}$ atoms/cm$^3$.

The third modified device structure of FIGS. 13A-13B offers, in addition to the advantages of the embodiment device of FIGS. 1A-1B, an ability to realize a high-performance FET with enhanced short-channel effect immunity owing to optimization of profiles of the lightly-doped extension diffusions 108 and the heavily-doped S/D diffusions 109.

Embodiment 2

Figure 14A:
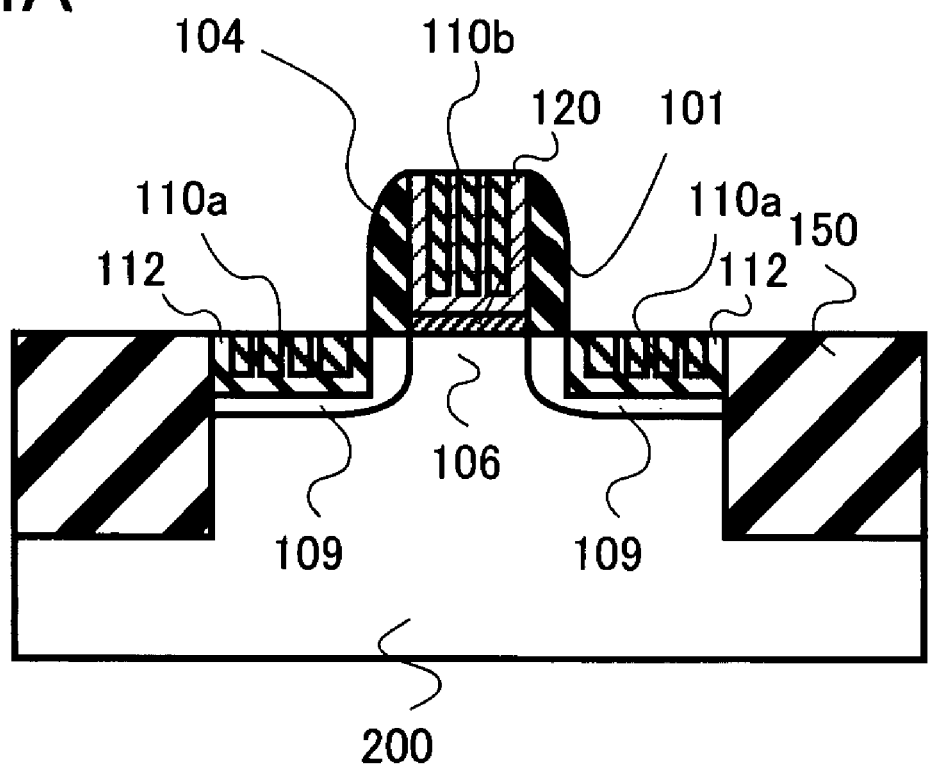
FIGS. 14A-14B are sectional views of a semiconductor device having an n-type FET in accordance with second embodiment of the invention.
Figure 14B:
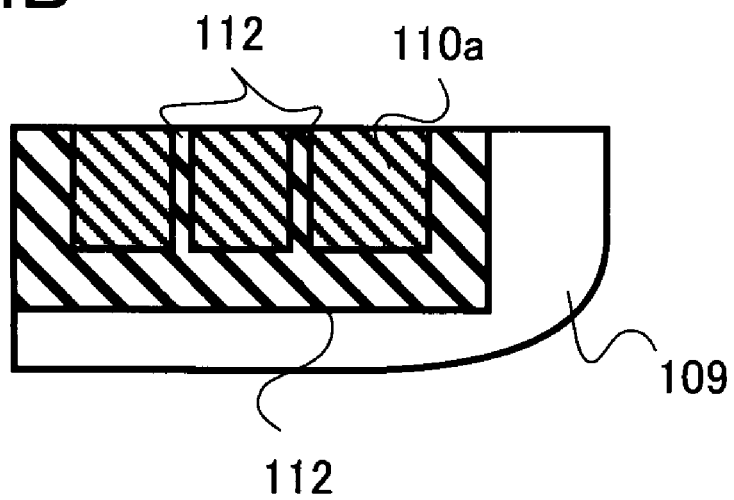

A semiconductor device including an nMISFET in accordance with another embodiment of this invention is shown in FIGS. 14A and 14B. FIG. 14A is a sectional view of its entire FET structure whereas FIG. 14B is an enlarged sectional view of one of its S/D regions.

The embodiment device of FIGS. 14A-14B is similar to that shown in FIGS. 1A-1B with the interface layer between NiSi S/D electrode 110a and Si substrate 200 being replaced by a layer 112 of erbium silicide ErSi$_{1.7}$ and also with the grain boundaries of S/D electrodes being made of ErSi$_{1.7}$, rather than Er.

As this embodiment device uses ErSi$_{1.7}$ that is larger in work function than Er, the Schottky barrier reducibility is less than that of the first embodiment. Thus the former device is less than the latter in reducibility of electrode contact resistance and S/D electrode's own resistance. An advantage unique to this embodiment lies in its ability to improve the thermal endurance of semiconductor device while offering increased thermal stability. This can be said because its interface layers and grain boundaries are made of ErSi$_{1.7}$, which is more stable in generation energy than the metal Er.

A fabrication method of the embodiment device shown in FIGS. 14A-14B is similar to that shown in FIGS. 2-10 except that after having formed the interface layer 120a made of Er in FIG. 9, thermal processing is additionally performed for causing this Er layer 120a to react with Si substrate 200 for silicidation to thereby form the ErSi$_{1.7}$ layer 112 shown in FIG. 14A or 14B. Note here that this thermal processing for silicidation is not necessarily performed independently of the second thermal processing for Er segregation: the both processes may be done at a time when the need arises.

Modification 1 of Embodiment 2

Figure 15A:
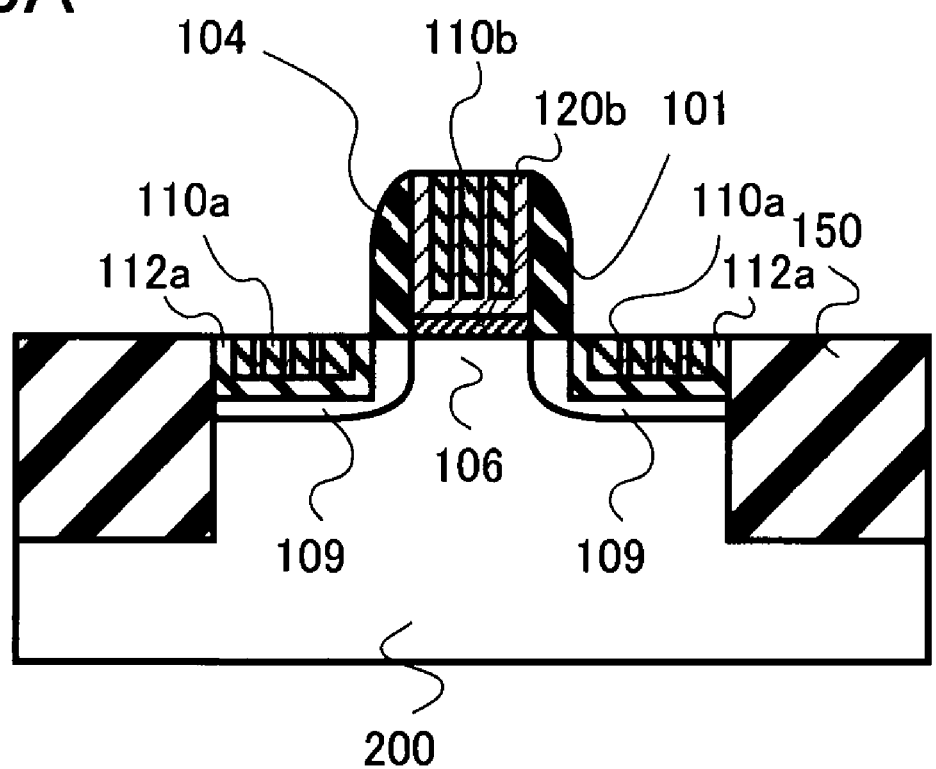
FIGS. 15A-15B and 16A-16B are sectional views of a semiconductor device having an n-type FET in accordance with modifications of the second embodiment, respectively.
Figure 15B:
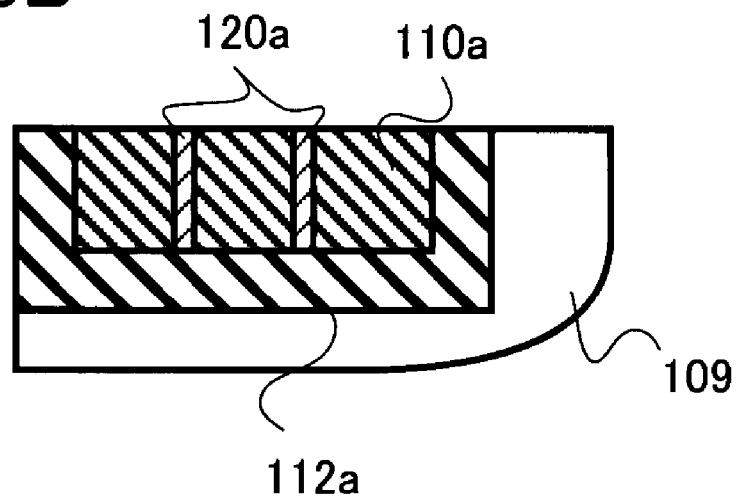

A semiconductor device including nMISFET in accordance with one modified example of the second embodiment is shown in FIGS. 15A-15B. FIG. 15A is a sectional view of its entire FET structure, and FIG. 15B is an enlarged sectional view of a S/D region thereof.

The device structure of FIGS. 15A-15B is similar to that shown in FIGS. 14A-B with the ErSi$_{1.7}$ layer at grain boundary of NiSi S/D electrode 110a being replaced by a metal layer 120a made of Er. By forming the grain-boundary layer 120a made of Er less in work function than ErSi$_{1.7}$, it is possible for the modification to offer its ability to further reduce the electrical resistance of NiSi S/D electrode per se, in addition to the effects and advantage of the second embodiment. Regarding whether the grain boundary becomes ErSi$_{1.7}$ or Er, it is well controllable by appropriate selection of process parameters, such as temperatures, thermal processing conditions and gaseous atmospheres during thermal processing for silicidation in the manufacture of the second embodiment device.

Modification 2 of Embodiment 2

Figure 16A:
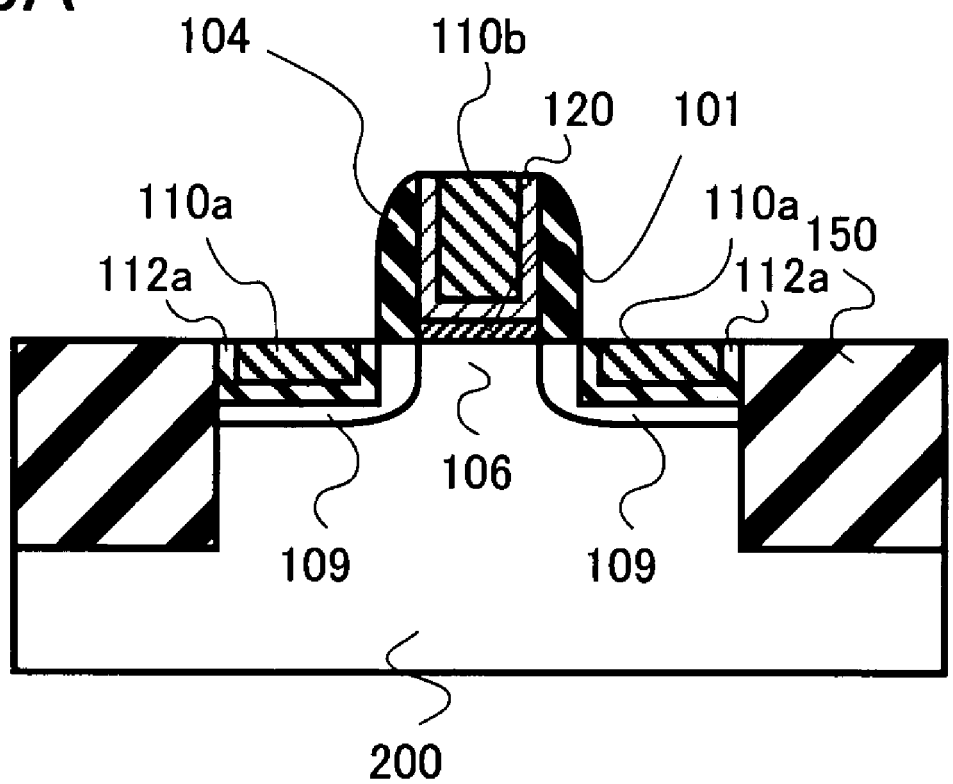
Figure 16B:
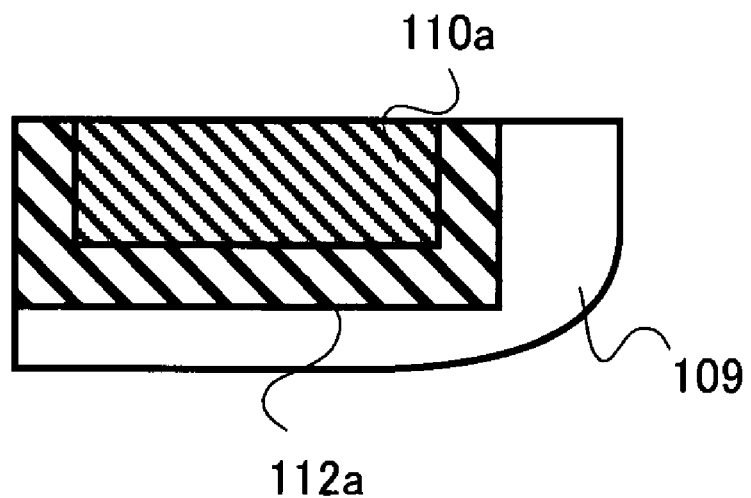

A semiconductor device including nMISFET in accordance with another modified example of the second embodiment is shown in FIGS. 16A-16B. FIG. 16A is a sectional view of its entire transistor structure, and FIG. 16B is an enlarged sectional view of its S/D region.

The device structure of FIGS. 16A-16B is similar to that shown in FIGS. 14A-B with the ErSi$_{1.7}$ layer 112 at the boundary of NiSi S/D electrode 110a being eliminated. Even without the ErSi$_{1.7}$ layer 112, it is still possible to reduce the contact resistance owing to the presence of small work function silicide layer in the interface layer, as in the second embodiment.

Concerning whether the ErSi$_{1.7}$ is present or absent at the grain boundary, this is controllable through appropriate selection of process parameters, such as temperatures, thermal processing conditions and gaseous atmospheres during thermal processing for silicidation in the fabrication of the second embodiment device.

This example device is also similar to that shown in FIGS. 1A-1B in choice of materials used for the S/D electrodes, interface layers and gate insulator film and in modifiability as to the use of poly-Si/NiSi multilayered gate electrode and/or the n-type extension diffusion layers in the way stated in conjunction with the first embodiment.

Embodiment 3

Figure 17A:
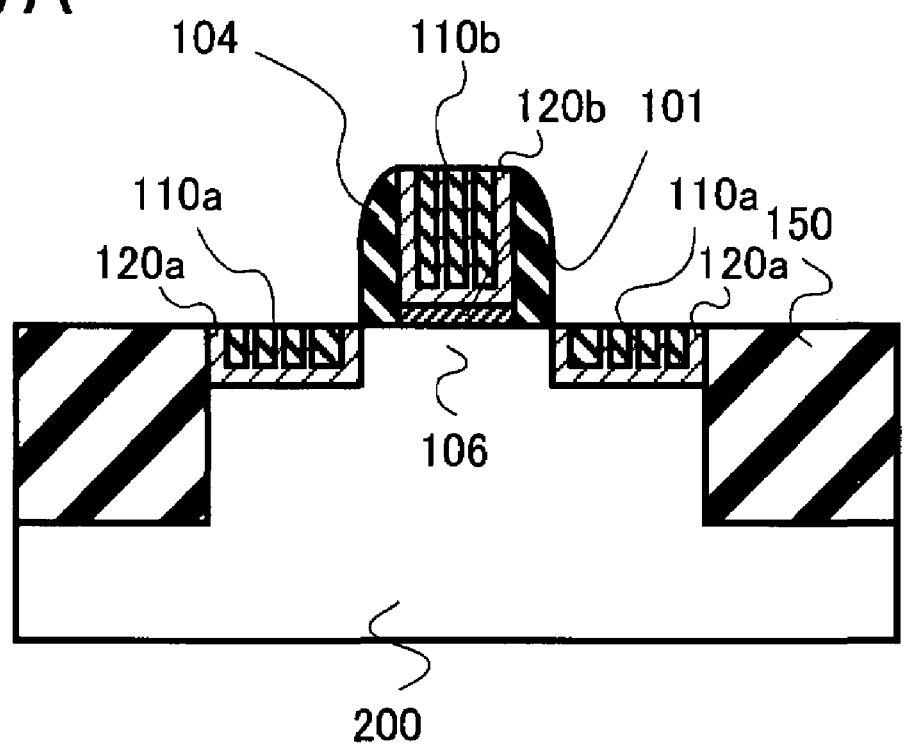
FIGS. 17A-17B are sectional views of a semiconductor device having an n-type FET in accordance with third embodiment of the invention.
Figure 17B:
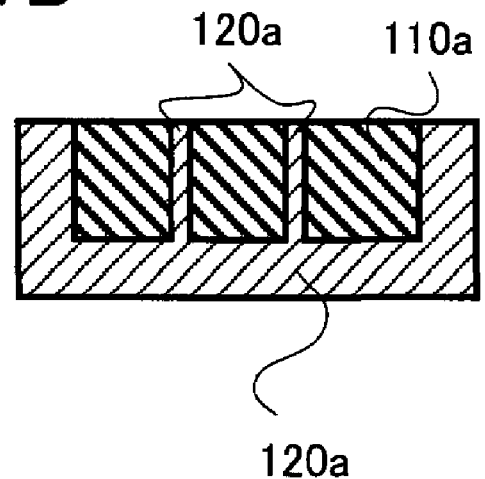

A semiconductor device including an nMISFET in accordance with a further embodiment of the invention is shown in FIGS. 17A and 17B. FIG. 17A is a sectional view of its entire FET structure whereas FIG. 17B is an enlarged sectional view of one of its S/D regions.

The embodiment device of FIGS. 17A-17B is similar to that shown in FIGS. 1A-1B with the n-type S/D diffusion layers 109 being excluded from the former. This S/D diffusion-omitted FET structure corresponds to what is called the Schottky transistor with its S/D electrode formed of Schottky junction.

Using the Schottky transistor structure is deemed preferable for suppression of short-channel effects because of the fact that it has no diffusion layers. On the contrary, it is undeniable that such Schottky transistor is incapable of obtaining the advantage of Schottky barrier reducibility owing to the impurity of diffusion layers. Obviously, the electrical resistance between S/D electrodes and Si substrate becomes higher in comparison with ordinary FET devices having diffusion layers. This leads to difficulty in obtainment of an increased drive current.

According to this embodiment device, the interface layer 120a made of Er less in work function is provided, so it becomes possible to lower Schottky barrier when compared to prior known device structures with exclusive use of NiSi S/D electrodes 110a. Thus it makes easier to provide the required drive current even in Schottky transistor.

Modification of Embodiment 3

Figure 18A:
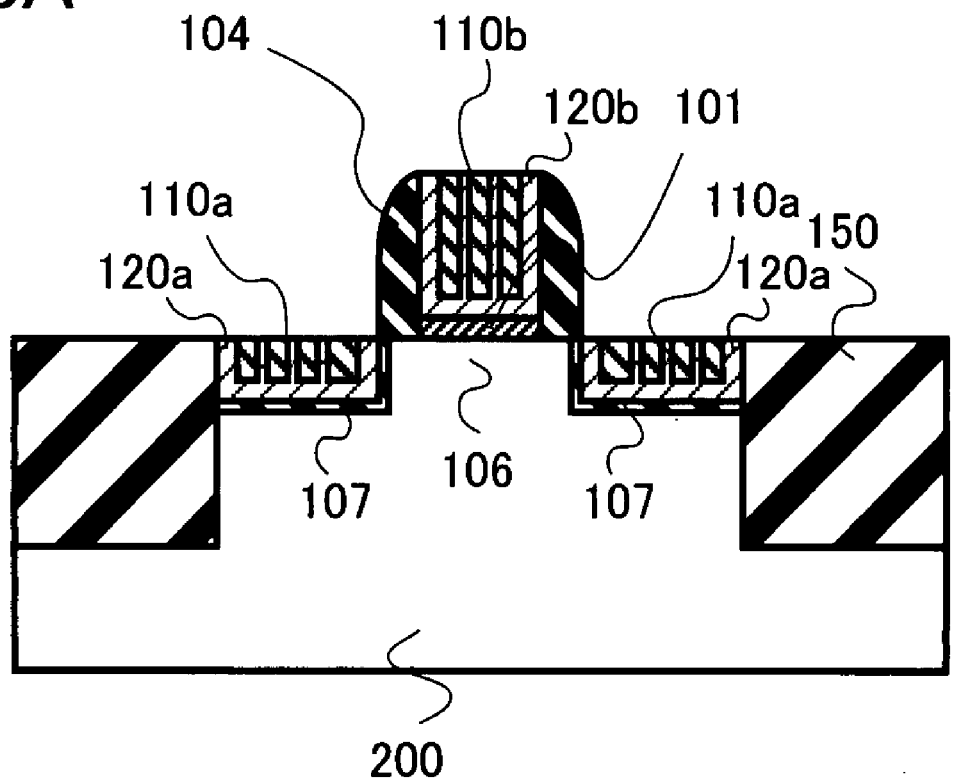
FIGS. 18A-18B are sectional views of a semiconductor device having an n-type FET in accordance with a modification of the third embodiment.
Figure 18B:
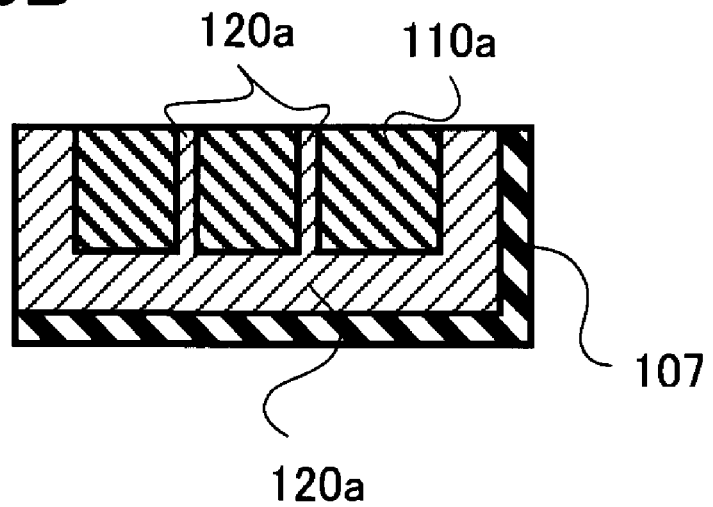

A semiconductor device having an nMISFET in accordance with a modified example of the third embodiment of the invention is shown in FIGS. 18A and 18B. FIG. 18A is a sectional view of its entire FET structure, and FIG. 18B is an enlarged sectional view of one of its S/D regions.

The embodiment device of FIGS. 18A-18B is similar to that shown in FIGS. 17A-B with a heavily-doped n (n$^+$) type shallow impurity segregation layer 107 being additionally formed in each S/D region. This structure is known as an impurity-segregated Schottky transistor, a typical example of which is disclosed in JP-A-2005-101588(KOKAI). According to this modified device, in addition to the effects and advantages of the third embodiment, it is possible to lower Schottky barrier by the presence of shallow heavily-doped impurity segregation layers 107, thereby to further reduce the contact resistance.

Embodiment 4

Figure 19A:
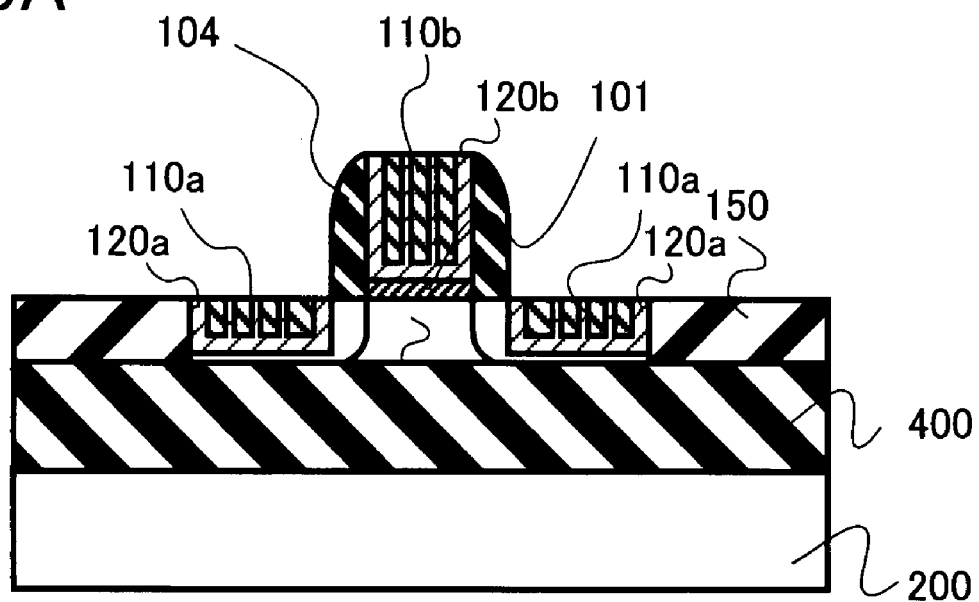
FIGS. 19A-19B are sectional views of a semiconductor device having an n-type FET in accordance with fourth embodiment of the invention.
Figure 19B:
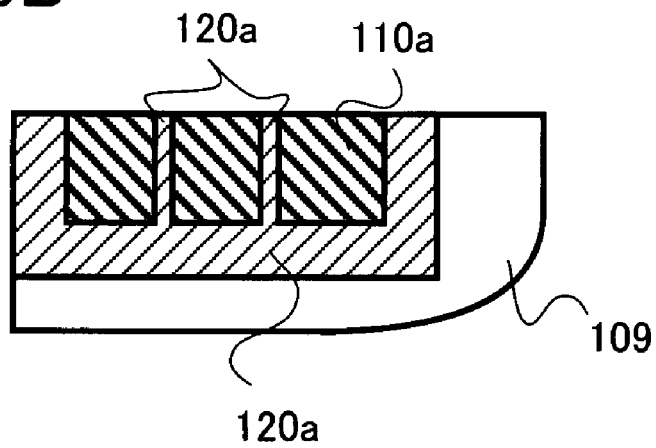

A semiconductor device having an nMISFET in accordance with another further embodiment of the invention is shown in FIGS. 19A and 19B. FIG. 19A is a sectional view of its entire FET structure, and FIG. 19B is an enlarged sectional view of one of its S/D regions.

The embodiment device of FIGS. 19A-19B is similar to that shown in FIGS. 1A-1B with the substrate of FIG. 1A being replaced by a silicon-on-insulator (SOI) substrate structure made up of a p-type Si substrate 200 with a buried interlayer dielectric film 400 and with the nMISFET being formed in an upper Si layer of the SOI substrate.

The nMISFET formed on SOI substrate also embodying the invention is capable of offering significant reducibility of junction capacity and junction leakage from bottom portions of S/D regions, in addition to the effects and advantages of the first embodiment. Thus it is possible to reduce electrical power consumption of the semiconductor device. In addition, owing to the presence of the buried insulator film 400 in SOI substrate, electrical isolation between adjacent on-chip circuit elements is enhanced. This avoids the need to employ element-isolation endurance voltage increase schemes. Thus the device fabrication process is simplified.

Embodiment 5

Figure 20A:
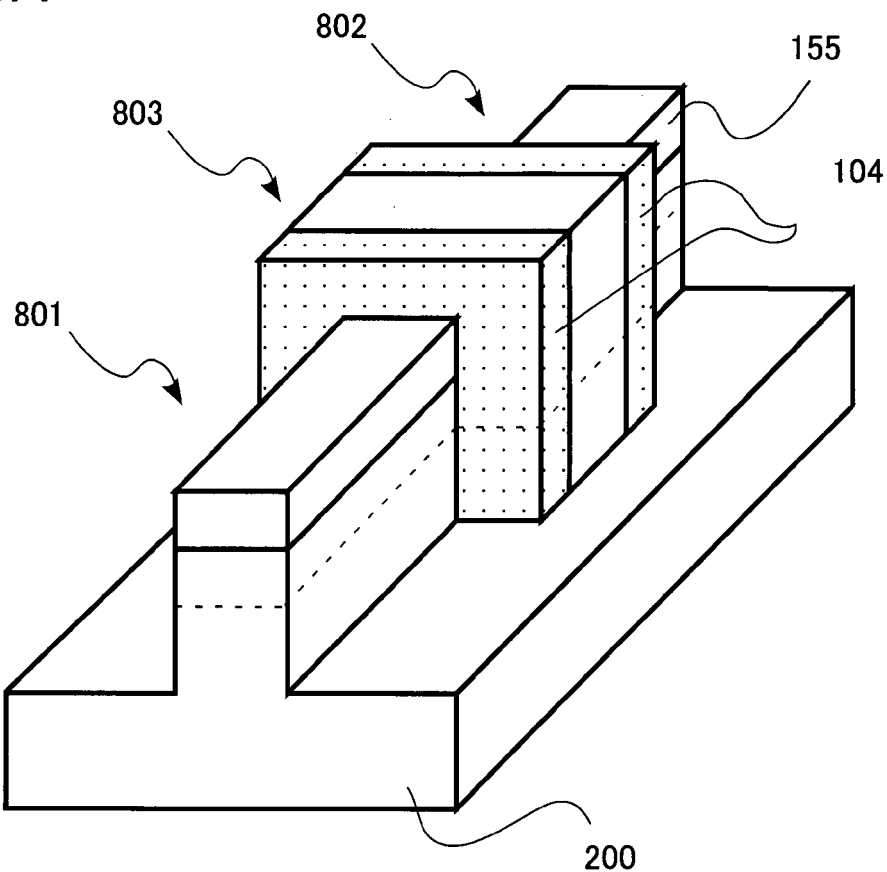
FIGS. 20A-20B are sectional views of a semiconductor device having an n-type FET in accordance with fifth embodiment of the invention.
Figure 20B:
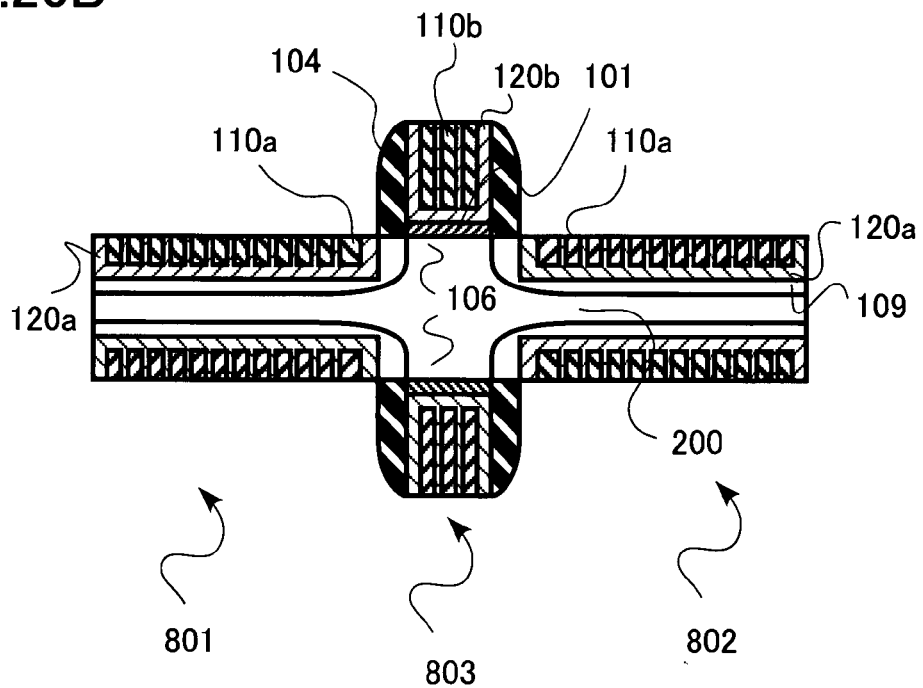

A semiconductor device having an nMISFET in accordance with another further embodiment of the invention is shown in FIGS. 20A and 20B. FIG. 20A is a perspective view of its structure, and FIG. 20B is a planar sectional view of it taken along broken line of FIG. 20A.

The device of this embodiment is similar to that shown in FIGS. 1A-1B with the nMISFET being modified to have the so-called "fin" structure.

As shown in FIG. 20A, the nMISFET of this embodiment has its source region 801, drain region 802 and gate region 803, which are three-dimensionally formed on a p-type semiconductor substrate 200. As better seen from FIG. 20B, a gate electrode has portions which are formed on both sides of a channel region 106 and which are insulated by gate insulator film 101. With this 3D structure, the carrier controllability is enhanced when compared to 2D or planar FETs. Thus it is possible to further reduce short-channel effects, which leads to achievement of further miniaturization of FET device structure in addition to the effects and advantages of the first embodiment.

Although in this embodiment the FET device of the type having the fin structure is disclosed, the principles of this invention is applicable to any other 3D FET structures, such as double-gate structures, vertically stacked structures, etc.

Embodiment 6

Figure 21A:
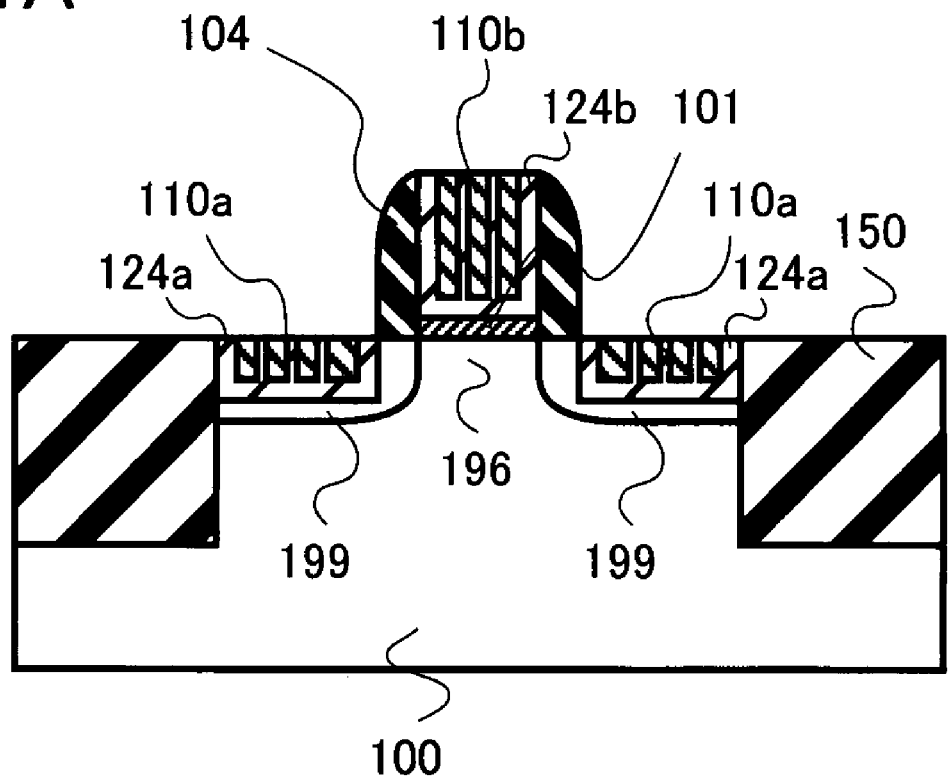
FIGS. 21A-21B are sectional views of a semiconductor device having a p-type FET in accordance with sixth embodiment of the invention.
Figure 21B:
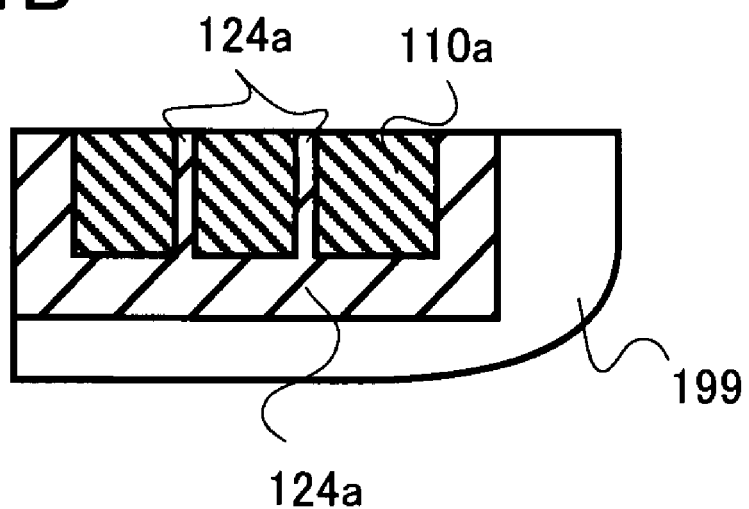

A semiconductor device including a p-type MISFET (pMISFET) in accordance with still another further embodiment of the invention is shown in FIGS. 21A and 21B. FIG. 21A is a cross-sectional view of its entire transistor structure whereas FIG. 21B is an enlarged sectional view of one of its S/D regions.

The device of this embodiment has an interface layer in the interface between S/D electrodes made of metal silicide and semiconductor substrate. The interface layer is made of a metal which is different from the metal forming the silicide of S/D electrodes. The pMISFET of this embodiment device is arranged so that the metal forming the interface layer exists also at grain boundaries of the silicide of S/D electrodes. Very importantly, the interface layer metal is greater than the S/D electrode silicide both in its own work function and in work function of the silicide thereof.

More specifically, as shown in FIGS. 21A-21B, this device has an n-type Si substrate 100 with a channel region 196 being defined in its surface. The device also has a gate electrode above the n-Si substrate 100 with a gate insulator film 101 sandwiched therebetween. This gate electrode is of the fully silicided (FUSI) structure having a lateral array of upstanding film components 110b made of a silicide of the first metal, nickel—i.e., nickel silicide (NiSi). The gate electrode has opposite sidewalls, on which are formed dielectric films 104 made of silicon nitride (SiN)—say, gate sidewall insulator films.

A pair of spaced-apart S/D diffusion layers 199 is formed in n-Si substrate 100 with the channel region 196 beneath the gate electrode being laterally interposed therebetween. The S/D diffusions 199 are doped with a p-type impurity, e.g., boron (B). S/D electrodes 110a are provided on both sides of channel 196. These S/D electrodes are made of the silicide of first metal, Ni—i.e., NiSi.

The device further includes an interface layer 124a made of a second metal—here, platinum (Pt)—in an interface between the individual S/D diffusion 199 in Si substrate 100 and its associated NiSi S/D electrode 11a. Note that the second metal Pt of interface layer 120a exists also in the NiSi S/D electrodes 110a.

More precisely, the second metal, Pt, existing inside of the S/D electrodes 110a is present at grain boundaries of the NiSi material forming these S/D electrodes. Note here that the second metal Pt is greater in work function than NiSi of S/D electrodes 110a; in addition, the silicide of Pt, i.e., PtSi, is also larger in work function than NiSi of S/D electrodes 110a. The embodiment device further has an interface layer 124b made of Pt, which is formed in an interface between the gate insulator film 101 and the gate electrode formed of the NiSi film 110b.

With the semiconductor device having the pMISFET that is structured to have the interface layer made of Pt greater in work function than NiSi forming S/D electrodes, it becomes possible to lower Schottky barrier against holes between S/D electrodes and S/D diffusions (Si substrate), thereby enabling reduction of electrical contact resistance.

Prior known techniques for reducing the contact resistance by mere use of S/D electrodes made of metal silicides, such as PtSi, are disclosed in currently available technical bulletins. A distinguishing feature of this embodiment over such prior art is that the interface layer is made of a specifically chosen metal, Pt, that is larger in work function than PtSi. Using this material makes it possible to further reduce the contact resistance when compared to the case of PtSi.

Generally, silicidizing a metal results in the work function approaching the mid gap side. Therefore, even a metal of large work function, such as Pt, exhibits a decrease in work function by silicidation thereof. In this embodiment, applying the metal to the interface layer in the form of a "stand-alone" substance permits effective use of the large work function of this metal per se, causing Schottky barrier to decrease sufficiently to thereby lower the contact resistance.

Also importantly, the NiSi material that is less in resistivity is used for the S/D electrodes in a way independent of the interface layer. Thus it is possible to lower the electrode's own resistance also. Further, in this embodiment, Pt of larger work function than NiSi exists at the grain boundaries of NiSi forming S/D electrodes. This results in a decrease of interface resistance against holes at the grain boundaries. Thus it is possible to further reduce the resistance of S/D electrode-forming NiSi per se, which leads to further reduction of parasitic resistance of the pMISFET.

In addition, by the presence of Pt at NiSi grain boundary, agglomeration of NiSi is suppressed in relation to the interface (surface) energy. This makes it expectable to increase the reliability of semiconductor device, including suppression or prevention of electrical disconnection in silicide due to thermal stresses and junction leakage increase due to unwanted serpentine deformation of the interface with Si substrate, as in the nMISFET device structure shown in FIGS. 1A-1B.

Additionally, by the presence of the interface layer made of Pt of large work function in the interface between the gate insulator film and gate electrode silicide, it becomes possible to lower the threshold voltage of pMISFET, thereby enabling achievement of high transistor drivability. Employing the FUSI gate structure makes it possible to suppress gate electrode-side depletion during transistor driving within an extended range up to higher gate voltages to thereby realize high transistor drivability, in a similar way to the case of nMISFET of the first embodiment shown in FIGS. 1A-B.

It has been stated that in this embodiment, it is possible to provide the intended semiconductor device having pMISFET capable of reducing the parasitic resistance such as the contact resistance of S/D electrode and also the resistance of such electrode per se and also to enhance its performance by threshold voltage reduction and gate depletion reduction while at the same time improving the reliability thereof.

It is noted that the silicide material for the source, drain and gate electrodes is not limited only to NiSi. In the viewpoint of reduction of electrode's own resistance, it is preferable to use specific ones of silicides having relatively low electrical resistance, such as NiSi with its resistivity of about 15 μΩcm, as stated previously in conjunction with the nMISFET device of the first embodiment.

In terms of Schottky barrier lowering for contact resistance reduction, it is desirable that the metal forming the interface layer be those metals with the work function being greater than the mid gap of silicon, such as Pt with its work function of about 5.65 eV although this is not to be construed as limiting the invention. Other preferable examples include, but not limited to, palladium (Pd) with its work function of about 5.12 eV, gold (Au) with its work function of about 5.1 eV, and iridium (Ir) with its work function of about 5.27 eV.

Also note that the insulative material of the gate insulator film 101 is not limited to silicon oxides and may be replaced by high-dielectric-constant dielectric materials which are higher in dielectric constant than silicon oxides, when the need arises, as has been stated in the first embodiment.

An explanation will next be given of a method of fabricating the embodiment semiconductor device of FIGS. 21A-21B with reference to FIGS. 22 to 30 below. These figures illustrate, in cross-section, some major process steps in the manufacture of the device.

The semiconductor device fabrication method of FIGS. 22-30 is similar to that of the nMISFET of the first embodiment in that the phenomenon that execution of thermal processing between two kinds of metals results in one metal behaving to diffuse into a grain boundary of the other metal and then segregating in a surface thereof is applied to the case where one of the two metals is replaced by a silicide.

Figure 22:
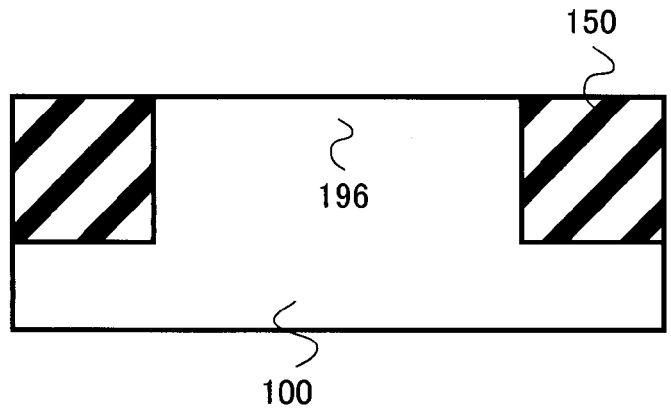
FIGS. 22 to 30 illustrate, in cross-section, some of major steps in the manufacture of the semiconductor device of the sixth embodiment.

First, as shown in FIG. 22, an n-type Si substrate 100 is prepared. This n-Si substrate has a (100) plane with an impurity, e.g., phosphorus (P), being doped to a concentration of about $10^{15}$ atoms/cm$^3$. In Si substrate 100, form an STI regions 150 made of silicon oxide.

Figure 23:
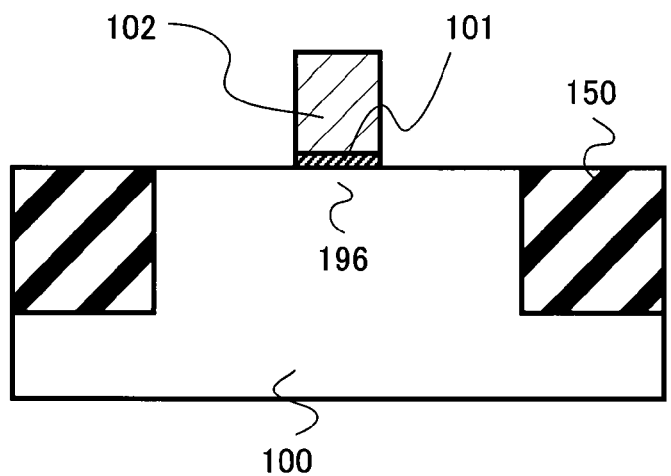

Then, as shown in FIG. 23, form a gate insulator film 101 on a top surface of a channel region 196 to a predetermined thickness, i.e., an equivalent oxide thickness (EOT) of about 1 to 2 nm. Next, deposit by LPCVD techniques a patterned polysilicon film 102 for later use as the gate electrode to a thickness of about 100 to 150 nm.

Then, use lithography and RIE techniques to pattern the gate insulator film 101 and gate electrode 102 thereon so that the resulting gate length is 30 nm, or more or less. If necessary, post-oxidation is performed to an extent of 1 to 2 nm.

Figure 24:
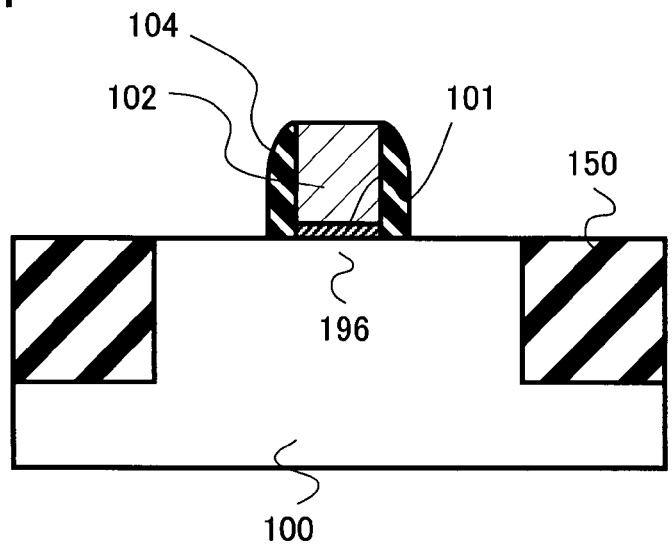

Next, as shown in FIG. 24, a silicon nitride (SiN) film is deposited by LPCVD to a thickness of about 8 nm. Thereafter, RIE etch-back is applied thereto. By this etchback treatment, the SiN film is selectively etched away so that only portions are left on the sidewalls of gate electrode 102. Thus, the gate sidewall dielectric film 104 is formed.

Figure 25:
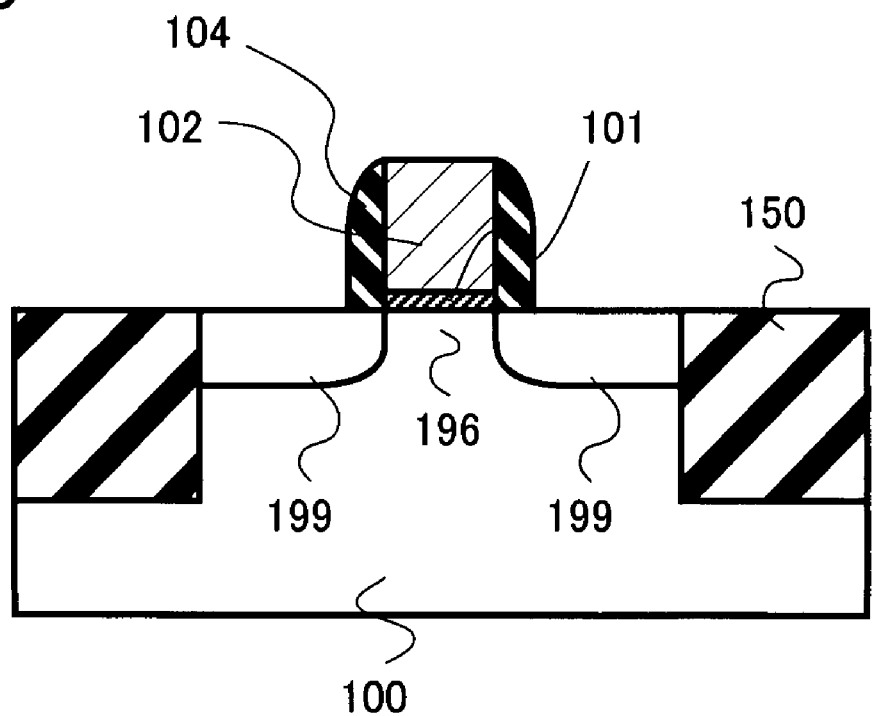

Next as shown in FIG. 25, with the gate electrode 102 and sidewall insulator film 104 as a mask, an impurity, e.g., boron (B), is doped by ion implantation into Si substrate 100 to thereby form p-type diffusion layers 199 with a concentration of about $1 \times 10^{20}$ atoms/cm$^3$. Then, activation annealing (spike anneal) is applied thereto at a temperature of about 1050° C.

Figure 26:
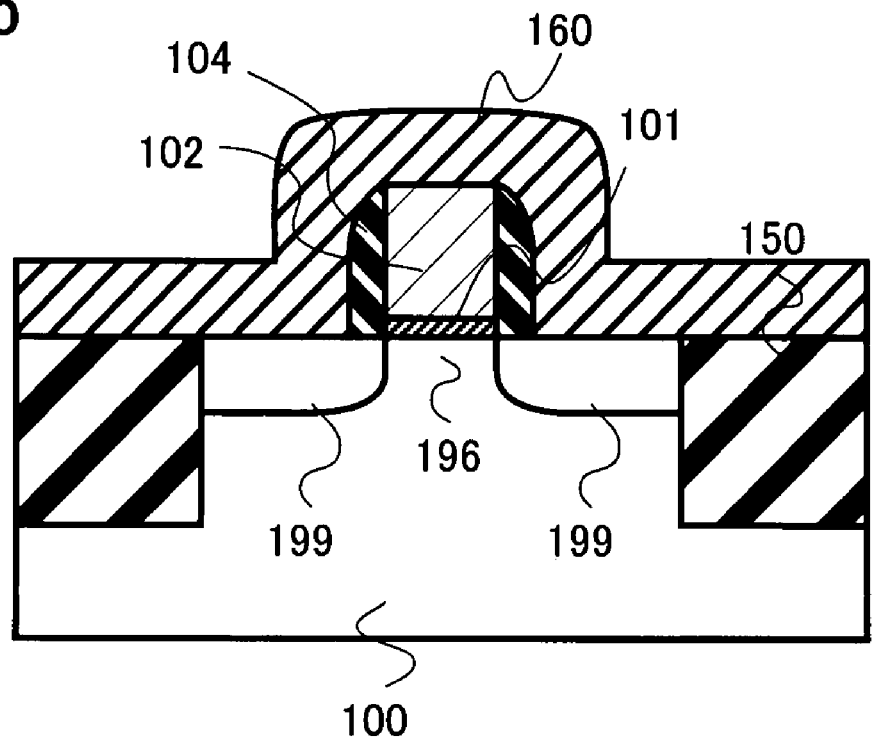

Next as shown in FIG. 26, a nickel (Ni) film 160 is formed by sputtering to a thickness of about 10 nm.

Figure 27:
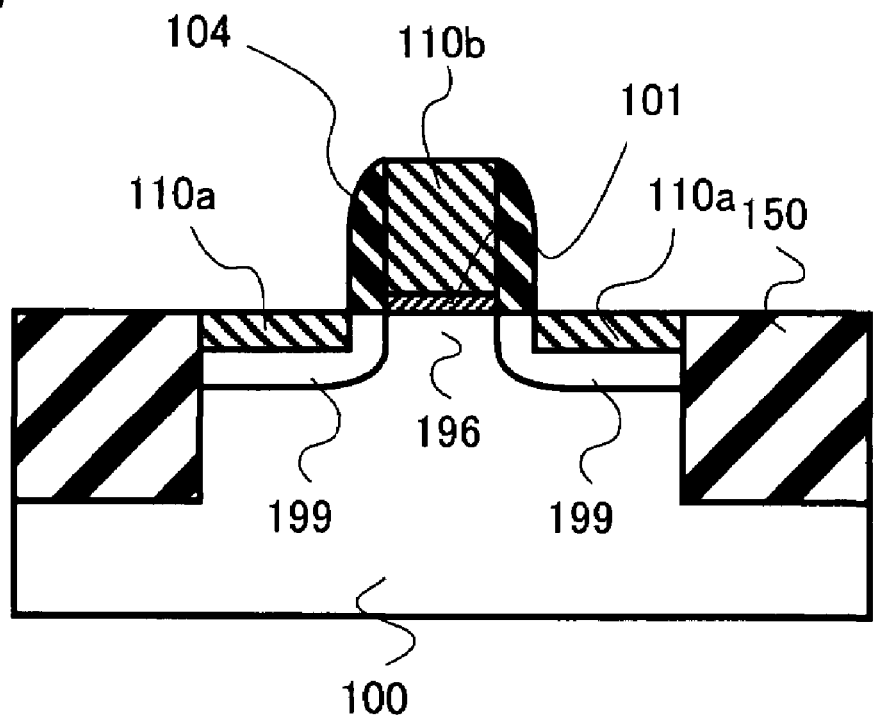

Next as shown in FIG. 27, annealing at about 500° C. (first thermal processing) is done to cause the Ni film 160 and Si substrate 100 to react together for silicidation, thereby forming a pair of laterally spaced-apart NiSi layers 110a for later use as source/drain (S/D) electrodes. Simultaneously, let the poly-Si gate electrode 102 fully react up to the interface with its underlying gate insulator film 101, thereby to form a NiSi film 110b for later use as the gate electrode. Thereafter, a chosen chemical solution is used to perform selective exfoliation or "peel-off" of nonreactive Ni components residing in the surface.

Figure 28:
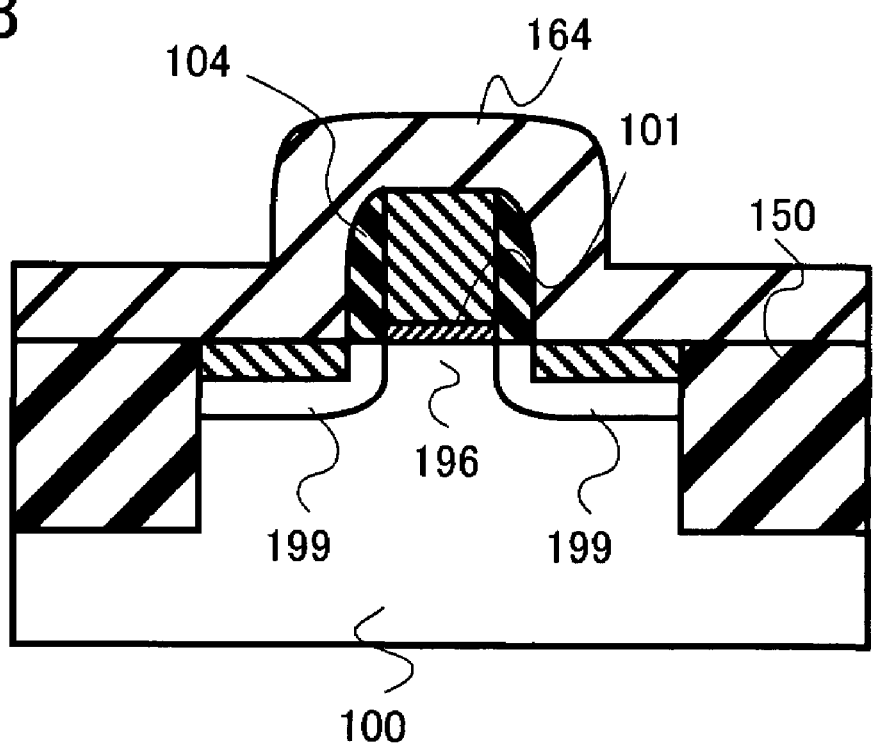

Next as shown in FIG. 28, deposition is performed by sputtering to form a Pt film 164 of about 10 nm thick, which is greater in work function than the NiSi layers 110a and 110b. Note here that the PtSi material, which is the silicide of Pt, also is larger in work function than the NiSi of S/D electrodes 110a.

Figure 29:
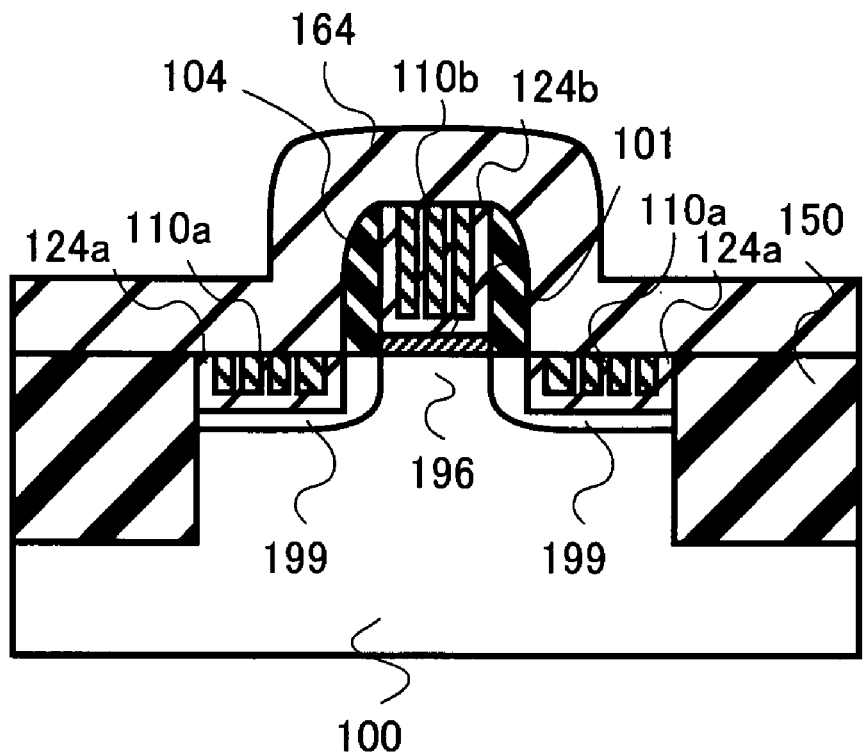

Next as shown in FIG. 29, additional annealing at about 300 to 400° C. (second thermal processing) is performed to force Pt to diffuse out of the Pt film 164 through grain boundaries of NiSi S/D electrodes 110a. By this thermal diffusion, an interface layer 124a made of Pt is formed in the interface between Si substrate 100 and each NiSi S/D electrode 110a.

Very importantly, process conditions and parameters are carefully set to cause Pt to exist in grain boundaries of NiSi S/D electrodes 110a. Simultaneously, let Pt diffuse through the grain boundary of NiSi gate electrode 110b to thereby form a Pt interface layer 124b in the interface between gate insulator film 101 and NiSi gate electrode 110b. Typically, this thermal processing is done in an atmosphere of inactive or inert gases, such as nitrogen or argon, or alternatively in a vacuum.

Desirably the second thermal processing is lower in temperature than the first thermal processing. This is in order to suppress Ni diffusion from NiSi layers formed by the first thermal processing, thereby reducing an increase in junction leakage. The temperature setting is also to suppress resistance increases of the electrodes per se otherwise occurring due to possible composition changes of NiSi material. Lowering the first thermal processing temperature is also desirable from viewpoints of suppressing unwanted extension of diffusions 199 in the channel direction and lessening degradation of transistor characteristics. It is also preferable from other viewpoints which follow: preventing increase in work function of the interface layer due to silicidation of the metal thereof, such as Pt or else, and curtailing reaction between NiSi and Pt.

Figure 30:
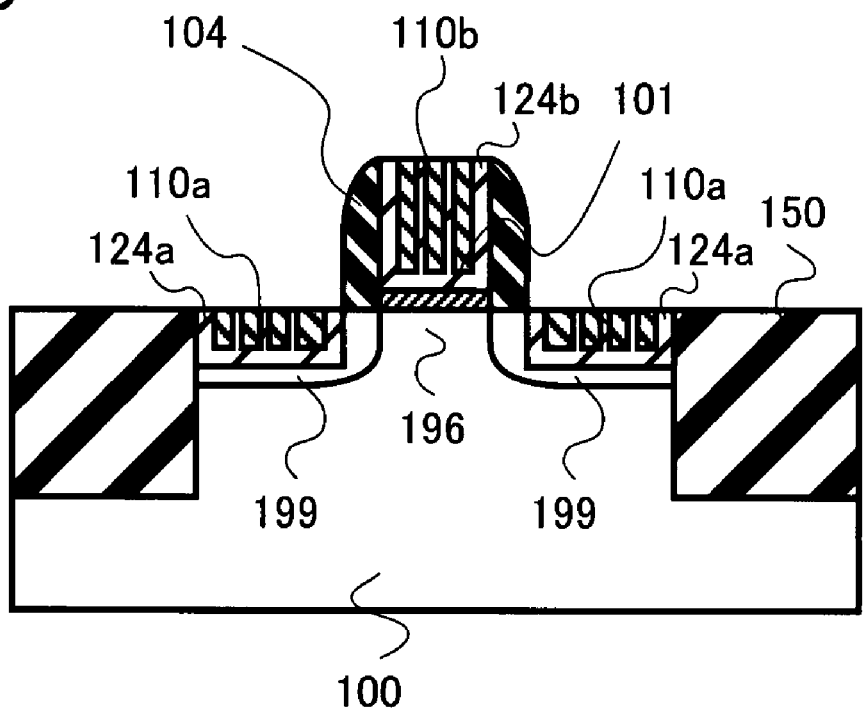

Next as shown in FIG. 30, selective etching is done using a chemical to remove Pt residing in the surface. At this time, the Pt interface layers 124a-124b that reside also at the grain boundaries of NiSi electrodes 110a-110b are never removed away through etching because the NiSi layers 110a-110b serve as a mask against such unintentional etching.

The fabrication method of this embodiment utilizes the segregation phenomenon that the NiSi surface-deposited Pt behaves to move or migrate by thermal processing from the NiSi grain boundary to segregate at the Si substrate or the interface between gate insulator film and NiSi as stated previously. Thus, it becomes possible to form the interface layer made of the Pt metal large in work function and thus fabricate the semiconductor device structure shown in FIGS. 21A-21B capable of sufficiently lowering Schottky barrier between the S/D electrodes and Si substrate.

Another advantage of this method lies in its ability to form the large work function metal interface layer at a temperature lower than the metal silicidation temperature. Accordingly, the metal material used for the interface layer is not limited only to non-silicided metals unlike the Kirkendall effect-used fabrication method as disclosed in JP-A-2005-123626.

Embodiment 7

Figure 31A:
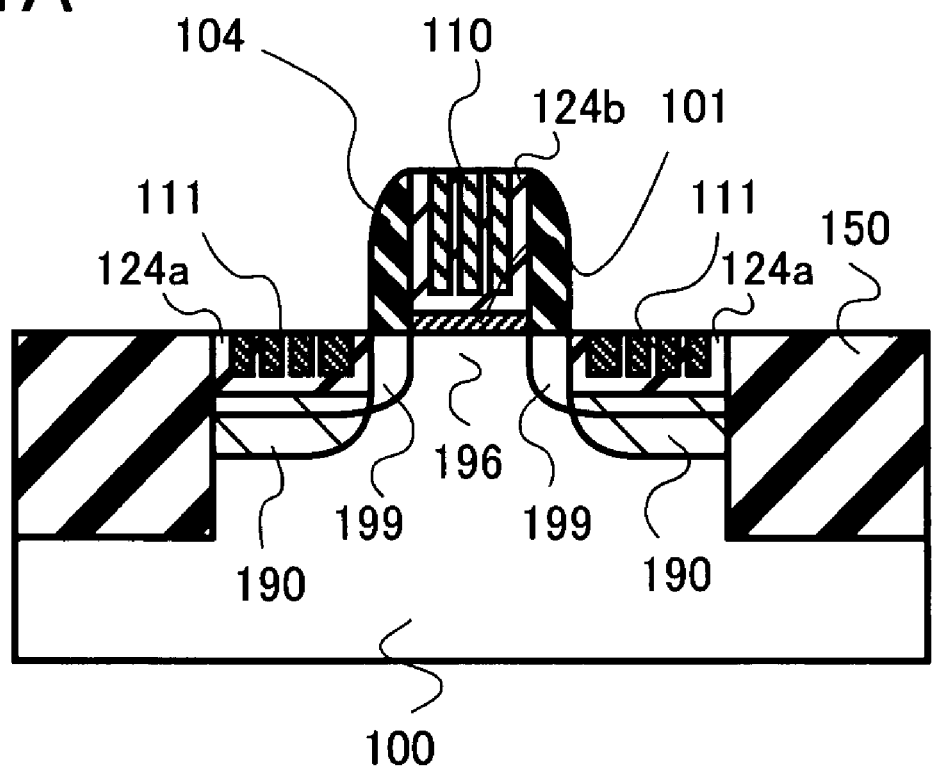
FIGS. 31A-31B are sectional views of a semiconductor device having a p-type FET in accordance with seventh embodiment of the invention.
Figure 31B:
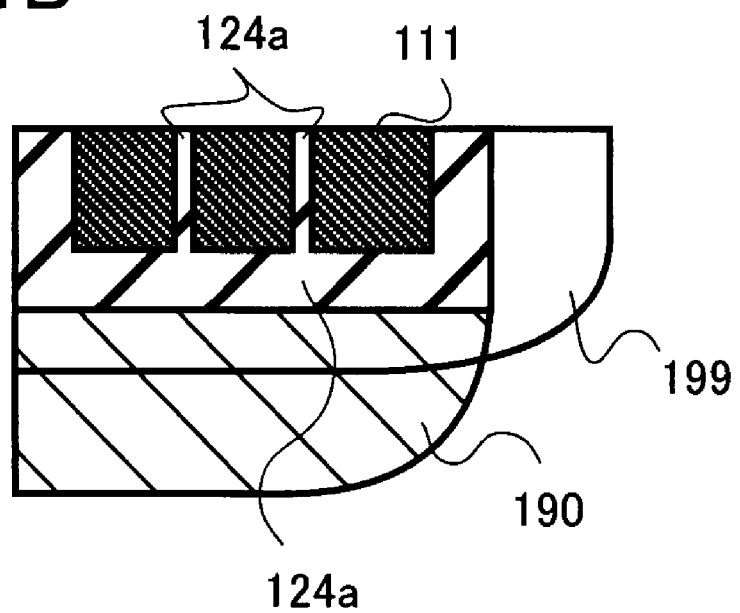
Figure 32A:
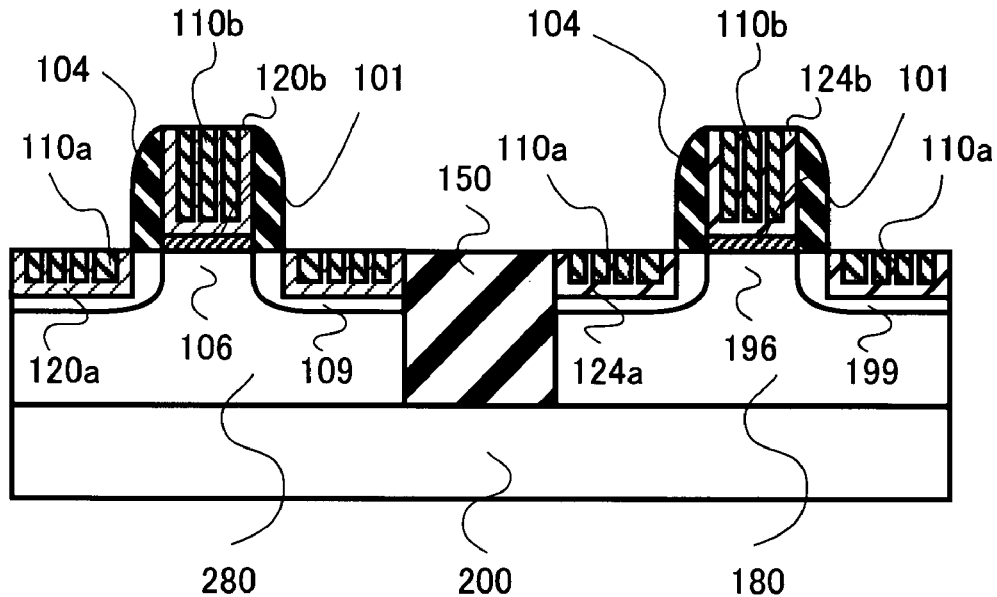
FIG. 32A is a sectional view of a semiconductor device having FETs in accordance with eighth embodiment of the invention.
Figure 32B:
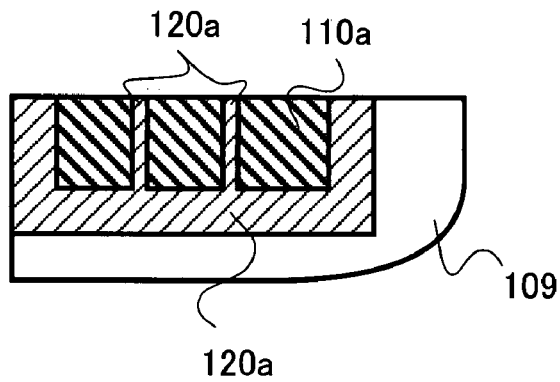
FIGS. 32B-32C are enlarged partial sectional views of the device.

A semiconductor device which includes a pMISFET in accordance with a further embodiment of the invention is shown in FIGS. 31A and 32B. FIG. 31A is a cross-sectional view of its entire FET structure whereas FIG. 32B is an enlarged sectional view of one of its S/D regions.

This embodiment device is similar to that shown in FIGS. 21A-B with a pair of silicon germanium ($Si_{1-x}Ge_x$) layers being additionally formed at both ends of channel region 196 and with S/D electrodes being formed of nickel germanosilicide ($NiSi_xGe_{1-x}$) layers 111.

An advantage of the pMISFET of this embodiment is that the mobility of holes increases owing to application of a lattice distortion to the silicon of channel region 196 due to the fact that the $Si_{1-x}Ge_x$ layers 190 are provided on the both sides of channel region 196. Thus, the hole mobility further increases to thereby enhance the drivability of pMISFET, while at the same time obtaining the effects and advantage of the sixth embodiment.

While several embodiments which include pMISFETs incorporating the principles of this invention are stated above, these are similar to the nMISFET device shown in FIGS. 1A-B in choice of materials for S/D electrodes and gate insulator film, in modifiability of poly-Si/NiSi stacked multilayer gate structure and/or use of p-type extension diffusion layers, and in applicability to 3D device structures, such as Schottky transistors, segregated Schottky transistors, SOI substrate structures, and fin structures.

Embodiment 8

Figure 32C:
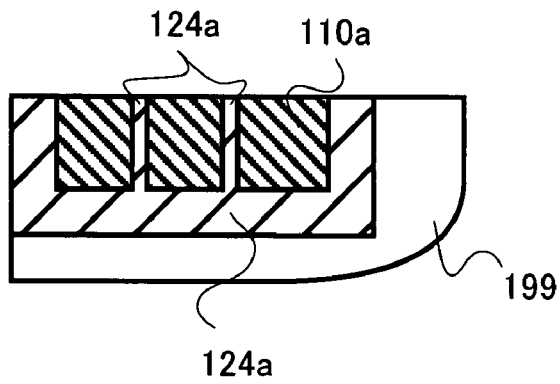

A complementary metal oxide semiconductor (CMOS) integrated circuit device in accordance with a further embodiment of this invention is shown in FIGS. 32A to 32C. As shown in FIG. 32A, this CMOS device has on a p-type Si substrate 200 an N-channel MOSFET (NMOSFET) and a P-channel MOSFET (PMOSFET), wherein the former is similar in structure to that shown in FIGS. 1A-1B whereas the latter is similar to that of FIGS. 21A-B. An enlarged sectional view of one of source/drain (S/D) regions of NMOSFET is shown in FIG. 32B whereas an enlarged sectional view of an S/D region of PMOSFET is shown in FIG. 32C.

This CMOSFET device offers the effects and advantages obtainable from the first and sixth embodiments. In other words, the individual one of the NMOSFET and PMOSFET is much reduced in parasitic resistance owing to achievement of lower contact resistance and reduction of the electrode's own resistance while at the same time increasing drivability owing to gate depletion reducibility and also improving heat resistivity or thermostability due to the presence of a metal at grain boundary. Accordingly, with this embodiment, it becomes possible to achieve the semiconductor device having high-performance CMOSFET structure with increased reliability.

A process of making the CMOSFET device of FIGS. 32A-C will next be described with reference to FIGS. 33 to 47 below.

Figure 33:
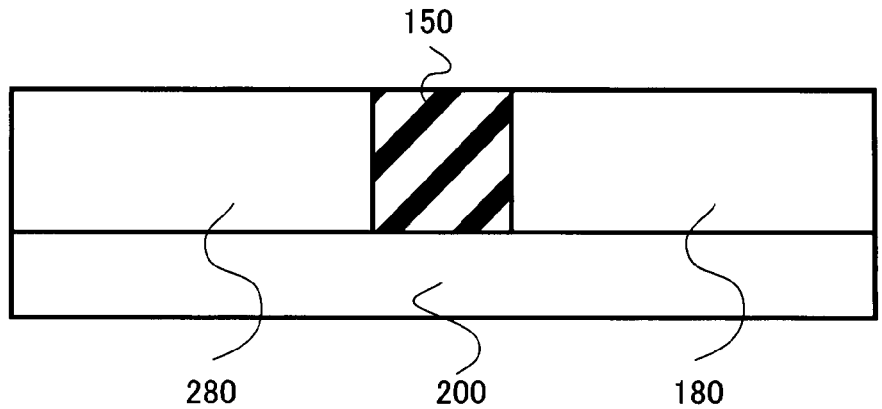
FIGS. 33 to 47 depict, in cross-section, some major steps in the manufacture of the semiconductor device of the eighth embodiment.

First, as shown in FIG. 33, a p-type Si substrate 200 is prepared, which has a top surface of a (100) plane with boron (B) doped to a concentration of about $10^{15}$ atoms/cm$^3$. In the substrate surface, form a pattern of STI regions 150 made of silicon oxide. Then, form an n-type well region 180 and a p-type well region 280 by ion implantation.

Figure 34:
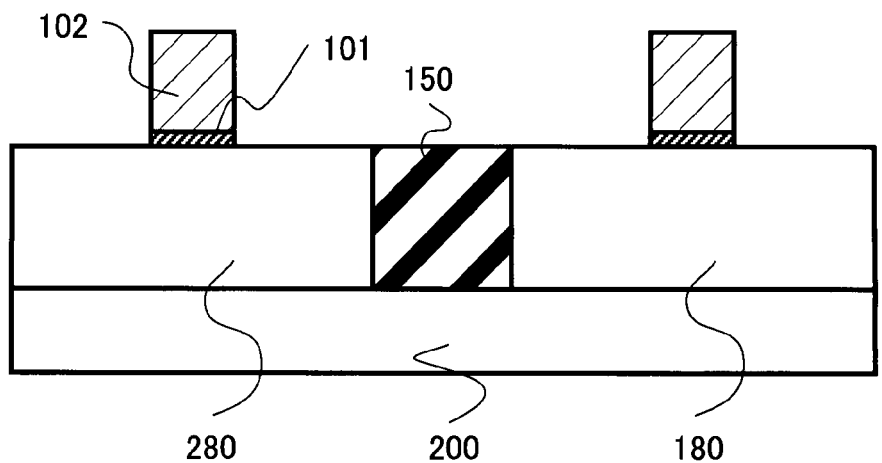

Next, as shown in FIG. 34, a gate insulator film 101 made of silicon oxide is formed to a thickness of about 1 nm. Then, a poly-Si film for later use as gate electrodes 102 is deposited by LPCVD techniques to a thickness of about 100 to 150 nm. Then, use lithography and RIE techniques to pattern the films 101 and 102 to form spaced-apart gate insulator film 101 and gate electrodes 102 thereon, each having a gate length of about 30 nm. Post-oxidation of 1-2 nm may be performed, if necessary.

Figure 35:
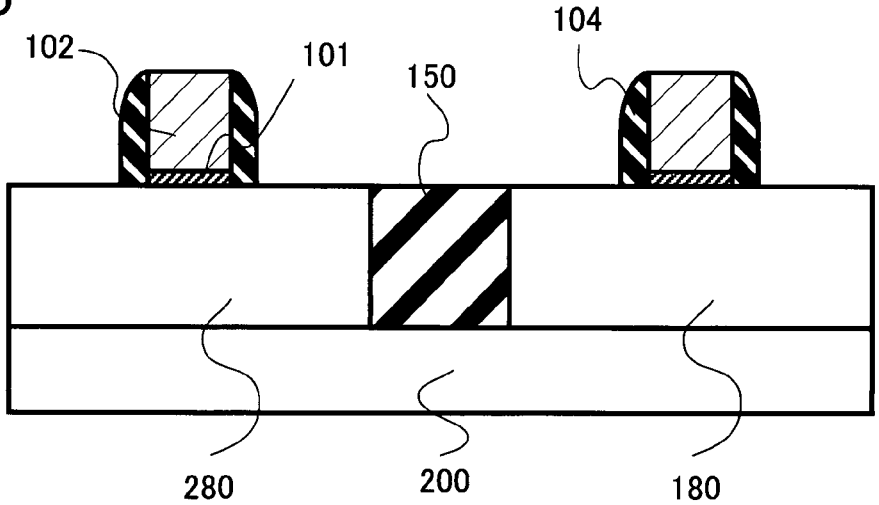

Next as shown in FIG. 35, after having deposited a SiN film by LPCVD to a thickness of about 8 nm, RIE etch-back is applied thereto. By this etchback, SiN film is selectively removed so that its portions reside only on the sidewalls of each gate electrode 102. Thus gate sidewall films 104 are formed.

Figure 36:
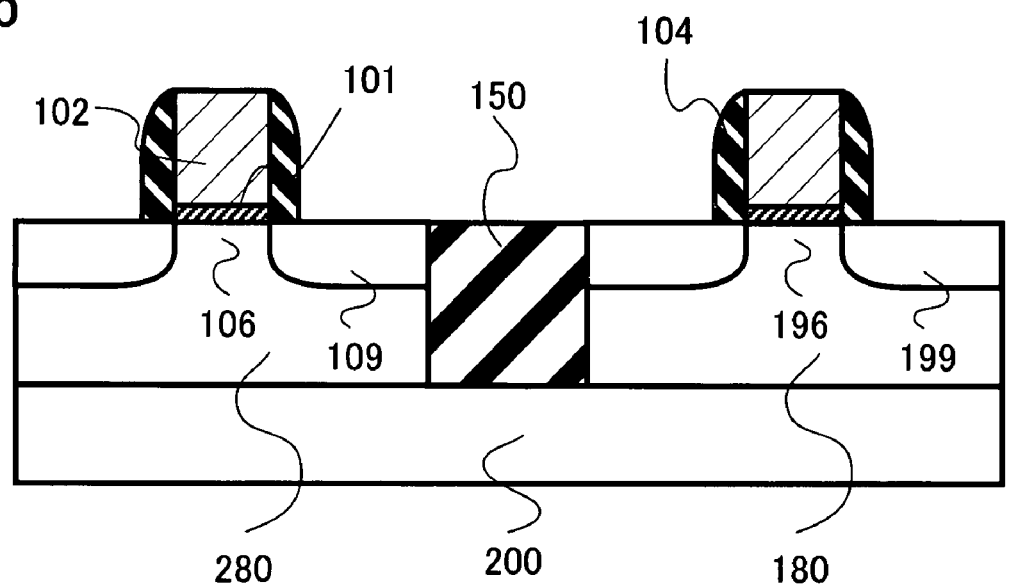

Next as shown in FIG. 36, the n-well 180 is covered or "masked" by a patterned photoresist film. Then, an arsenide (As) impurity is doped by ion implantation into the p-well 280 with the gate electrode 102 having its opposite sidewall insulators 104 used as a mask therefor, thereby to form spaced-apart n-type diffusion layers 109 with its impurity concentration of about $1 \times 10^{20}$ atoms/cm$^3$. Consequently, while the p-well 280 covered with a photoresist film, a B impurity is ion-implanted into the n-well 180 with its corresponding gate electrode 102 and its sidewall insulators 104 used as a mask, thereby forming p-type diffusion layers 199 having its impurity concentration of about $1 \times 10^{20}$ atoms/cm$^3$. The resulting device structure is then subjected to activation annealing (spike anneal) at a temperature of about 1050° C.

Figure 37:
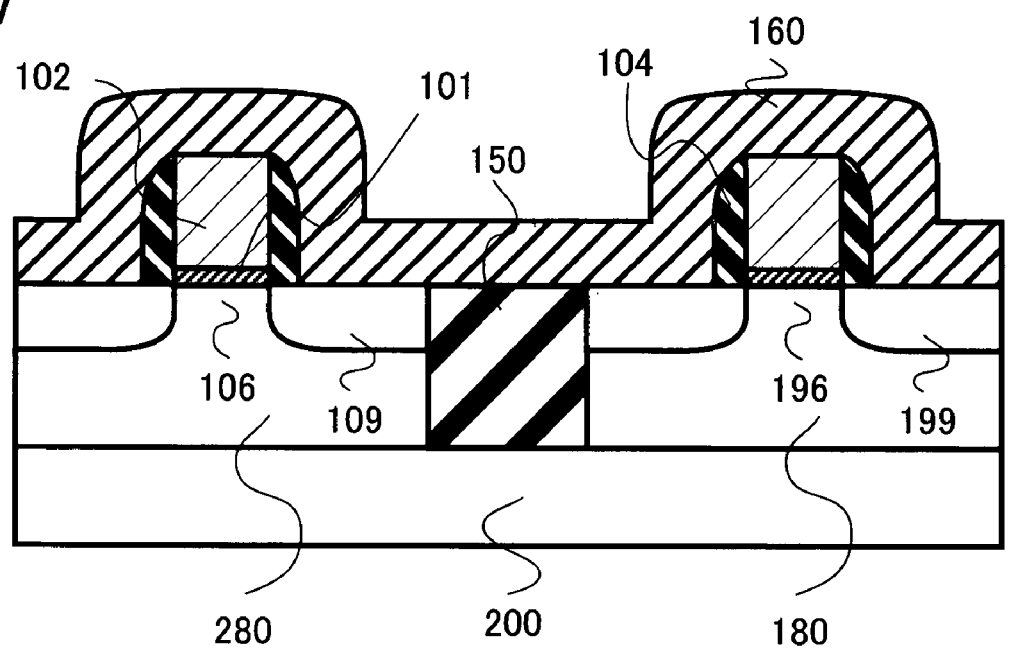

Next as shown in FIG. 37, a 10-nm thick Ni film 160 is formed by sputtering.

Figure 38:
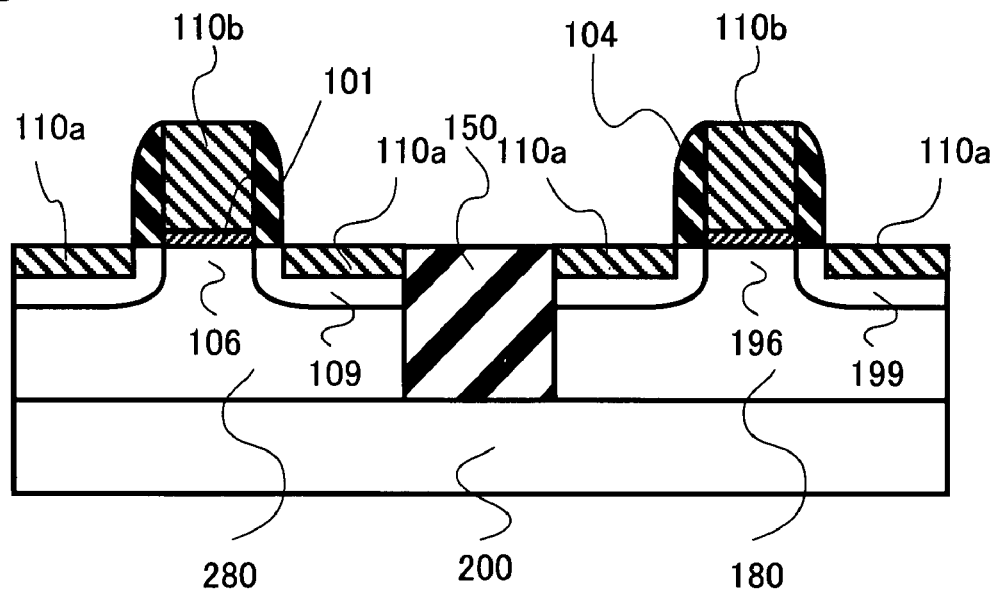

Next as shown in FIG. 38, annealing at about 500° C. (first thermal processing) is performed to cause Ni film 160 and Si substrate 200 to react together for silicidation, thereby forming pairs of NiSi layers 110a for later use as source/drain (S/D) electrodes. Simultaneously, let the individual poly-Si gate electrode 102 fully react up to an interface with its underlying gate insulator film 101, thereby to form a NiSi layer 110b for later use as each gate electrode. Thereafter, selective etching is done by use of a chemical solution to remove nonreactive Ni components residing in the surface.

Figure 39:
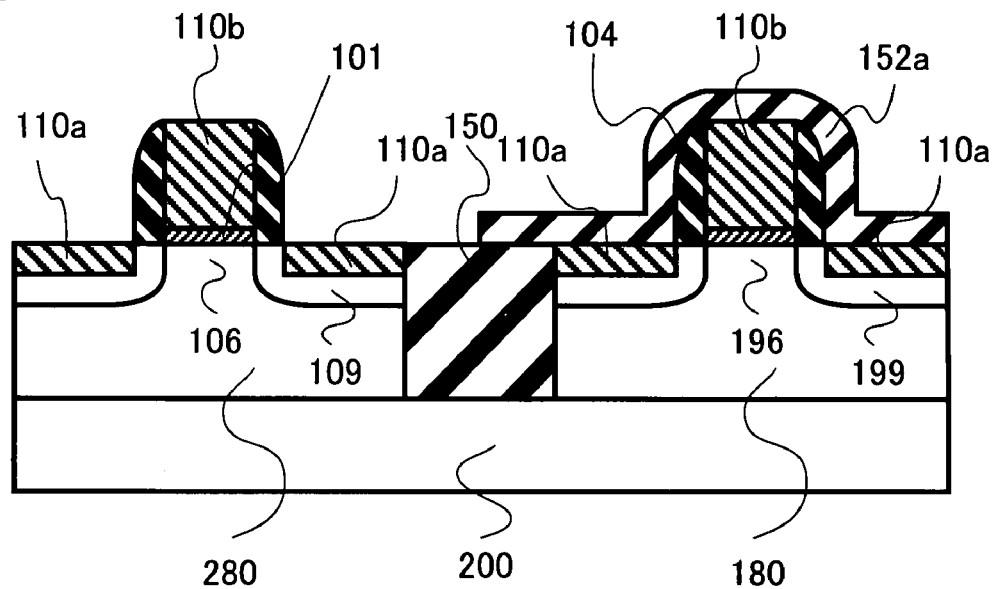

Next as shown in FIG. 39, a 50-nm thick silicon oxide film 152a is deposited by LPCVD. Thereafter, this film 152a is patterned by lithography and RIE techniques so that it is left on n-well 180 only.

Figure 40:
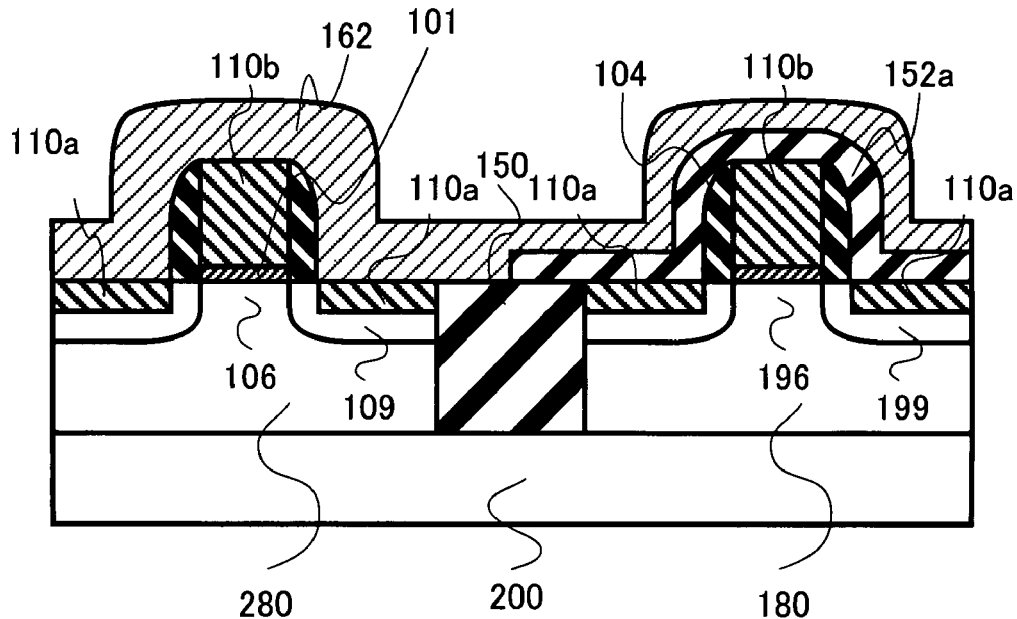

Next as shown in FIG. 40, an Er film 162 of 10 nm thick is formed by sputtering to cover the resulting device structure. Note here that this Er film 162 is less in work function than NiSi layers 110a-110b. The silicide of Er, i.e., $ErSi_{1.7}$, also is smaller in work function than NiSi layers 110a.

Figure 41:
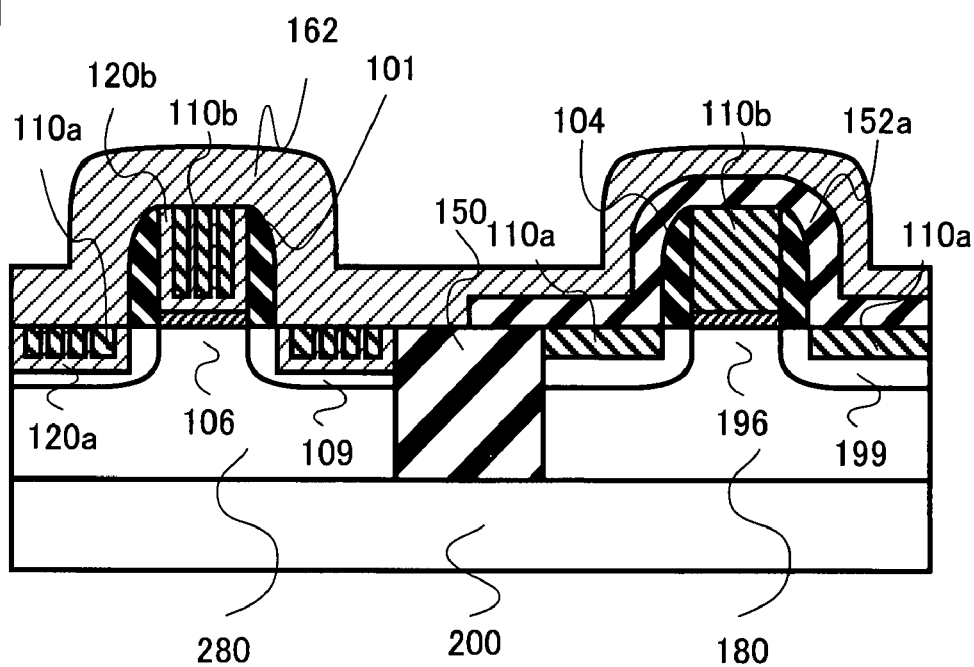

Next as shown in FIG. 41, annealing at about 300-400° C. (second anneal) is done to cause Er to outdiffuse from Er film 162 through grain boundaries of NiSi layers 110a for use as S/D electrodes of p-well 280, thus forming an Er interface layer 120a in the interface between Si substrate 200 and each NiSi layer 110a while letting Er exist in grain boundaries of NiSi layers 110a.

Simultaneously, let Er thermally diffuse through grain boundary of NiSi gate electrode 110b, thereby to form an interface layer 120b made of Er at the interface between gate insulator film 101 and NiSi layer 110b. This second thermal processing is performed in an atmosphere of inactive or inert gases, such as nitrogen or argon, or alternatively in a vacuum. Preferably the second thermal processing is lower in temperature than the first thermal processing, as in the first embodiment stated supra.

Note that regarding the layer/film structure on n-well 180, Er is not diffused into S/D electrodes because the $SiO_2$ film 152a acts as a mask against Er diffusion.

Figure 42:
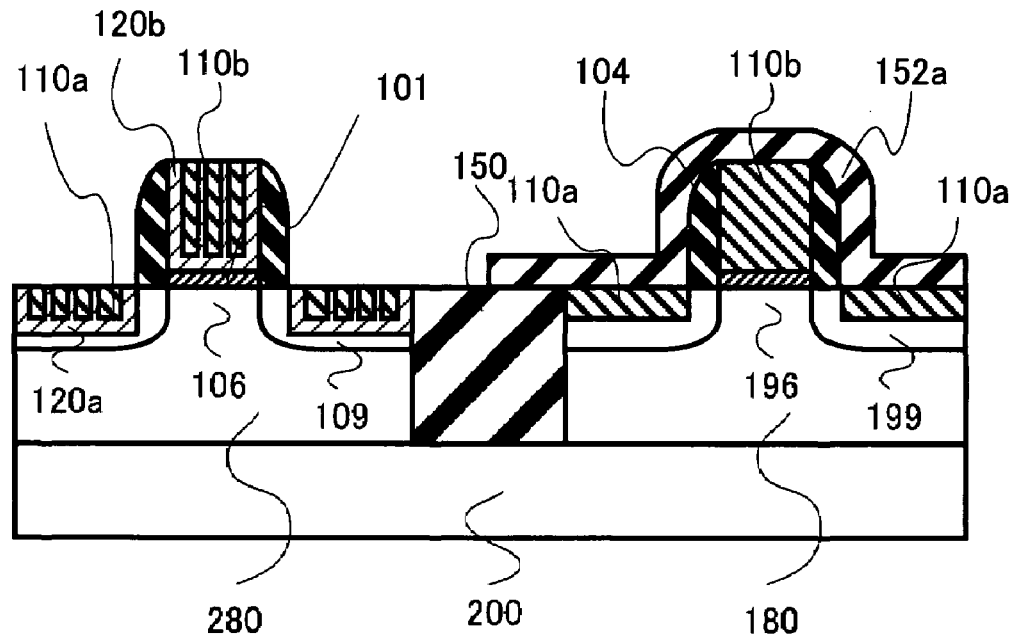

Next as shown in FIG. 42, selective etching is done using a chemical to remove Er residing in the surface. At this time, the Er interface layers 120a-120b residing also at the grain boundaries of NiSi electrodes 110a-110b are free from etch removal because the NiSi layers 110a-110b serve as a mask therefor.

Figure 43:
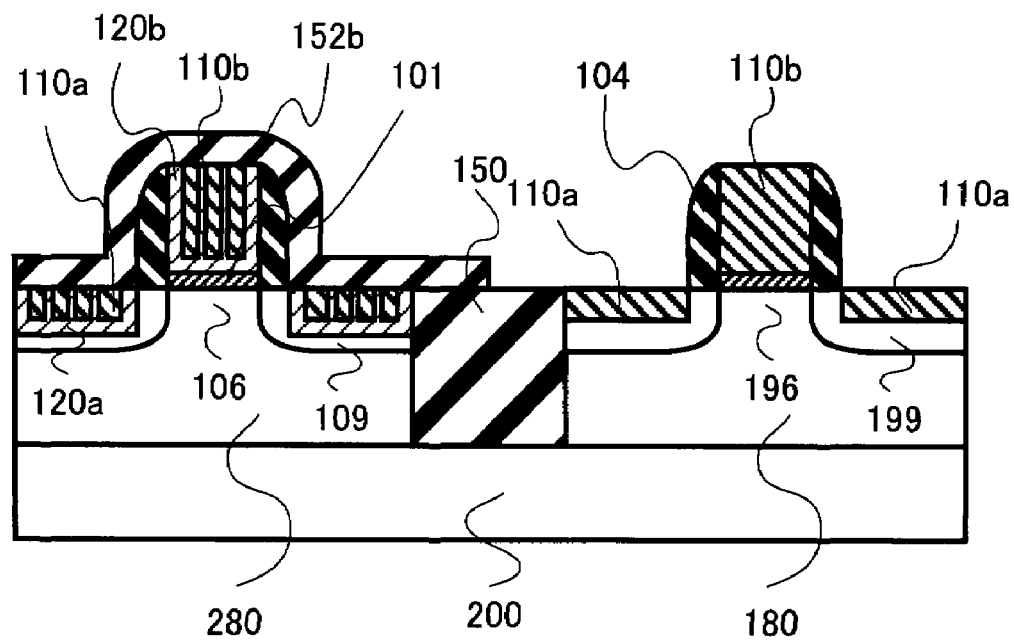

Next as shown in FIG. 43, the $SiO_2$ film 152a overlying n-well 180 is chemically removed away. Thereafter, an $SiO_2$ film 152b is deposited by LPCVD to a thickness of about 50 nm. Then, patterning is applied to this film 152b by lithography and RIE techniques so that a portion of film 152b resides to cover p-well 280.

Figure 44:
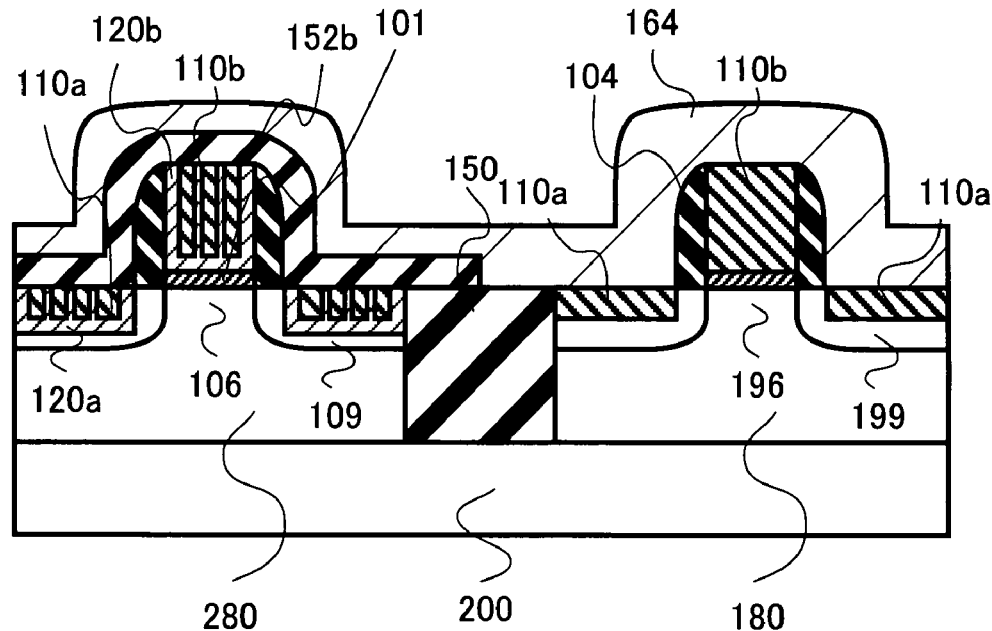

Next as shown in FIG. 44, a Pt film 164 of about 10 nm thick is formed by sputtering, which is greater in work function than NiSi layers 110a-110b. A silicide of Pt, i.e., PtSi, also is larger in work function than NiSi layers 110a.

Figure 45:
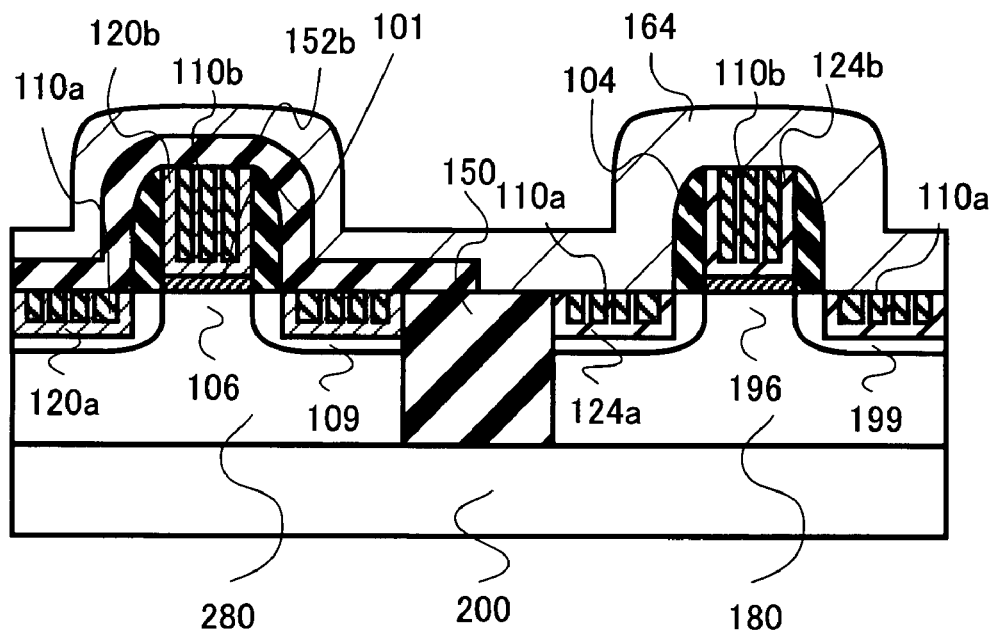

Next as shown in FIG. 45, 300-400° C. annealing (second anneal) is performed to cause Pt to diffuse from Pt film 164 through grain boundaries of NiSi layers for use as S/D electrodes of n-well 180, thereby forming an interface layer 124a made of Pt in the interface between Si substrate 200 and each NiSi layer 110a, while letting Pt exist in grain boundary of NiSi layer 110a.

Simultaneously, let Pt thermally diffuse through grain boundary of NiSi gate electrode 110b, thereby to form a Pt interface layer 124b at the interface between gate insulator film 101 and NiSi layer 110b. This second thermal processing is performed in an atmosphere of inactive gases, such as nitrogen or argon, or alternatively in a vacuum. Preferably the second thermal processing is lower in temperature than the first thermal processing, as in the sixth embodiment stated supra.

Note that regarding the layer/film structure on p-well 280, Pt is hardly diffused into S/D electrodes because the $SiO_2$ film 152b serves as a mask against such diffusion.

Figure 46:
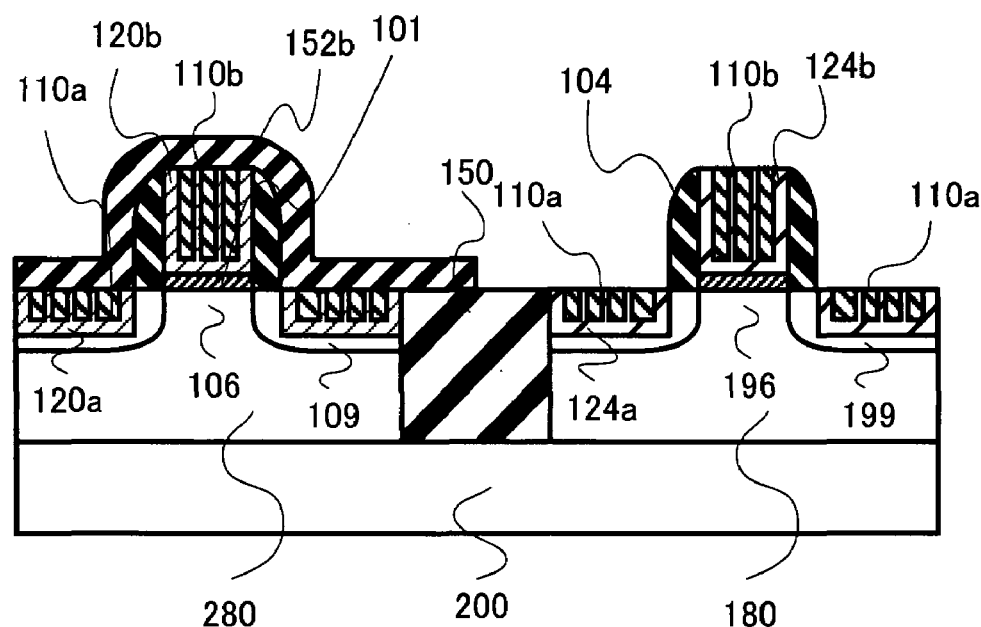

Next as shown in FIG. 46, selective etching is done using a chemical solution to remove Pt of the film 164 residing in the surface. At this time, the Pt interface layers 124a-124b residing also at the grain boundaries of NiSi electrodes 110a-110b are never removed away because of the fact that the NiSi layers 110a-110b act as a mask therefor.

Figure 47:
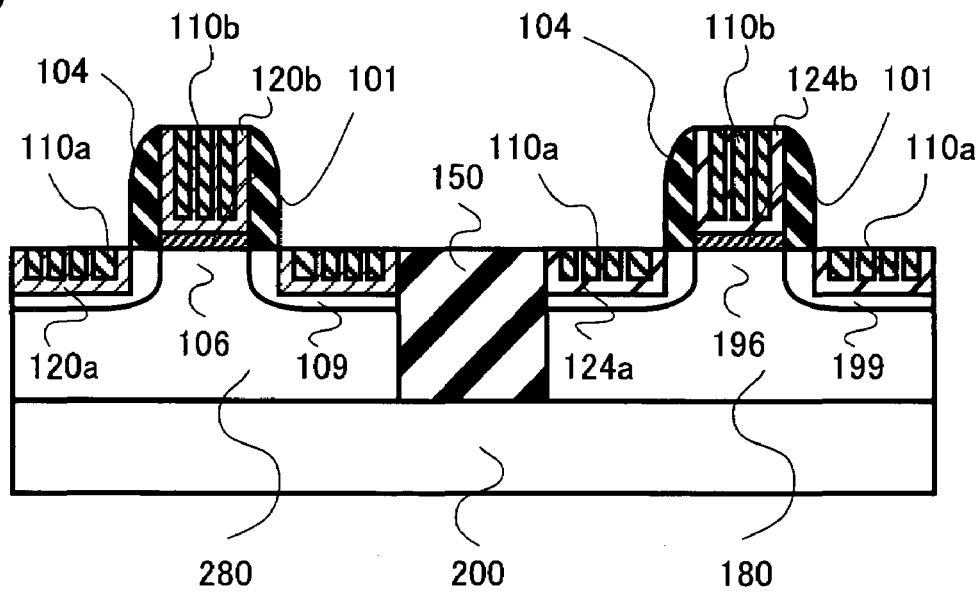

Next as shown in FIG. 47, the $SiO_2$ film 152b overlying the p-well 280 is chemically removed away by known etching techniques.

With the above-stated embodiment fabrication method, it is possible to fabricate the CMOSFET-containing semiconductor device of FIGS. 32A-C with high performance and increased reliability.

Embodiment 9

Figure 48A:
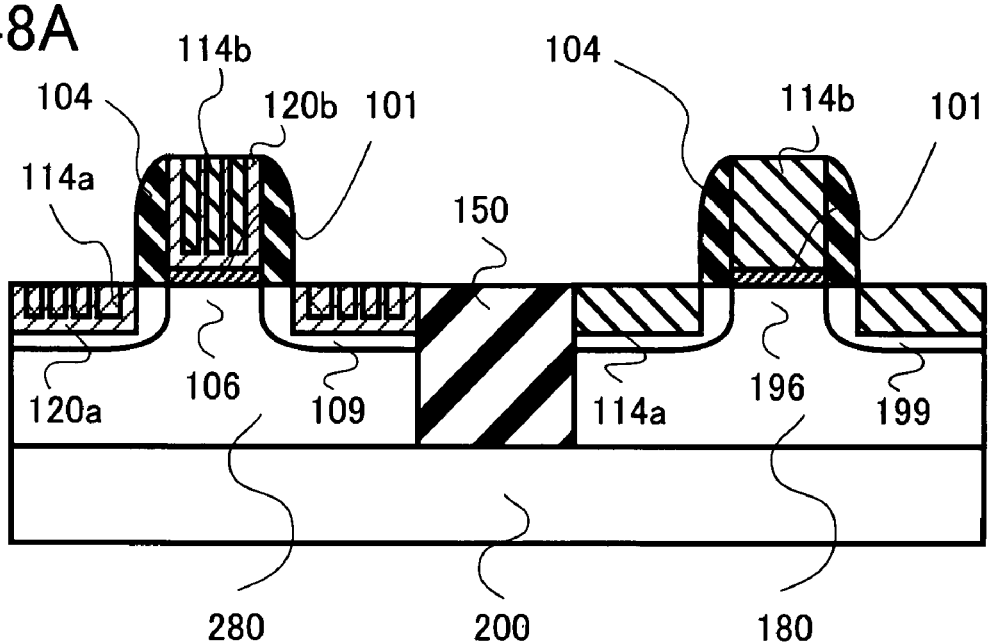
FIG. 48A is a sectional view of a semiconductor device having FETs in accordance with ninth embodiment of the invention.
Figure 48B:
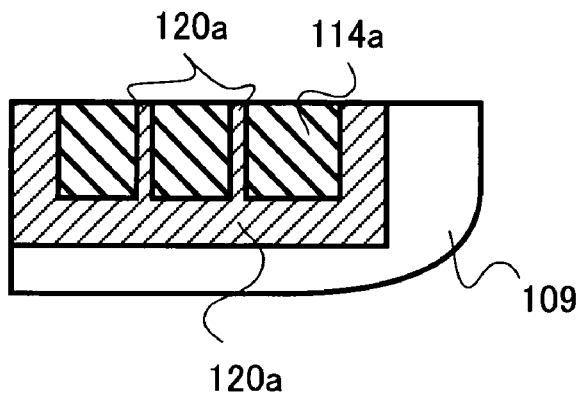
FIGS. 48B-48C are enlarged partial sectional views of the device.
Figure 48C:
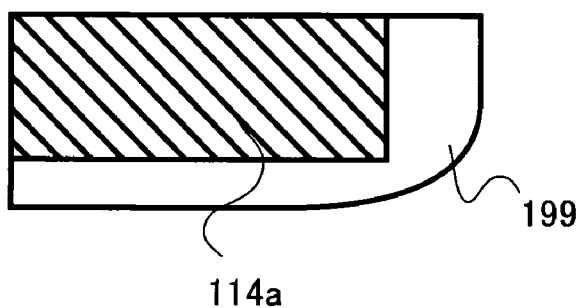

A CMOS IC device in accordance with another further embodiment of this invention is shown in FIGS. 48A to 48C. This CMOS device has source/drain (S/D) and gate electrodes made of PtSi of large work function, and includes an NMOSFET having an interface layer made of Er less in work function.

FIG. 48A is a sectional view of an entirety of the CMOS device. An enlarged sectional view of one of S/D regions of NMOSFET is shown in FIG. 48B, and an enlarged sectional view of an S/D region of PMOSFET is shown in FIG. 48C.

As shown in FIG. 48A, the S/D electrodes and gate electrode of NMOSFET on a p-type well layer 280 are formed of platinum silicide (PtSi) layers 114a and 114b, which are less in work function. Each S/D electrode has an interface layer 120a made of Er of small work function as better shown in FIG. 48B. Similarly the gate electrode has an Er interface layer 120b. Er exists at grain boundaries of PtSi layers 114a-114b. Regarding PMOSFET on n-well 180, its S/D and gate electrodes are formed of PtSi layers, 114a-114b as shown in FIG. 48C.

In this embodiment device, the S/D electrodes of both NMOSFET and PMOSFET are made of PtSi that is as low as 30 μΩcm in resistivity. This design lowers the electrical resistance of S/D electrode per se. As for NMOSFET, providing the interface layer made of Er less in work function lowers Schottky barrier to thereby reduce the contact resistance. Regarding PMOSFET, using PtSi of large work function lowers Schottky barrier to lessen the contact resistance.

Accordingly, for both the PMOSFET and the NMOSFET, the electrodes are appreciably reduced in contact resistance and their own resistance, resulting in reduction of parasitic resistance while at the same time enhancing drivability owing to gate depletion reducibility and improving heat resistivity owing to the presence of the metal at grain boundaries. Thus it is possible to realize the intended high-performance/high-reliability CMOS IC-containing semiconductor device.

A method of fabricating the CMOS device will be described with reference to FIGS. 49-55 below. Note that its process steps prior to that shown in FIG. 49 are similar to those shown in FIGS. 33-36, so detailed explanations thereof are eliminated herein for brevity purposes.

Figure 49:
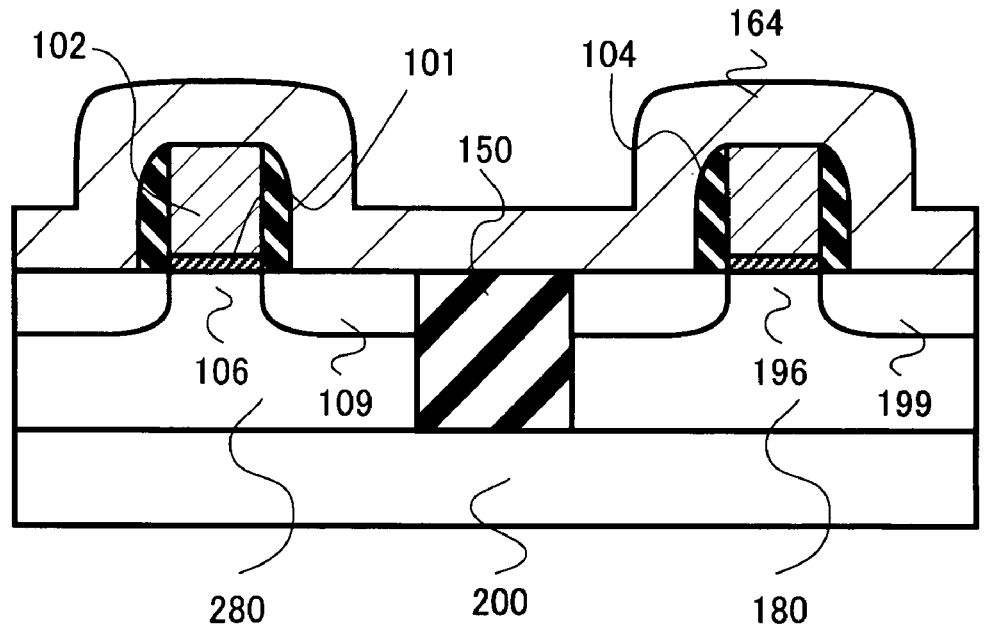
FIGS. 49 to 55 show, in cross-section, some major steps in the manufacture of the semiconductor device of the ninth embodiment.

As shown in FIG. 49, after having formed n-type diffusion layers 109 and p-type diffusions 199, a Pt film 164 is formed by sputtering to a thickness of about 10 nm.

Figure 50:
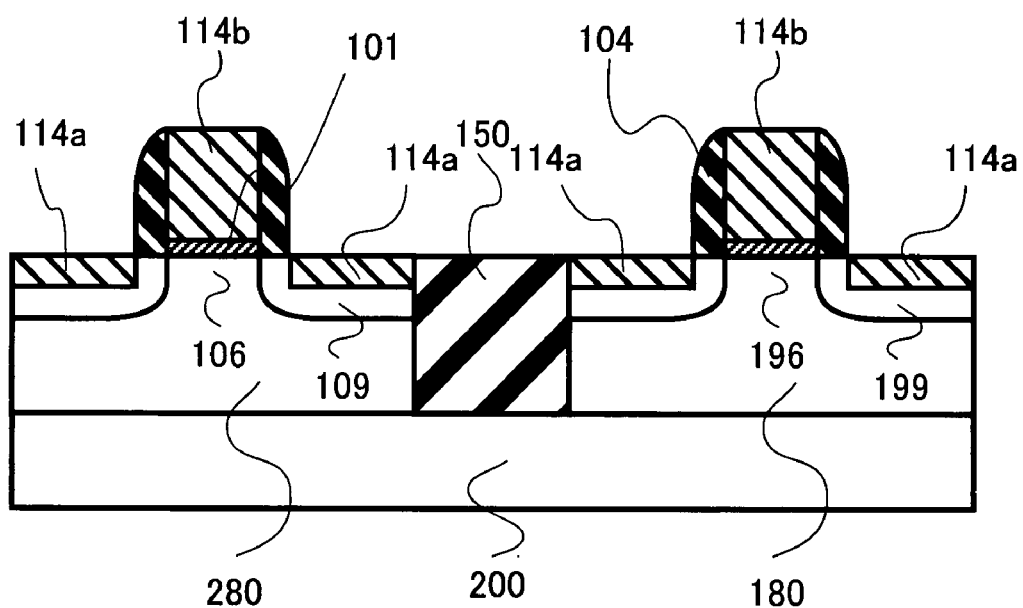

Next as shown in FIG. 50, annealing at about 500° C. (first thermal processing) is performed to cause Pt film 164 and Si substrate 200 to react together for silicidation, thereby forming PtSi layers 114a for later use as S/D electrodes. Simultaneously, let the individual poly-Si gate electrode 102 fully react up to the interface with its underlying gate insulator film 101, thereby to form a PtSi layer 114b for later use as the gate electrode. Thereafter, selective etching is performed using a chemical solution to remove nonreactive Pt components residing in the surface.

Figure 51:
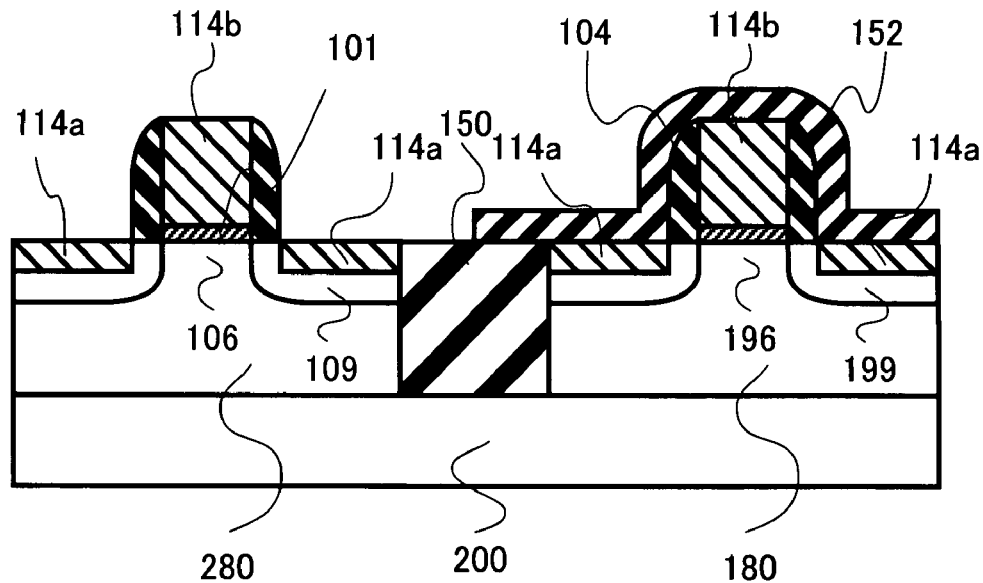

Next, as shown in FIG. 51, a 50-nm thick silicon oxide film 152 is deposited by LPCVD. Thereafter, this $SiO_2$ film is patterned by lithography and RIE techniques so that it is left on n-well 180 only.

Figure 52:
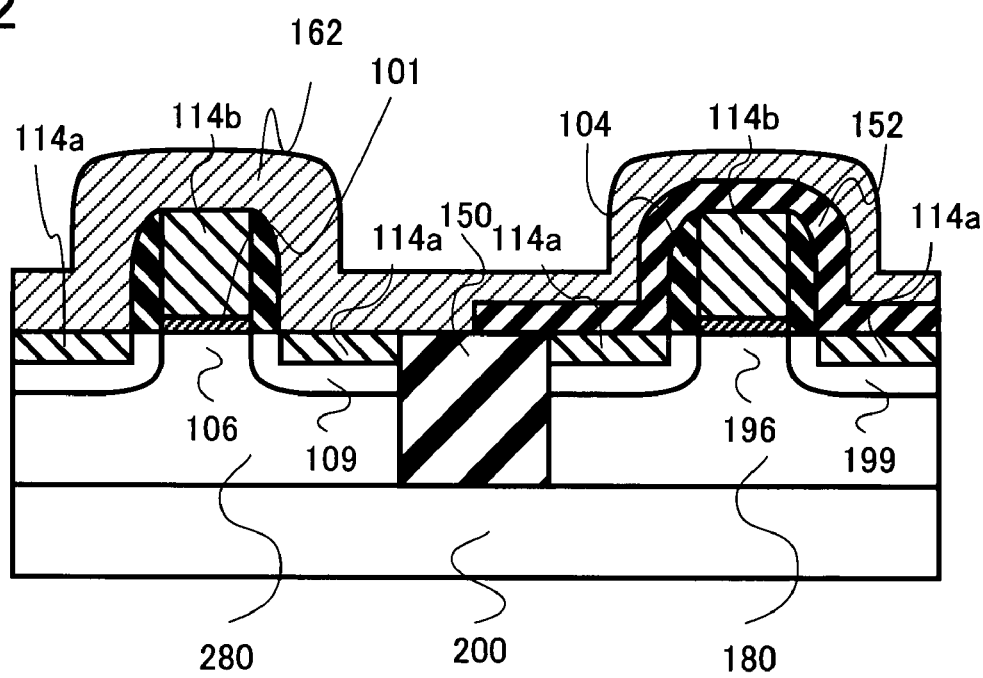

Next as shown in FIG. 52, a 10 nm thick Er film 162 is formed by sputtering to cover the resulting device structure. This Er film 162 is less in work function than PtSi layers 114a-114b. The silicide of Er, i.e., $ErSi_{1.7}$, also is smaller in work function than PtSi layers 114a.

Figure 53:
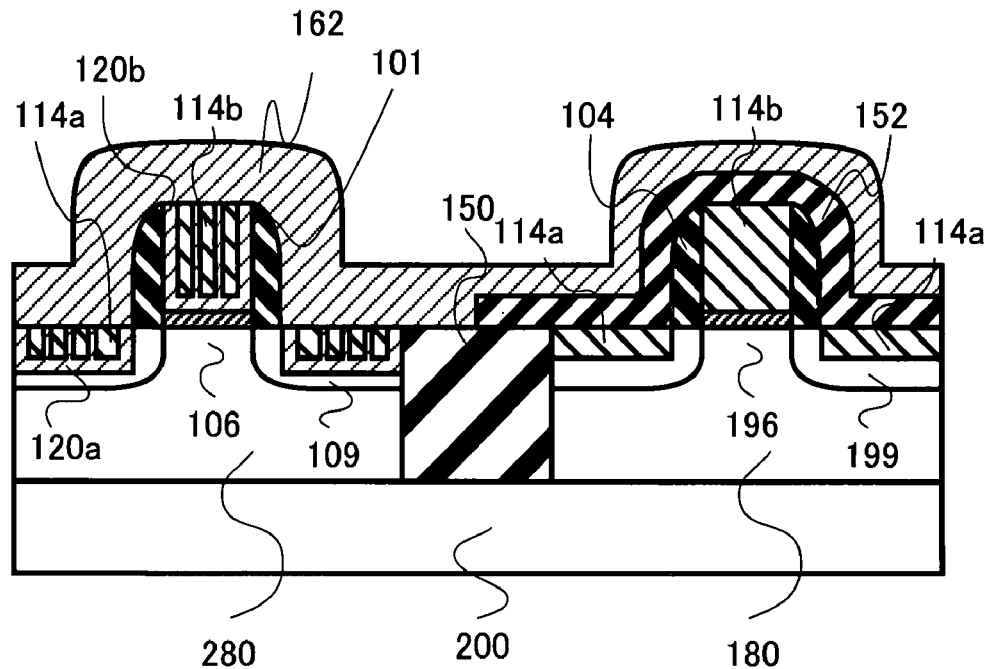

Next as shown in FIG. 53, annealing at about 300-400° C. (second anneal) is performed to cause Er to diffuse from Er film 162 through grain boundaries of PtSi layers 114a for use as S/D electrodes in p-well 280, thereby to form an Er interface layer 120a in the interface between Si substrate 200 and each PtSi layer 114a while letting Er exist in grain boundary of PtSi layer 114a.

Simultaneously, let Er thermally diffuse through grain boundary of PtSi gate electrode 114b, thereby to form an interface layer 120b made of Er in the interface between gate insulator film 101 and PtSi layer 114b. This second thermal processing is performed in an atmosphere of inactive gases, such as nitrogen or argon, or alternatively in a vacuum. Preferably the second thermal processing is lower in temperature than the first thermal processing in a similar way to the first embodiment stated supra.

Note that regarding the film/layer structure on n-well 180, Er is never diffused into S/D electrodes because the $SiO_2$ film 152a serves as a mask against such diffusion.

Figure 54:
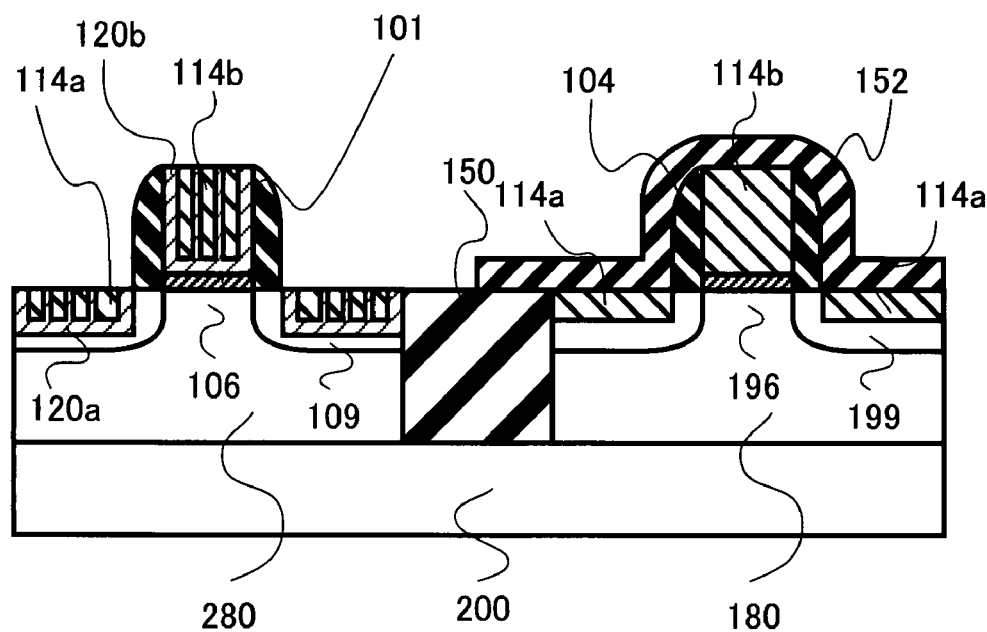

Next as shown in FIG. 54, selective etching is done using a chemical to remove Er residing in the surface. At this time, the Er interface layers 120a-120b that reside also at the grain boundaries of PtSi electrodes 114a-114b are hardly removed because of the fact that the PtSi layers 114a-114b act as a mask.

Figure 55:
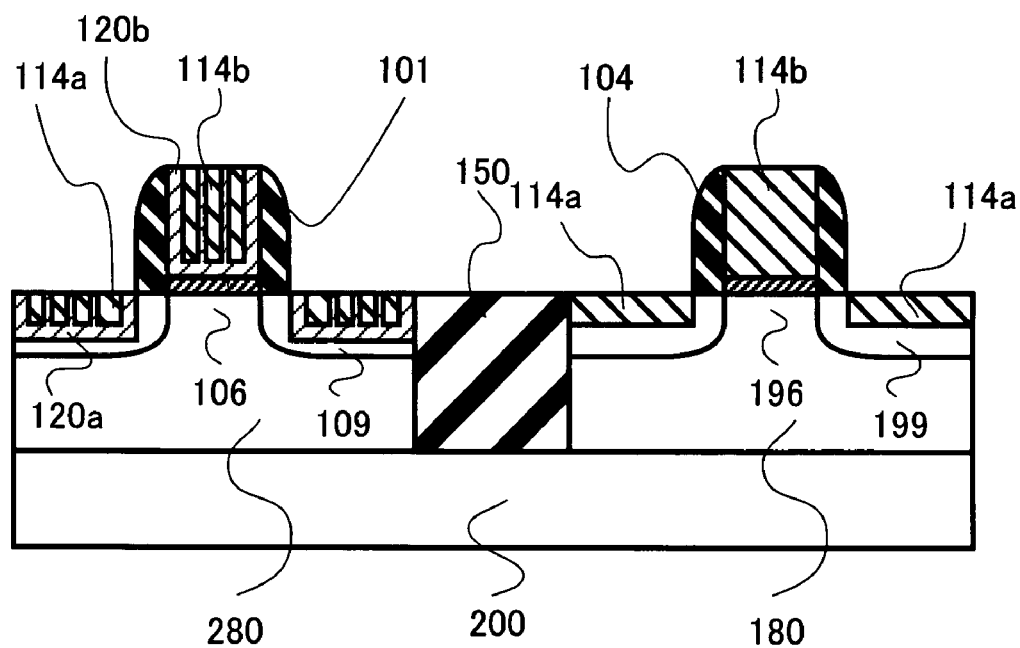

Next as shown in FIG. 55, the $SiO_2$ film 152 overlying the n-well 180 is chemically removed away.

With the CMOS device fabrication method stated above, it is possible to manufacture the intended CMOS device-containing semiconductor device of high performance and high reliability shown in FIGS. 48A-C. An advantage of this embodiment method over the eighth embodiment lies in its ability to readily fabricate the high-performance/high-reliability CMOS semiconductor device because of the fact that the process is omissible of forming interface layers in respective S/D electrodes of PMOSFET.

It should be noted that in this embodiment, the silicide for use as S/D electrodes may be replaced by other silicides as far as these are large in work function for reduction of the contact resistance of PMOSFET. Nevertheless, it is preferable to use small-resistivity metal silicides, such as PtSi, in order to reduce the electrode's own resistance.

Embodiment 10

Figure 56A:
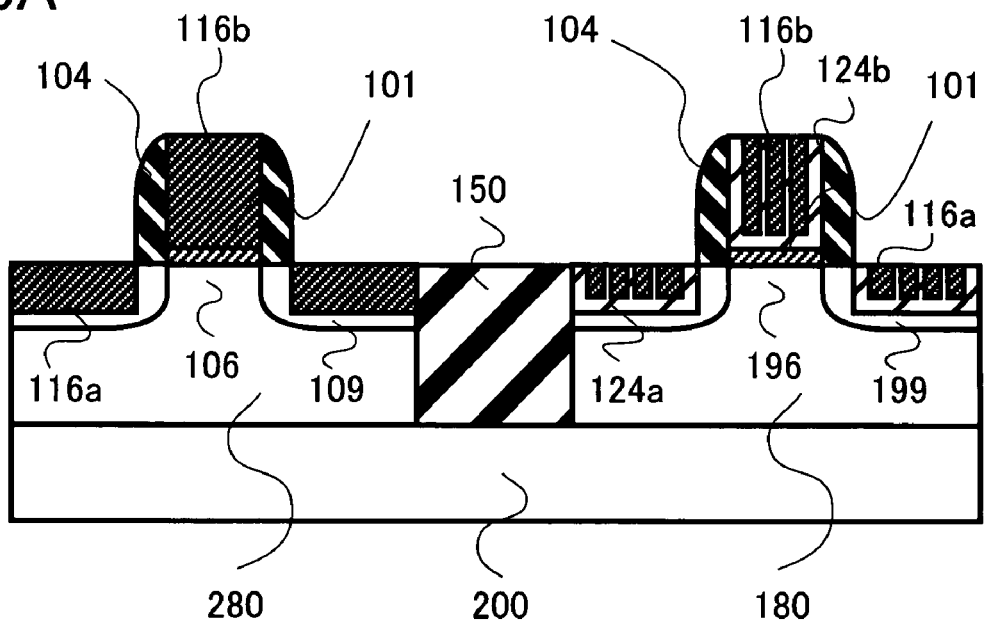
FIG. 56A is a sectional view of a semiconductor device having FETs in accordance with tenth embodiment of the invention.
Figure 56B:
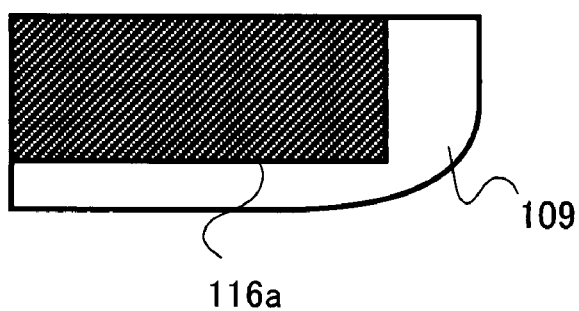
FIGS. 56B-56C are enlarged partial sectional views of the device.
Figure 56C:
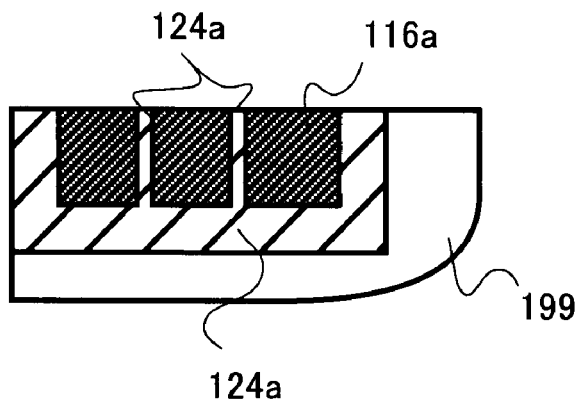

A CMOS IC device also embodying the invention is shown in FIGS. 56A-56C. A structural feature of this device is that S/D and gate electrodes are made of $ErSi_{1.7}$ less in work function while arranging PMOSFET to have interface layers made of Pt, which is large in work function, in S/D and gate electrodes thereof.

FIG. 56A is a sectional view of an entire CMOSFET structure of this embodiment device. FIGS. 56B and 56C are enlarged sectional views of S/D regions of NMOSFET and PMOSFET, respectively. As shown herein, the gate and S/D electrodes of PMOSFET on n-well 180 are formed of $ErSi_{1.7}$ layers 116a-116b.

The PMOSFET's S/D electrodes are each arranged to have an interface layer 124a made of Pt of large work function, whereas its gate electrode has a Pt interface layer 124b. Pt exists at grain boundaries of $ErSi_{1.7}$ layers 116a-116b. Regarding NMOSFET on p-well 280, its S/D and gate electrodes are formed of $ErSi_{1.7}$ layers 116a-116b as shown in FIG. 56B.

In this embodiment device, the S/D electrodes of both NMOSFET and PMOSFET are made of $ErSi_{1.7}$ that is as low as 30 μΩcm in resistivity to thereby lower the electrical resistance of such electrode per se. As for PMOSFET, providing the interface layer made of Pt of large work function lowers Schottky barrier to thereby reduce the contact resistance. Regarding NMOSFET, using $ErSi_{1.7}$ of small work function lowers Schottky barrier against electrons to lessen the contact resistance.

Accordingly, for both the PMOSFET and NMOSFET, the electrodes are reduced in contact resistance and own resistance, resulting in reduction of parasitic resistance while at the same time enhancing drivability owing to gate depletion reducibility and improving heat resistivity owing to the presence of the metal at grain boundaries. Thus it is possible to realize the intended high-performance/high-reliability CMOS IC-containing semiconductor device.

A process of fabricating the CMOS device will be described with reference to FIGS. 57-63 below. Note that its process steps prior to the step of FIG. 57 are similar to those shown in FIGS. 33-36, so detailed explanations thereof are omitted for brevity purposes.

Figure 57:
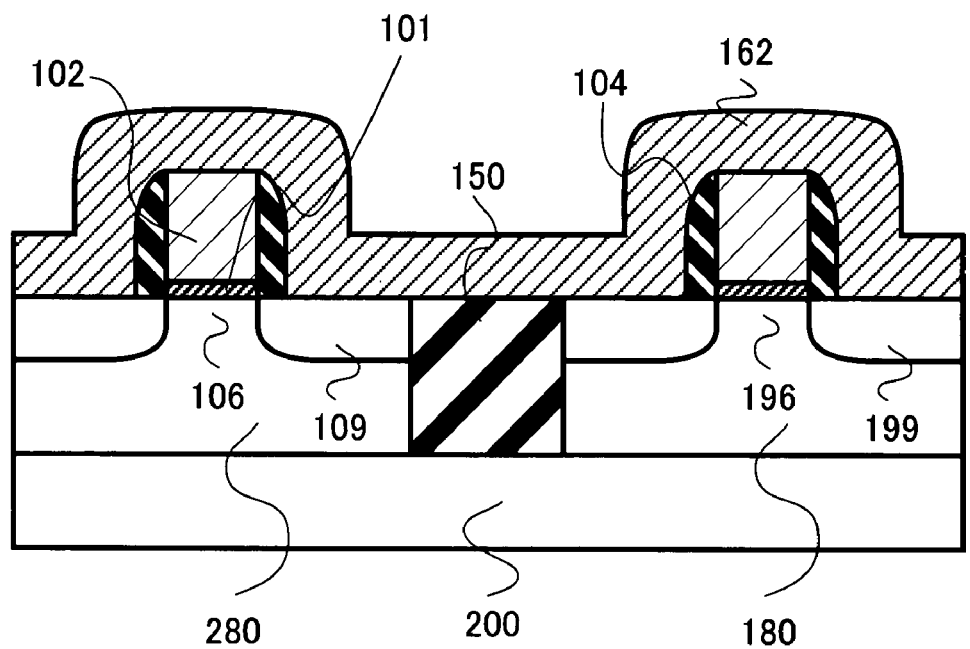
FIGS. 57 to 63 depict in cross-section some major steps in the manufacture of the semiconductor device of the tenth embodiment.

As shown in FIG. 57, after having formed n-type diffusion layers 109 and p-type diffusions 199, an Er film 162 is formed by sputtering to a thickness of about 10 nm.

Figure 58:
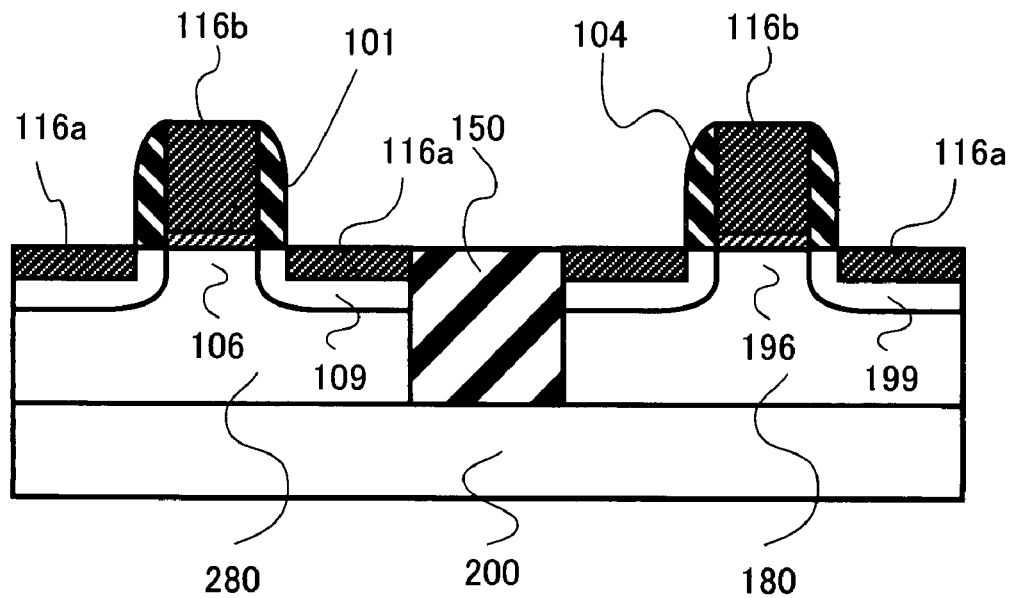

Next, as shown in FIG. 58, annealing at about 500° C. (first thermal processing) is done to cause Er film 162 and Si substrate 200 to react together for silicidation, thereby forming $ErSi_{1.7}$ layers 116a for later use as S/D electrodes. Simultaneously, let the individual poly-Si gate electrode 102 fully react up to the interface with its underlying gate insulator film 101, thereby to form an $ErSi_{1.7}$ layer 116b for later use as the gate electrode. Thereafter, selective etching is performed using a chemical solution to remove nonreactive Pt components residing in the surface.

Figure 59:
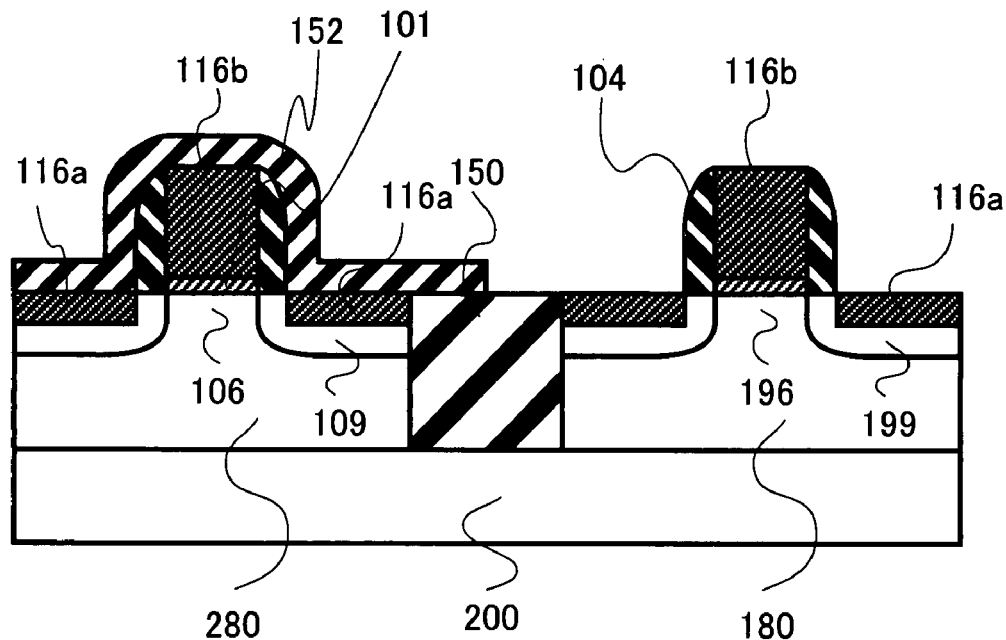

Next as shown in FIG. 59, a 50 nm thick silicon oxide film 152 is deposited by LPCVD. Thereafter, this $SiO_2$ film is patterned by lithography and RIE techniques so that it resides on p-well 280 only.

Figure 60:
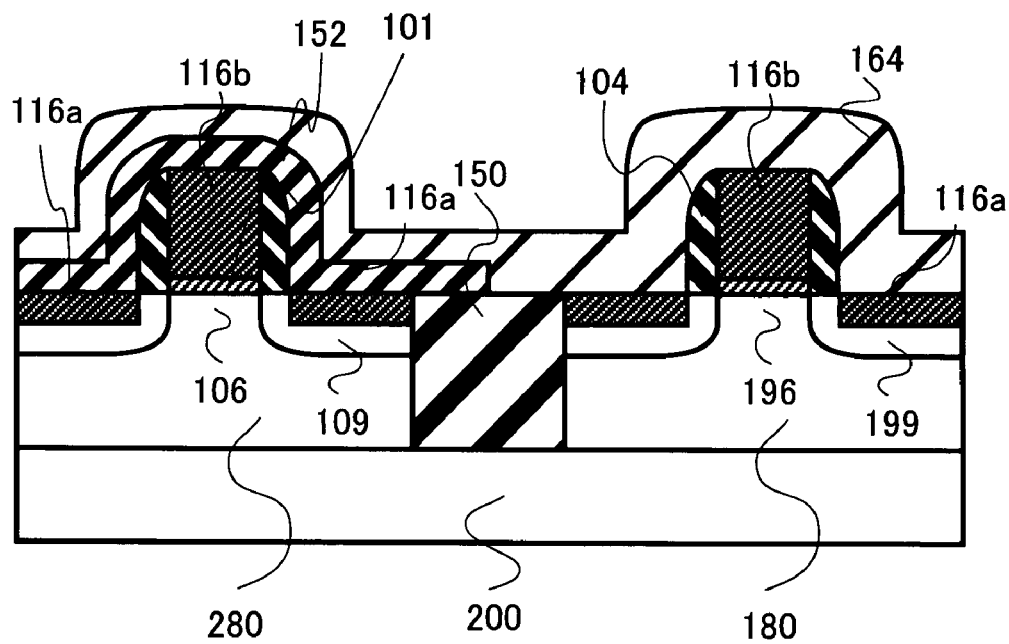

Next as shown in FIG. 60, a 10 nm thick Pt film 164 is sputtered. This Pt film 164 is larger in work function than $ErSi_{1.7}$ layers 116a-116b. The silicide of Pt, i.e., PtSi, also is larger in work function than $ErSi_{1.7}$ layers 116a.

Figure 61:
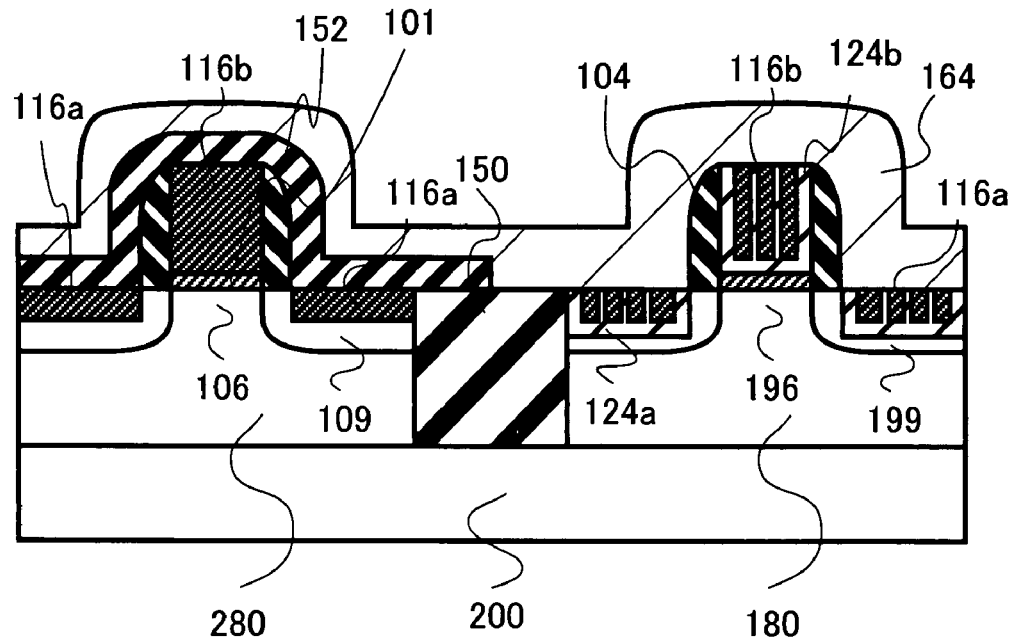

Next as shown in FIG. 61, annealing at about 300-400° C. (second thermal processing) is done to cause Pt to diffuse from Pt film 164 through grain boundaries of $ErSi_{1.7}$ layers 116a for use as S/D electrodes in n-well 180, thereby to form a Pt interface layer 124a in the interface between Si substrate 200 and each $ErSi_{1.7}$ layer 116a while letting Pt exist in grain boundary of $ErSi_{1.7}$ layer 116a.

Simultaneously, let Pt thermally diffuse through grain boundary of $ErSi_{1.7}$ gate electrode 116b, thus forming an interface layer 124b made of Pt in the interface between gate insulator film 101 and $ErSi_{1.7}$ layer 116b. This thermal processing is performed in an atmosphere of inactive gases, such as nitrogen or argon, or alternatively in a vacuum. Preferably the second thermal processing is lower in temperature than the first thermal processing, as in the first embodiment stated supra.

Note here that regarding the film/layer structure on p-well 280, Pt is never diffused into S/D electrodes because the $SiO_2$ film 152 serves as a mask against such diffusion.

Figure 62:
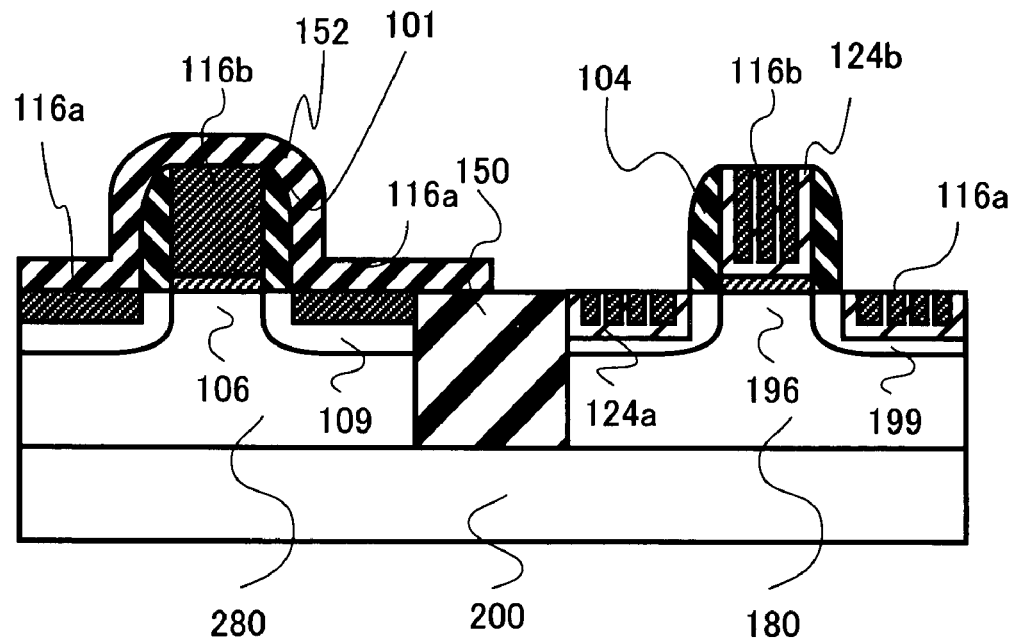

Next, as shown in FIG. 62, residual Pt in the surface is selectively removed using a chemical solution. At this time, the Pt interface layers 124a-124b that reside also at the grain boundaries of $ErSi_{1.7}$ electrodes 116a-116b are not removed because the $ErSi_{1.7}$ layers 116a-116b act as a mask.

Figure 63:
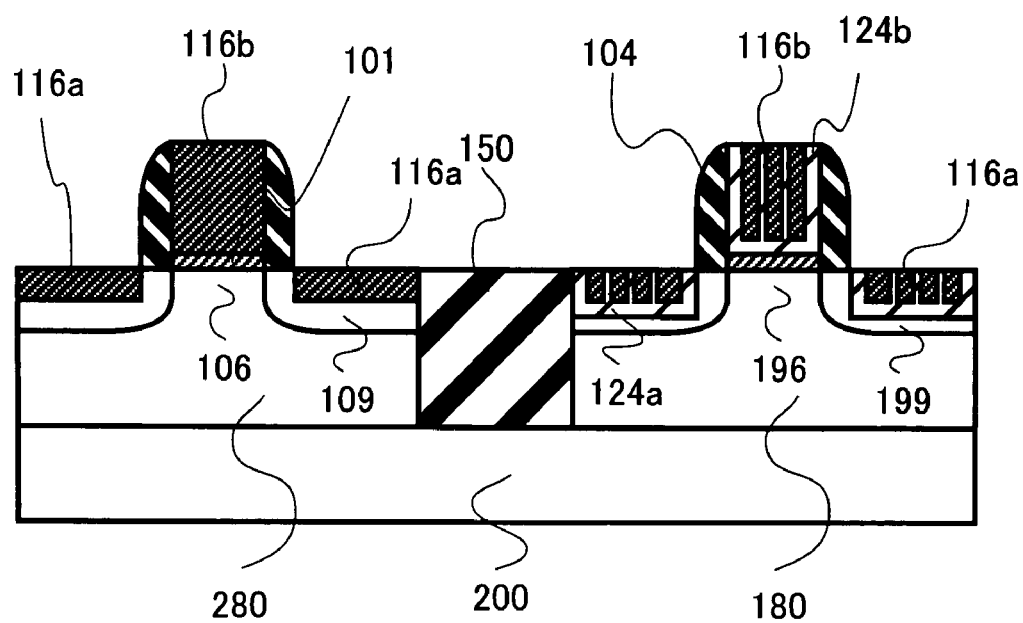

Next as shown in FIG. 63, the $SiO_2$ film 152 overlying the p-well 280 is removed by use of a chemical.

With the CMOS device fabrication method stated above, it is possible to manufacture the intended CMOS device-containing semiconductor device of high performance and high reliability shown in FIGS. 56A-C. An advantage of this embodiment method over the eighth embodiment lies in an ability to readily fabricate the high-performance/high-reliability CMOS semiconductor device because of the fact that the process is omissible of forming interface layers in respective S/D electrodes of NMOSFET.

It is noted that in this embodiment, the silicide material for use as S/D electrodes may be replaced by other silicides as far as these are less in work function for reduction of the contact resistance of NMOSFET. Nevertheless, it is preferable to use small-resistivity metal silicides, such as $ErSi_{1.7}$, YSi, YbSi or else, in order to reduce the resistance of such electrode per se.

So far, several semiconductor devices having CMOSFETs are discussed. In these embodiments, using specific silicides of relatively low resistivity for the S/D and gate electrodes is desirable in light of the reduction of the electrode's own resistance, as in the case of NMOSFET of first embodiment and the case of PMOSFET in sixth embodiment stated supra.

Regarding selection of the metal forming the interface layer, this is similar to the first embodiment in terms of NMOSFET and similar to the sixth embodiment in terms of PMOSFET. The gate insulator film 101 is not exclusively limited to $SiO_2$ film and may alternatively be other similar suitable dielectric film materials which are high in dielectric constant than $SiO_2$ (i.e., high-dielectric-constant dielectric films) as in the first and sixth embodiments.

Furthermore, concerning the choice of materials for S/D electrodes and gate insulator film, this embodiment is similar to the first embodiment relating to nMISFET device and sixth embodiment as to pMISFET. This embodiment is also similar thereto in modifiability of poly-Si/NiSi stacked multilayer gate structure and/or use of p-type extension diffusion layers. Further, this embodiment is similar to nMISFETs of the first and sixth embodiments in applicability to 3D device structures including Schottky transistors, segregated Schottky transistors, SOI substrate structures, and fin structures.

While the invention has been described with reference to specific embodiments, the description is illustrative of the invention and is not to be construed as limiting the invention. Although in the illustrative embodiments the semiconductor substrate is made of silicon (Si), it may be made of other similar suitable materials, such as silicon germanium (SiGe), germanium (Ge), silicon carbide (SiC), gallium arsenide (GaAs), aluminum nitride (AlN) or else.

The crystal plane of substrate material is not limited to the (100) plane only and may be set to a (110) plane or a (111) plane on a case-by-case basis. The principles of this invention are applicable to any available MISFET devices.

Miscellaneously, semiconductor devices and fabrication methods which comprise the subject matter of this invention and which are design-modifiable by those skilled in the art to which the invention pertains are interpreted to be included within the coverage of this invention. The invention is, therefore, to be limited only as indicated by the scope of the appended claims.

What is claimed is:

1. A method for fabricating a semiconductor device including an n-type field effect transistor, said method comprising:
    forming a gate electrode above a semiconductor substrate with a gate insulator film formed therebetween;
    depositing a first metal on said semiconductor substrate at both sides of the gate electrode;
    performing first thermal processing to silicidize said first metal to thereby form a silicide of said first metal as a pair of source and drain electrodes;
    depositing a second metal on a surface of the silicide of said first metal; and
    performing second thermal processing to diffuse said second metal at an interface of said semiconductor substrate and the silicide of said first metal to thereby form an interface layer containing said second metal, wherein
    said second metal is smaller in work function than the silicide of said first metal and a silicide of said second metal is smaller in work function than the silicide of said first metal.

2. The method according to claim 1, wherein said second thermal processing is lower in temperature than said first thermal processing.

3. The method according to claim 1, wherein said first metal is Ni, and said second metal is one selected from the group consisting of Er, Y, and Yb.

4. A method of fabricating a semiconductor device including a p-type field effect transistor, said method comprising:
    forming a gate electrode above a semiconductor substrate with a gate insulator film formed therebetween;
    depositing a first metal on said semiconductor substrate at both sides of the gate electrode;
    performing first thermal processing to silicidize said first metal to thereby form a silicide of said first metal as a pair of source and drain electrodes;
    depositing a second metal on a surface of the silicide of said first metal; and
    performing second thermal processing to diffuse said second metal at an interface between said semiconductor substrate and the silicide of said first metal to thereby form an interface layer containing said second metal, wherein
    said second metal is larger in work function than the silicide of said first metal and a silicide of said second metal is larger in work function than the silicide of said first metal.

5. The method according to claim 4, wherein said second thermal processing is lower in temperature than said first thermal processing.

6. A method of fabricating on a semiconductor substrate a semiconductor device including an n-type field effect transistor and a p-type field effect transistor, said method comprising:
    forming a gate electrode above said semiconductor substrate with a gate insulator film formed therebetween;
    depositing a first metal on said semiconductor substrate at both sides of the gate electrode;
    performing first thermal processing to silicidize said first metal to thereby form a first silicide as source and drain electrodes of said n-type field effect transistor and a second silicide as source and drain electrodes of said p-type field effect transistor;
    depositing a second metal on a surface of said first silicide;
    performing second thermal processing to diffuse said second metal at an interface between said semiconductor substrate and said first silicide to thereby form a first interface layer containing said second metal;
    depositing a third metal on a surface of said second silicide; and
    performing third thermal processing to diffuse said third metal at an interface between said semiconductor substrate and said second silicide to thereby form a second interface layer containing said third metal, wherein
    said second metal is smaller in work function than said first silicide and a silicide of said second metal is smaller in work function than said first silicide, and
    said third metal is larger in work function than said second silicide and a silicide of said third metal is larger in work function than said second silicide.

7. The method according to claim 6, wherein said second thermal processing and said third thermal processing are lower in temperature than said first thermal processing.

8. The method according to claim 6, wherein said first metal is Ni; said second metal is one selected from the group consisting of Er, Y, and Yb; and said third metal is Pt.

* * * * *